(12) United States Patent
Hahn et al.

(10) Patent No.: US 10,459,041 B2
(45) Date of Patent: Oct. 29, 2019

(54) MAGNETIC DETECTION SYSTEM WITH HIGHLY INTEGRATED DIAMOND NITROGEN VACANCY SENSOR

(71) Applicant: Lockheed Martin Corporation, Bethesda, MD (US)

(72) Inventors: Joseph W. Hahn, Erial, NJ (US); Kenneth Michael Jackson, Westville, NJ (US); Nicholas M. Luzod, Seattle, WA (US); Gregory Scott Bruce, Abington, PA (US); Wilbur Lew, Mount Laurel, NJ (US); John B. Stetson, Jr., New Hope, PA (US); Duc Huynh, Princeton Junction, NJ (US); Andrew Raymond Mandeville, Delran, NJ (US); Arul Manickam, Mount Laurel, NJ (US); Peter G. Kaup, Marlton, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 271 days.

(21) Appl. No.: 15/469,374

(22) Filed: Mar. 24, 2017

(65) Prior Publication Data
US 2018/0275212 A1 Sep. 27, 2018

(51) Int. Cl.
*G01R 33/032* (2006.01)
(52) U.S. Cl.
CPC .................. *G01R 33/032* (2013.01)
(58) Field of Classification Search
CPC .................................................. G01R 33/032
See application file for complete search history.

(56) References Cited

U.S. PATENT DOCUMENTS 2,746,027 A  5/1956 Murray
3,359,812 A  12/1967 Everitt
(Continued)

FOREIGN PATENT DOCUMENTS

CN  105738845 A  7/2016
CN  106257602     12/2016
(Continued)

OTHER PUBLICATIONS

"'Diamond Sensors, Detectors, and Quantum Devices' in Patent Application Approval Process," Chemicals & Chemistry, pp. 1-6, (Feb 28, 2014), 6 pages.
(Continued)

*Primary Examiner* — Clayton E. LaBalle
*Assistant Examiner* — Jas A Sanghera
(74) *Attorney, Agent, or Firm* — Foley & Lardner LLP

(57) ABSTRACT

A system for magnetic detection includes a housing including a top plate, bottom plate, side plate, and main plate provided between the side plate and the bottom plate; a magneto-optical defect center material including at least one magneto-optical defect center that emits an optical signal when excited by an excitation light; a radio frequency (RF) exciter system configured to provide RF excitation to the magneto-optical defect center material; an optical light source configured to direct the excitation light to the magneto-optical defect center material; and an optical detector configured to receive the optical signal emitted by the magneto-optical defect center material. The elements of the system are mounted to the main plate and capable of being unattached and remounted to the main plate to change at least one of a location or an angle of incidence of the excitation light on the magneto-optical defect center material.

129 Claims, 42 Drawing Sheets

(56) References Cited

U.S. PATENT DOCUMENTS

| | | |
|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,621,380 A | 11/1971 | Barlow, Jr. |
| 3,745,452 A | 7/1973 | Osburn et al. |
| 3,899,758 A | 8/1975 | Maier et al. |
| 4,025,873 A | 5/1977 | Chilluffo |
| 4,047,805 A | 9/1977 | Sekimura |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,210,650 A | 5/1993 | O'Brien et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,894,220 A | 4/1999 | Wellstood et al. |
| 5,907,420 A | 5/1999 | Chraplyvy et al. |
| 5,907,907 A | 6/1999 | Ohtomo et al. |
| 5,915,061 A | 6/1999 | Vanoli |
| 5,995,696 A | 11/1999 | Miyagi et al. |
| 6,042,249 A | 3/2000 | Spangenberg |
| 6,057,684 A | 5/2000 | Murakami et al. |
| 6,064,210 A | 5/2000 | Sinclair |
| 6,121,053 A | 9/2000 | Kolber et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,262,574 B1 | 7/2001 | Cho et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,437,563 B1 | 8/2002 | Simmonds et al. |
| 6,472,651 B1 | 10/2002 | Ukai |
| 6,472,869 B1 | 10/2002 | Upschulte et al. |
| 6,504,365 B2 | 1/2003 | Kitamura |
| 6,518,747 B2 | 2/2003 | Sager et al. |
| 6,542,242 B1 | 4/2003 | Yost et al. |
| 6,621,377 B2 | 9/2003 | Osadchy et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| 7,342,399 B1 | 3/2008 | Wiegert |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,741,936 B1 | 6/2010 | Weller et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,932,718 B1 | 4/2011 | Wiegert |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,270,387 B2 | 2/2016 | Wolfe et al. |
| 9,291,508 B1 | 3/2016 | Biedermann et al. |
| 9,317,811 B2 | 4/2016 | Scarsbrook |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |

(56) References Cited

U.S. PATENT DOCUMENTS

| | | |
|---|---|---|
| 9,632,045 B2 | 4/2017 | Englund et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 9,779,769 B2 | 10/2017 | Heidmann |
| 9,891,297 B2 | 2/2018 | Sushkov et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0094942 A1 | 5/2003 | Friend et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0095133 A1 | 5/2004 | Nikitin et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0120563 A1 | 5/2007 | Kawabata et al. |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0265895 A1 | 10/2008 | Strack et al. |
| 2008/0266050 A1 | 10/2008 | Crouse et al. |
| 2008/0279047 A1 | 11/2008 | An et al. |
| 2008/0299904 A1 | 12/2008 | Yi et al. |
| 2009/0001979 A1 | 1/2009 | Kawabata |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0243616 A1 | 10/2009 | Loehken et al. |
| 2009/0244857 A1 | 10/2009 | Tanaka |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0102820 A1 | 4/2010 | Martinez et al. |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0271032 A1 | 10/2010 | Helwig |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0321117 A1 | 12/2010 | Gan |
| 2010/0326042 A1 | 12/2010 | McLean et al. |
| 2011/0031969 A1 | 2/2011 | Kitching et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0062967 A1 | 3/2011 | Mohaupt |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0175604 A1 | 7/2011 | Polzer et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0279120 A1 | 11/2011 | Sudow et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0070252 A1 | 3/2013 | Feth |
| 2013/0093424 A1 | 4/2013 | Blank et al. |
| 2013/0107253 A1 | 5/2013 | Santori |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2013/0292472 A1 | 11/2013 | Guha |
| 2014/0012505 A1 | 1/2014 | Smith et al. |
| 2014/0015522 A1 | 1/2014 | Widmer et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0153363 A1 | 6/2014 | Juhasz et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |

(56) References Cited

U.S. PATENT DOCUMENTS

| | | |
|---|---|---|
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0197831 A1 | 7/2014 | Walsworth |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0264723 A1 | 9/2014 | Liang et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0061670 A1 | 3/2015 | Fordham et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0354985 A1 | 12/2015 | Judkins et al. |
| 2015/0358026 A1 | 12/2015 | Gan |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0018269 A1 | 1/2016 | Maurer et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0054402 A1 | 2/2016 | Meriles |
| 2016/0061914 A1 | 3/2016 | Jelezko |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0131723 A1 | 5/2016 | Nagasaka |
| 2016/0139048 A1 | 5/2016 | Heidmann |
| 2016/0146904 A1 | 5/2016 | Stetson, Jr. et al. |
| 2016/0161429 A1 | 6/2016 | Englund et al. |
| 2016/0161583 A1 | 6/2016 | Meriles et al. |
| 2016/0174867 A1 | 6/2016 | Hatano |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1* | 10/2016 | Hatano ............... G01R 33/032 |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0030982 A1 | 2/2017 | Jeske et al. |
| 2017/0038314 A1 | 2/2017 | Suyama et al. |
| 2017/0038411 A1 | 2/2017 | Yacobi et al. |
| 2017/0068012 A1 | 3/2017 | Fisk |
| 2017/0074660 A1 | 3/2017 | Gann et al. |
| 2017/0075020 A1 | 3/2017 | Gann et al. |
| 2017/0075205 A1 | 3/2017 | Kriman et al. |
| 2017/0077665 A1 | 3/2017 | Liu et al. |
| 2017/0104426 A1 | 4/2017 | Mills |
| 2017/0138735 A1 | 5/2017 | Cappellaro et al. |
| 2017/0139017 A1 | 5/2017 | Egan et al. |
| 2017/0146615 A1 | 5/2017 | Wolf et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |
| 2017/0261629 A1 | 9/2017 | Gunnarsson et al. |
| 2017/0343617 A1 | 11/2017 | Manickam et al. |
| 2017/0343619 A1 | 11/2017 | Manickam et al. |
| 2017/0343620 A1 | 11/2017 | Hahn et al. |
| 2017/0343621 A1 | 11/2017 | Hahn et al. |
| 2017/0343695 A1 | 11/2017 | Stetson et al. |
| 2018/0136291 A1 | 5/2018 | Pham et al. |
| 2018/0275209 A1 | 9/2018 | Mandeville et al. |
| 2018/0275212 A1 | 9/2018 | Hahn et al. |
| 2018/0275224 A1 | 9/2018 | Manickam et al. |
| 2018/0275225 A1 | 9/2018 | Hahn |
| 2018/0348393 A1 | 12/2018 | Hansen et al. |
| 2019/0018085 A1 | 1/2019 | Wu et al. |

FOREIGN PATENT DOCUMENTS

| | | |
|---|---|---|
| DE | 69608006 T2 | 2/2001 |
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 A1 | 2/2015 |
| EP | 2 907 792 | 8/2015 |
| GB | 2 423 366 A | 8/2006 |
| GB | 2 433 737 | 7/2007 |

(56) References Cited

FOREIGN PATENT DOCUMENTS

| | | |
|---|---|---|
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2009/073736 | 6/2009 |
| WO | WO-2011/046403 A2 | 4/2011 |
| WO | WO-2011/153339 A1 | 12/2011 |
| WO | WO-2012/016977 A2 | 2/2012 |
| WO | WO-2012/084750 | 6/2012 |
| WO | WO-2013/027074 | 2/2013 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

"Findings from University of Stuttgart in physics reported," Science Letter, (Jul. 7, 2009), 2 pages.

"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.

"Patent Issued for Diamond Sensors, Detectors, and Quantum Devices (U.S. Pat. No. 9,249,526)," Journal of Engineering, pp. 1-5 (Feb 15, 2016), 5 pages.

"Researchers Submit Patent Application, 'Diamond Sensors, Detectors, and Quantum Devices', for Approval," Chemicals & Chemistry, pp. 1-7, (Apr. 11, 2014), 7 pages.

Acosta et al., "Broadband magnetometry by infrared-absorption detection of nitrogen-vacancy ensembles in diamond," Appl. Phys. Letters 97: 174104 (Oct. 29, 2010), 4 pages.

Acosta et al., "Diamonds with a high density of nitrogen-vacancy centers for magnetometry applications," Physical Review B 80(115202): 1-15 (Sep. 9, 2009), 15 pages.

Acosta et al., "Nitrogen-vacancy centers: physics and applications," MRS Bulletin 38(2): 127-130 (Feb. 2013), 4 pages.

Acosta, "Optical Magnetometry with Nitrogen-Vacancy Centers in Diamond," University of California Berkeley, (Spring 2011), 118 pages.

Aiello et al., "Composite-pulse magnetometry with a solid-state quantum sensor," Nature Communications 4(1419): 1-6 (Jan. 29, 2013), 6 pages.

Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.

Albrecht et al., "Coupling of nitrogen vacancy centres in nanodiamonds by means of phonons," New Journal of Physics 15(083014): 1-26 (Aug. 6, 2013), 27 pages.

Appel et al., "Nanoscale microwave imaging with a single electron spin in diamond," New Journal of Physics 17(112001): 1-6 (Nov. 3, 2015), 7 pages.

Arai et al., "Fourier magnetic imaging with nanoscale resolution and compressed sensing speed-up using electronic spins in diamond," Nature Nanotechnology 10: 859-864 (Aug. 10, 2015), 7 pages.

Aslam et al., "Single spin optically detected magnetic resonance with 60-90 GHz (E-band) microwave resonators," Review of Scientific Instruments 86(064704): 1-8 (Jun. 22, 2015), 9 pages.

Awschalom et al., "Diamond age of spintronics," Scientific American 297: 84-91 (Oct. 2007), 8 pages.

Babamoradi et al., "Correlation between entanglement and spin density in nitrogen-vacancy center of diamond," European Physical Journal D 65: 597-603 (Dec. 1, 2011), 7 pages.

Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.

Babunts et al., "Temperature-scanned magnetic resonance and the evidence of two-way transfer of a nitrogen nuclear spin hyperfine interaction in coupled NV-N pairs in diamond," JETP Letters 95(8): 429-432 (Jun. 27, 2012), 4 pages.

Bagguley et al., "Zeeman effect of acceptor states in semiconducting diamond," Journal of the Physical Society of Japan 21(Supplement): 244-248 (1966), 7 pages.

Balasubramanian et al., "Nanoscale imaging magnetometry with diamond spins under ambient conditions," Nature 455: 648-651 (Oct. 2, 2008), 5 pages.

(56) References Cited

OTHER PUBLICATIONS

Balmer et al., "Chemical Vapour deposition synthetic diamond: materials technology and applications," J. of Physics: Condensed Matter 21(36): 1-51 (Aug. 19, 2009), 51 pages.

Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.

Barfuss et al., "Strong mechanical driving of a single electron spin," Nature Physics 11: 820-824 (Aug. 3, 2015), 6 pages.

Barry et al., "Optical magnetic detection of single-neuron action potentials using quantum defects in diamond," as submitted to Quantum Physics on Feb. 2, 2016, 23 pages.

Bennett et al., "CVD Diamond for High Power Laser Applications," SPIE 8603, High-Power Laser Materials Processing: Lasers, Beam Delivery, Diagnostics, and Applications II, 860307 (Feb. 22, 2013), 10 pages.

Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.

Berman et al. "Measurement of single electron and nuclear spin states based on optically detected magnetic resonance," J. Physics: Conf. Series 38: 167-170 (2006), 5 pages.

Blakley et al., "Room-temperature magnetic gradiometry with fiber-coupled nitrogen-vacancy centers in diamond," Optics Letters 40(16): 3727-3730 (Aug. 5, 2015), 4 pages.

Bourgeois, et al., "Photoelectric detection of electron spin resonance of nitrogen-vacancy centres in diamond," Nature Communications 6(8577): 1-8 (Oct. 21, 2015), 8 pages.

Brenneis, et al. "Ultrafast electronic readout of diamond nitrogen-vacancy centres coupled to graphene." Nature nanotechnology 10.2 (2015): 135-139.

Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.

Budker & Kimball, "Optical Magnetometry," Cambridge Press, (2013), 11 pages.

Budker & Romalis, "Optical Magnetometry," Nature Physics 3: 227-243 (Apr. 2007), 8 pages.

Casanova, et al., "Effect of magnetic field on phosphorus centre in diamond," Physica Status Solidi A 186(2): 291-295 (Jul. 30, 2001), 6 pages.

Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.

Chapman, et al., "Anomalous saturation effects due to optical spin depolarization in nitrogen-vacancy centers in diamond nanocrystals," Physical Review B 86(045204): 1-8 (Jul. 10, 2012), 8 pages.

Chavez, et al. "Detecting Arctic oil spills with NMR: a feasibility study." Near Surface Geophysics 13.4 (Feb. 2015): 409-416.

Chen et al., "Vector magnetic field sensing by a single nitrogen vacancy center in diamond," EPL 101(67003): 1-5 (Mar. 2013), 6 pages.

Chernobrod et al., "Improving the sensitivity of frequency modulation spectroscopy using nanomechanical cantilevers," Applied Physics Letters 85(17): 3896-3898 (Oct. 25, 2004), 3 pages.

Chernobrod et al., "Spin Microscope Based on Optically Detected Magnetic Resonance," Journal of Applied Physics 97(014903): 1-3, (2005; first published online Dec. 10, 2004), 4 pages.

Childress et al., "Coherent dynamics of coupled electron and nuclear spin qubits in diamond," Science 314(5797): 281-285 (Oct. 13, 2006), 6 pages.

Chipaux et al., "Magnetic imaging with an ensemble of nitrogen vacancy-centers in diamond," European Physical Journal D 69(166): 1-10 (Jul. 2, 2015), 10 pages.

Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.

Chipaux, et al., "Wide bandwidth instantaneous radio frequency spectrum analyzer based on nitrogen vacancy centers in diamond," Applied Physics Letters 107(233502): 1-5 (2015), 6 pages.

Clevenson et al., "Broadband magnetometry and temperature sensing with a light-trapping diamond waveguide," Nature Physics 11: 393-397 (May 2015; first published online Apr. 6, 2015), 6 pages.

Constable, "Geomagnetic Spectrum, Temporal." In Encyclopedia of Geomagnetism and Paleomagnetism, pp. 353-355, Springer: Dordrecht, Netherlands (2007), 3 pages.

Cooper et al., "Time-resolved magnetic sensing with electronic spins in diamond," Nature Communications 5:3141: 1-7 (Jan. 24, 2014), 7 pages.

Creedon et al., "Strong coupling between P1 diamond impurity centers and a three-dimensional lumped photonic microwave cavity," Physical Review B 91(140408R): 1-5 (Apr. 24, 2015), 5 pages.

Dale, et al. "Medical applications of diamond magnetometry: commercial viability." arXiv preprint arXiv:1705.01994 (May 8, 2017), pp. 1-7.

Davies, "Current problems in diamond: towards a quantitative understanding," Physica B 273-274: 15-13 (Dec. 15, 1999), 9 pages.

De Lange et al., "Single-Spin Magnetometry with Multipulse Sensing Sequences," Physical Review Letters 106(080802): 1-4 (Feb. 24, 2011), 4 pages.

Degen, "Scanning magnetic field microscope with a diamond single-spin sensor," Applied Physics Letters 92(243111): 1-3 (Jun. 17, 2008), 3 pages.

Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.

Denatale et al., "Fabrication and characterization of diamond moth eye antireflective surfaces on Ge," J. of Applied Physics 71: 1388-1393 (Mar. 1992), 8 pages.

Dobrovitski et al., "Quantum Control over Single Spins in Diamond," Annual Review of Condensed Matter Physics 4: 23-50 (Apr. 2013), 30 pages.

Doherty et al., "The nitrogen-vacancy colour centre in diamond," Physics Reports 528: 1-45 (Jul. 1, 2013), 45 pages.

Doherty et al., "Theory of the ground-state spin of the NV-center in diamond," Physical Review B 85(205203): 1-21 (May 3, 2012), 21 pages.

Doi et al., "Pure negatively charged state of the NV center in n-type diamond," Physical Review B 93(081203): 1-6 (Feb. 3, 2016), 6 pages.

Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.

Dreau et al., "Avoiding power broadening in optically detected magnetic resonance of single NV defects for enhanced dc magnetic field sensitivity," Physical Review B 84(195204): 1-8 (Nov. 23, 2011), 8 pages.

Dreau et al., "High-resolution spectroscopy of single NV defects coupled with nearby 13C nuclear spins in diamond," Physical Review B 85(134107): 1-7 (Apr. 20, 2012), 7 pages.

Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.

Epstein et al., "Anisotropic interactions of a single spin and dark-spin spectroscopy in diamond," Nature Physics 1:94-98 (Nov. 2005), 5 pages.

Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016).

Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.

(56) References Cited

OTHER PUBLICATIONS

Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Fologea, et al. "Detecting single stranded DNA with a solid state nanopore." Nano Letters 5.10 (Aug. 15, 2005): 1905-1909.
Freitas, et al., "Solid-State Nuclear Magnetic Resonance (NMR) Methods Applied to the Study of Carbon Materials," Chemistry and Physics of Carbon, vol. 31 (2012), 45 pages.
Gaebel, et al. "Room-temperature coherent coupling of single spins in diamond." Nature Physics 2.6 (May 28, 2006): 408-413.
GB Examination Report from United Kingdom application No. GB 1618202.4 dated Jan. 10, 2017.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect-From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.
Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Heerema, et al. "Graphene nanodevices for DNA sequencing." Nature nanotechnology 11.2 (Feb. 3, 2016): 127-136.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N@C60," Physica Status Solidi B 245(10): 2013-2017 (Oct. 2008; first published online Sep. 8, 2008), 5 pages.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
International Search Report and Written Opinion from related PCT application PCT/US2017/035315 dated Aug. 24, 2017, 7 pages.
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 2016 from related PCT application PCT/US2016/014290, 11 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Jun. 9, 2017, from related patent application PCT/US2017/024181, 13 pages.

(56) References Cited

OTHER PUBLICATIONS

International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016 from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017 from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 26, 2016, from related PCT application PCT/US2016/014331, 15 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Sep. 13, 2016, from related PCT application PCT/US16/14377, 11 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.
Keyser "Enhancing nanopore sensing with DNA nanotechnology." Nature nanotechnology 11.2 (Feb. 2016): 106-108.
Khan & Hemmer, "Noise limitation in nano-scale imaging," Proceedings of SPIE vol. 5842: 302-305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.

(56) References Cited

OTHER PUBLICATIONS

Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.
Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 2014), 8 pages.
Lai et al., "Influence of a static magnetic field on the photoluminescence of an ensemble of nitrogen vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012), 6 pages.
Lazariev et al., "A nitrogen-vacancy spin based molecular structure microscope using multiplexed projection reconstruction," Scientific Reports 5(14130): 1-8 (Sep. 2015), 8 pages.
Le Sage et al., "Efficient photon detection from color centers in a diamond optical waveguide," Phys. Rev. B 85: 121202(R), pp. 121202-1-121202-4, (Mar. 23, 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Lindsay "The promises and challenges of solid-state sequencing." Nature nanotechnology 11.2 (Feb. 2016): 109-111.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 1-4 (Sep. 2013), 5 pages.
MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maletinsky et al., "A robust scanning diamond sensor for nanoscale imaging with single nitrogen-vacancy centres," Nature Nanotechnology 7: 320-324, (May 2012; published Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.
Mamin et al., "Nanoscale Nuclear Magnetic Resonance with a Nitrogen-Vacancy Spin Sensor," Science 339, (Feb. 2013), 5 pages.
Manson et al., "GR transitions in diamond: magnetic field measurements," Journal of Physics C Solid St. Phys 13: L1005-L1009, (Nov. 1980), 6 pages.

Massachusetts Institute of Technology, "Wide-Field Imaging Using Nitrogen Vacancies," in Patent Application Approval Process, Physics Week: 1-5, (Jan. 20, 2015), 5 pages.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Matsuda et al., "Development of a plastic diamond anvil cell for high pressure magneto-photoluminescence in pulsed high magnetic fields," International Journal of Modern Physics B 18(27-29), (Nov. 2004), 7 pages.
Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.
Maze et al., "Nanoscale magnetic sensing with an individual electronic spin in diamond," Nature Physics 455: 644-647 (Oct. 2, 2008), 5 pages.
Meijer et al., "Generation of single color centers by focused nitrogen implantation," Applied Physics Letters 87(261909): 1-3 (Dec. 2005), 4 pages.
Michaelovich et al., "Polarization Dependencies of the Nitrogen-Vacancy Center." Undergraduate Project Report, Ben-Gurion University, Aug. 2015, pp. 1-9.
Millot et al., "High-field Zeeman and Paschen-Back effects at high pressure in oriented ruby," Physical Review B 78 (155125): 1-7 (Oct. 2008), 7 pages.
Moessle, et al. "SQUID-detected magnetic resonance imaging in microtesla fields." Annu. Rev. Biomed. Eng. 9 (May 23, 2008): 389-413.
Moriyama et al., "Importance of electron-electron interactions and Zeeman splitting in single-wall carbon nanotube quantum dots," Physica E 26: 473-476 (Feb. 2005), 4 pages.
Mrozek et al., "Circularly polarized microwaves for magnetic resonance study in the GHz range: Application to nitrogen-vacancy in diamonds," Applied Physics Letters, pp. 1-4 (Jul. 2015), 4 pages.
Nagl et al., "Improving surface and defect center chemistry of fluorescent nanodiamonds for imaging purposes—a review," Analytical and Bioanalaytical Chemistry 407: 7521-7536 (Oct. 2015; published online Jul. 29, 2015), 16 pages.
Neumann et al., "Excited-state spectroscopy of single NV defects in diamond using optically detected magnetic resonance," New Journal of Physics 11(013017): 1-10, (Jan. 2009), 11 pages.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.
Nizovtsev et al., "Modeling fluorescence of single nitrogen-vacancy defect centers in diamond," Physica B—Condensed Matter, 608-611 (Dec. 2001), 4 pages.
Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.
Nobauer et al., "Smooth optimal quantum control for robust solid state spin magnetometry," Retrieved from http://www.arxiv.org/abs/1412.5051, pp. 1-12, (Dec. 2014), 12 pages.
Nowodzinski et al., "Nitrogen-Vacancy centers in diamond for current imaging at the redistributive layer level of Integrated Circuits," Microelectronics Reliability 55: 1549-1553 (Aug. 2015), 5 pages.
Nusran et al., "Optimizing phase-estimation algorithms for diamond spin magnetometry," Physical Review B 90(024422): 1-12 (Jul. 2014), 12 pages.
Ohashi et al., "Negatively Charged Nitrogen-Vacancy Centers in a 5 nm Thin 12C Diamond Film," Nano Letters 13: 4733-4738 (Oct. 2013), 6 pages.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.

(56) References Cited

OTHER PUBLICATIONS

Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.
Polatomic. "AN/ASQ-233A Digital Magnetic Anomaly Detective Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Rabeau et al., "Implantation of labelled single nitrogen vacancy centers in diamond using 15N," Applied Physics Letters 88, (Jan. 2006), 4 pages.
Ramsey, et al., "Phase Shifts in the Molecular Beam Method of Separated Oscillating Fields", Physical Review, vol. 84, No. 3, Nov. 1, 1951, pp. 506-507.
Ranjbar et al., "Many-electron states of nitrogen-vacancy centers in diamond and spin density calculations," Physical Review B 84(165212): 1-6 (Oct. 2011), 6 pages.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.
Rogers et al., "Singlet levels of the NV(-) centre in diamond," New Journal of Physics 17, (Jan. 2015), 13 pages.
Rondin et al., "Magnetometry with nitrogen-vacancy defects in diamond," Reports on Progress in Physics 77(056503) 1-26 (May 2014), 27 pages.
Rondin et al., "Magnetometry with nitrogen-vacancy defects in diamond." May 22, 2014 (May 22, 2014), pp. 1 [online] http://arxiv.org/pdf/1311.5214.pdf, 29 pages.
Rondin et al., "Nanoscale magnetic field mapping with a single spin scanning probe magnetometer," Applied Physics Letters 100, (Apr. 2012), 5 pages.
Sarkar et al., "Magnetic properties of graphite oxide and reduced graphene oxide," Physica E 64: 78-82 (Nov. 2014), 5 pages.
Scheuer et al., "Accelerated 2D magnetic resonance spectroscopy of single spins using matrix completion," Scientific Reports 5(17728): 1-8 (Dec. 2015), 8 pages.
Schirhagl et al., "Nitrogen-vacancy centers in diamond: Nanoscale sensors for physics and biology," Annual Review of Physical Chemistry 65: 83-105 (Jan. 2014), 26 pages.
Schoenfeld & Harneit, "Real time magnetic field sensing and imaging using a single spin in diamond," Physical Review Letters 106(030802): 1-4 (Jan. 2011), 4 pages.
Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.
Shames et al., "Magnetic resonance tracking of fluorescent nanodiamond fabrication," Journal of Physics D: Applied Physics 48(155302): 1-13 (Apr. 2015; published Mar. 20, 2015), 14 pages.
Shao et al., "Diamond Color Center Based FM Microwave Demodulator," in Conference on Lasers and Electro-Optics, OSA Technical Digest (online) (Optical Society of America), paper JTh2A.136, (Jun. 5-10, 2016), 2 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
Simanovskaia et al., "Sidebands in optically detected magnetic resonance signals of nitrogen vacancy centers in diamond," Physical Review B 87(224106): 1-11 (Jun. 2013), 11 pages.
Sotoma et al., "Effective production of fluorescent nanodiamonds containing negatively-charged nitrogen-vacancy centers by ion irradiation," Diamond and Related Materials 49: 33-38 (Oct. 2014), 6 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Steiner et al., "Universal enhancement of the optical readout fidelity of single electron spins at nitrogen-vacancy centers in diamond," Physical Review B 81(035205): 1-6 (Jan. 2010), 6 pages.
Steinert et al., "High-sensitivity magnetic imaging using an array of spins in diamond," Rev. Sci. Inst. 81(043705): 1-5 (Apr. 23, 2010), 5 pages.
Steinert et al., "Magnetic spin imaging under ambient conditions with sub-cellular resolution." Nature Comms 4:1607 (Mar. 19, 2013).
Stepanov et al., "High-frequency and high-field optically detected magnetic resonance of nitrogen-vacancy centers in diamond," Applied Physics Letters 106, (Feb. 2015), 5 pages.
Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.
Storteboom et al., "Lifetime investigation of single nitrogen vacancy centres in nanodiamonds," Optics Express 23(9): 11327-11333 (May 4, 2015; published Apr. 22, 2015), 7 pages.
Sushkov, et al. "All-optical sensing of a single-molecule electron spin." Nano letters 14.11 (Nov. 7, 2013): 6443-6448.
Tahara et al., "Quantifying selective alignment of ensemble nitrogen-vacancy centers in (111) diamond," Applied Physics Letters 107:193110 (Nov. 2015; published online Nov. 13, 2015), 5 pages.
Taylor et al., "High-sensitivity diamond magnetometer with nanoscale resolution," Nature Physics 4: 810-816 (Oct. 2008), 7 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.
Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 2012), 16 pages.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
Tong et al., "A hybrid-system approach for W state and cluster state generation," Optics Communication 310: 166-172, (Jan. 2014; available online Aug. 12, 2013), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.
U.S. Notice of Allowance dated Apr. 20, 2016, from related U.S. Appl. No. 15/003,718, 9 pages.
U.S. Notice of Allowance dated Aug. 11, 2017 from related U.S. Appl. No. 15/003,558, 5 pages.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.

(56) References Cited

OTHER PUBLICATIONS

U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Notice of Allowance dated Jun. 8, 2017, from related U.S. Appl. No. 15/351,862, 7 pages.
U.S. Notice of Allowance dated Mar. 15, 2017, from related U.S. Appl. No. 15/351,862, 6 pages.
U.S. Notice of Allowance dated Mar. 29, 2016, from related U.S. Appl. No. 15/003,590, 11 pages.
U.S. Notice of Allowance dated May 26, 2017 from related U.S. Appl. No. 15/218,821, 7 pages.
U.S. Notice of Allowance dated Sep. 1, 2017, from related U.S. Appl. No. 14/676,740, 7 pages.
U.S. Notice of Allowance dated Sep. 14, 2017, from related U.S. Appl. No. 15/476,636, 10 pages.
U.S. Notice of Allowance dated Sep. 18, 2017, from related U.S. Appl. No. 15/003,206, 11 pages.
U.S. Notice of Allowance dated Sep. 26, 2017, from related U.S. Appl. No. 15/003,281, 7 pages.
U.S. Notice of Allowance dated Sep. 8, 2016, from related U.S. Appl. No. 15/003,298, 10 pages.
U.S. Office Action dated Apr. 17, 2017, from related U.S. Appl. No. 15/003,558, 12 pages.
U.S. Office Action dated Aug. 15, 2017 from related U.S. Appl. No. 15/003,281, 12 pages.
U.S. Office Action dated Aug. 24, 2016 from related U.S. Appl. No. 14/676,740, 19 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Jul. 27, 2017 from related U.S. Appl. No. 15/003,577, 15 pages.
U.S. Office Action dated Jul. 29, 2016 from related U.S. Appl. No. 14/680,877, 8 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 13, 2016, from related U.S. Appl. No. 14/676,740, 15 pages.
U.S. Office Action dated May 22, 2017, from related U.S. Appl. No. 15/003,206, 12 pages.
U.S. Office Action dated May 6, 2016, from related U.S. Appl. No. 14/659,498.
U.S. Office Action dated Nov. 2, 2016, from related U.S. Appl. No. 15/003,256, 19 pages.
U.S. Office Action dated Nov. 3, 2016, from related U.S. Appl. No. 15/204,675, 9 pages.
U.S. Office Action dated Oct. 14, 2016 from related U.S. Appl. No. 15/003,677, 13 pages.
U.S. Office Action dated Oct. 19, 2016, from related U.S. Appl. No. 15/218,821, 6 pages.
U.S. Office Action dated Sep. 27, 2017, from related U.S. Appl. No. 15/003,176, 8 pages.
U.S. Office Action dated Sep. 8, 2017, from related U.S. Appl. No. 15/003,292, 8 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.
Vershovskii & Dmitriev, "Micro-scale three-component quantum magnetometer based on nitrogen-vacancy color centers in diamond crystal," Technical Physics Letters 41(4): 393-396 (Apr. 2015), 4 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages.
Wang et al., "Optimizing ultrasensitive single electron magnetometer based on nitrogen-vacancy center in diamond," Chinese Science Bulletin, 58(24): 2920-2923, (Aug. 2013), 4 pages.
Webber et al., "Ab initio thermodynamics calculation of the relative concentration of NV- and NV0 defects in diamond," Physical Review B 85,(014102): 1-7 (Jan. 2012), 7 pages.
Wells, et al. "Assessing graphene nanopores for sequencing DNA." Nano letters 12.8 (Jul. 10, 2012): 4117-4123.
Widmann et al., "Coherent control of single spins in silicon carbide at room temperature," Nature Materials, 14: 164-168 (2015) (available online Dec. 1, 2014), 5 pages.
Wolf et al., "Subpicotesla Diamond Magnetometry," Physical Review X 5(041001): 1-10 (Oct. 2015), 10 pages.
Wolfe et al., "Off-resonant manipulation of spins in diamond via precessing magnetization of a proximal ferromagnet," Physical Review B 89(180406): 1-5 (May 2014), 5 pages.
Wroble, "Performance Analysis of Magnetic Indoor Local Positioning System." Western Michigan University Master's Theses, Paper 609 (Jun. 2015), 42 pages.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Xue & Liu, "Producing GHZ state of nitrogen-vacancy centers in cavity QED," Journal of Modern Optics 60(6-7), (Mar. 2013), 8 pages.
Yang & Gu, "Novel calibration techniques for high pulsed-magnetic fields using luminescence caused by photo," (with English machine translation), Journal of Huazhong University of Science and Technology, (Jun. 2007), 11 pages.
Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.
Yu et al., "Bright fluorescent nanodiamonds: no photobleaching and low cytotoxicity," J. Am. Chem. Soc., 127: 17604-17605 (Nov. 25, 2005), 2 pages.
Zhang et al., "Laser-polarization-dependent and magnetically controlled optical bistability in diamond nitrogen-vacancy centers," Physics Letters A 377: 2621-2627 (Nov. 2013), 7 pages.
Zhang et al., "Laser-polarization-dependent spontaneous emission of the zero phonon line from single nitrogen-vacancy center in diamond," Chinese Physics B 24(3), (Apr. 2014), 13 pages.
Zhang et al., "Scalable quantum information transfer between nitrogen-vacancy-center ensembles," Annals of Physics, 355: 170-181 (Apr. 2015; available online Feb. 14, 2013), 12 pages.
Zhao et al., "Atomic-scale magnetometry of distant nuclear spin clusters via nitrogen-vacancy spin in diamond," Nature Nanotechnology, 5: 242-246 (Apr. 2011), 5 pages.
Teeling-Smith et al., "Electron Paramagnetic Resonance of a Single NV Nanodiamond Attached to an Individual Biomolecule", Biophysical Journal 110, May 10, 2016, pp. 2044-2052.

(56) References Cited

OTHER PUBLICATIONS

UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018, from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.
European Extended Search Report for Appl. Ser. No. 16743879.5 dated Sep. 11, 2018, 11 pages.
European Extended Search Report for Appl. Ser. No. 16800410.9 dated Oct. 12, 2018, 11 pages.
Fenglian Niu, "Crack Detection of Power Line Based on Metal Magnetic Memory Non-destructive", TELKOMNIKA Indonesian Journal of Electrical Engineering, vol. 12, No. 11, Nov. 1, 2014, pp. 7764-7771.
U.S. Final Office Action for U.S. Appl. No 15/380,691 dated Sep. 21, 2018, 12 pages.
U.S. Final Office Action for U.S. Appl. No. 15/479,256 dated Sep. 10, 2018, 20 pages.
U.S. Non-Final Office Action for U.S. Appl. No. 15/443,422 dated Oct. 2, 2018, 16 pages.
U.S. Non-Final Office Action for U.S. Appl. No. 15/446,373 dated Oct. 1, 2018, 13 pages.
U.S. Non-Final Office Action for U.S. Appl. No. 15/454,162 dated Sep. 10, 2018, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance for U.S. Appl. No. 14/866,730 dated Aug. 15, 2018, 9 pages.
U.S. Notice of Allowance for U.S. Appl. No. 15/468,289 dated Oct. 17, 2018, 12 pages.
U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
European Extended Search Report for Appl. Ser. No. 16740794.9 dated Nov. 12, 2018, 12 pages.
Halbach et al., "Design of Permanent Multipole Magnets with Oriented Rare Earth Cobalt Material", Nuclear Instruments and Methods, North Holland Publishing Co., Amsterdam, NL., vol. 169, Jan. 1, 1980, pp. 1-5, XP001032085, DOI: 10.1016/0029-554X(80)90094-4.
Hodges et al., "Time-keeping with electron spin states in diamond", Dept. of Electrical Engineering and Dept. of Applied Physics and Applied Mathematics, Columbia University, New York, New York 10027, Aug. 30, 2011, 13 pages.
Hodges et al., Appendix, "Time-keeping with electron spin states in diamond", Dept. of Electrical Engineering and Dept. of Applied Physics and Applied Mathematics, Columbia University, New York, New York 10027, Aug. 27, 2012, 46 pages.
International Search Report and Written Opinion for PCT Appl. Ser. No. PCT/US2018/041527 dated Feb. 4, 2019, 22 pages.
Non-Final Office Action on U.S. Appl. No. 15/003,670 dated Nov. 27, 2018.
US Ex Parte Quayle Action for U.S. Appl. No. 15/468,641 dated Nov. 28, 2018, 11 pages.
U.S. Non-Final Office Action for U.S. Appl. No. 15/003,177 dated Jan. 14, 2019, 15 pages.
U.S. Non-Final Office Action for U.S. Appl. No. 15/003,670 dated Nov. 27, 2018, 14 pages.
U.S. Non-Final Office Action for U.S. Appl. No. 15/382,045 dated Dec. 31, 2018, 16 pages.
U.S. Non-Final Office Action for U.S. Appl. No. 15/400,794 dated Jan. 10, 2019, 6 pages.
U.S. Non-Final Office Action for U.S. Appl. No. 15/468,356 dated Jan. 2, 2019, 10 pages.
U.S. Non-Final Office Action for U.S. Appl. No. 15/468,951 dated Dec. 13, 2018, 9 pages.
U.S. Notice of Allowance for U.S. Appl. No. 15/003,670 dated Feb. 1, 2019, 7 pages.
U.S. Notice of Allowance for U.S. Appl. No. 15/350,303 dated Dec. 26, 2018, 10 pages.
U.S. Notice of Allowance for U.S. Appl. No. 15/450,504 dated Dec. 13, 2018, 7 pages.
U.S. Notice of Allowance for U.S. Appl. No. 15/454,162 dated Jan. 17, 2019, 8 pages.
U.S. Notice of Allowance for U.S. Appl. No. 15/468,397 dated Dec. 12, 2018, 5 pages.
U.S. Notice of Allowance for U.S. Appl. No. 15/468,641 dated Feb. 7, 2019, 10 pages.
U.S. Notice of Allowance for U.S. Appl. No. 15/479,256 dated Feb. 4, 2019, 7 pages.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless LAN Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 2, 2018, from related U.S. Appl. No. 15/003,292, 8 pages.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.

(56) References Cited

OTHER PUBLICATIONS

U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
International Search Report and Written Opinion for PCT Appl. Ser. No. PCT/US2018/041411 dated Feb. 8, 2019, 13 pages.
Rosskopf, "Advanced quantum sensing using nitrogen vacancy centers in diamond", Dissertation, p. 91 (12 pages), XP055500261, DOI: 10.3929/ethz-b-000168296 Retrieved from the Internet: URL: https://epo.summon.serialssolutions.com/2.0.0/lInk/0/elvHCXMwY2BQsUxJMUs0MJTWNQWwlomqZYWuolJ5qa6qaagq5BSjEzMLUG7kSOdTULczYPcTXwQHUXQqkrUWXXQ_a21WpJRpZukC26gWBhZmjEzsAJbAuaWkH1HrEqAZSIojWVyZkkqUoXhJsjA44106S3EwJSaJ8Lg5AidcFcoLAV6qDRXoRiOfDwvXaEUTAJzV1E-MEIVylIKTQYWeAmJlJLB5ppCZpwCMRmCCSRFIMHVzDXH201X.
Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.dIss.fu-berlln.de/diss/servlets/MCRFIleNodeServIeUFU_DISS_derivate_000000012199/DIssertatIon_SImon-choenfela_PublIcVersion-2.pdfJsessionid-89A943688E59.
U.S. Final Office Action for U.S. Appl. No. 15/003,396 dated Mar. 22, 2019, 13 pages.
U.S. Final Office Action for U.S. Appl. No. 15/382,045 dated Apr. 26, 2019, 16 pages.
U.S. Final Office Action for U.S. Appl. No. 15/443,422 dated Mar. 7, 2019, 17 pages.
U.S. Non-Final Office Action for U.S. Appl. No. 15/003,193 dated Apr. 11, 2019, 7 pages.
U.S. Non-Final Office Action for U.S. Appl. No. 15/003,309 dated Feb. 13, 2019, 16 pages.
U.S. Non-Final Office Action for U.S. Appl. No. 15/003,617 dated Feb. 26, 2019, 10 pages.
U.S. Non-Final Office Action for U.S. Appl. No. 15/372,201 dated Apr. 2, 2019, 10 pages.
U.S. Non-Final Office Action for U.S. Appl. No. 15/419,832 dated Feb. 8, 2019, 12 pages.
U.S. Non-Final Office Action for U.S. Appl. No. 15/440,194 dated Feb. 15, 2019, 21 pages.
U.S. Non-Final Office Action for U.S. Appl. No. 15/446,373 dated Apr. 19, 2019, 8 pages.
U.S. Non-Final Office Action for U.S. Appl. No. 15/468,314 dated Mar. 28, 2019, 17 pages.
U.S. Non-Final Office Action for U.S. Appl. No. 15/468,410 dated Apr. 11, 2019, 15 pages.
U.S. Non-Final Office Action for U.S. Appl. No. 15/468,559 dated Apr. 11, 2019, 12 pages.
U.S. Notice of Allowance for U.S. Appl. No. 15/003,617 dated Apr. 30, 2019, 9 pages.
U.S. Notice of Allowance for U.S. Appl. No. 15/207,457 dated Mar. 6, 2019, 16 pages.
U.S. Notice of Allowance for U.S. Appl. No. 15/376,244 dated Feb. 21, 2019, 7 pages.
U.S. Notice of Allowance for U.S. Appl. No. 15/380,419 dated Feb. 26, 2019, 5 pages.
U.S. Notice of Allowance for U.S. Appl. No. 15/400,794 dated Apr. 25, 2019, 5 pages.
U.S. Notice of Allowance for U.S. Appl. No. 15/437,038 dated Mar. 21, 2019, 13 pages.
U.S. Notice of Allowance for U.S. Appl. No. 15/437,222 dated Mar. 25, 2019, 11 pages.
U.S. Notice of Allowance for U.S. Appl. No. 15/468,282 dated Feb. 19, 2019, 8 pages.
U.S. Notice of Allowance for U.S. Appl. No. 15/468,56 dated Apr. 22, 2019, 8 pages.
U.S. Notice of Allowance for U.S. Appl. No. 15/468,582 dated Mar. 21, 2019, 13 pages.
U.S. Notice of Allowance for U.S. Appl. No. 15/468,951 dated Mar. 28, 2019, 8 pages.
International Search Report and Written Opinion for PCT Appl. Ser. No. PCT/US2019/022097 dated May 15, 2019, 13 pages.
U.S. Final Office Action for U.S. Appl. No. 15/003,309 dated May 23, 2019, 8 pages.
U.S. Non-Final Office Action for U.S. Appl. No. 15/468,274 dated May 14, 2019, 15 pages.
U.S. Non-Final Office Action for U.S. Appl. No. 15/468,303 dated Jun. 25, 2019, 14 pages.
U.S. Notice of Allowance for U.S. Appl. No. 15/419,832 dated Jun. 24, 2019, 5 pages.
U.S. Notice of Allowance for U.S. Appl. No. 15/443,422 dated Jul. 23, 2019, 10 pages.

\* cited by examiner

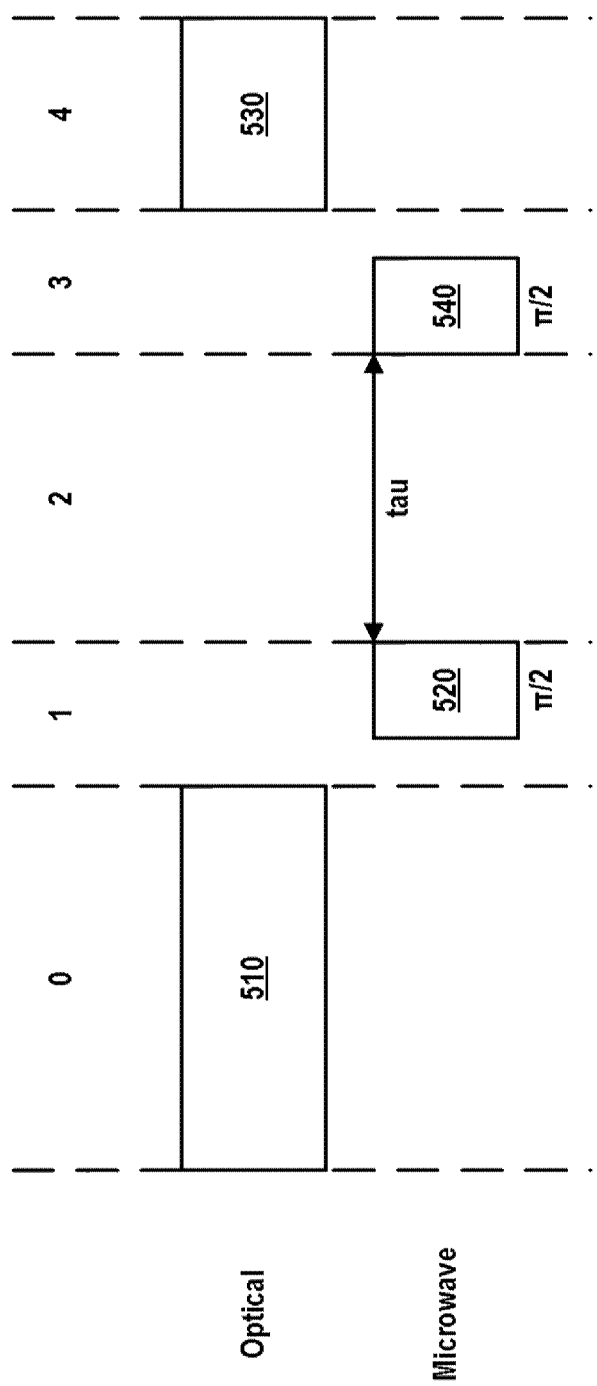

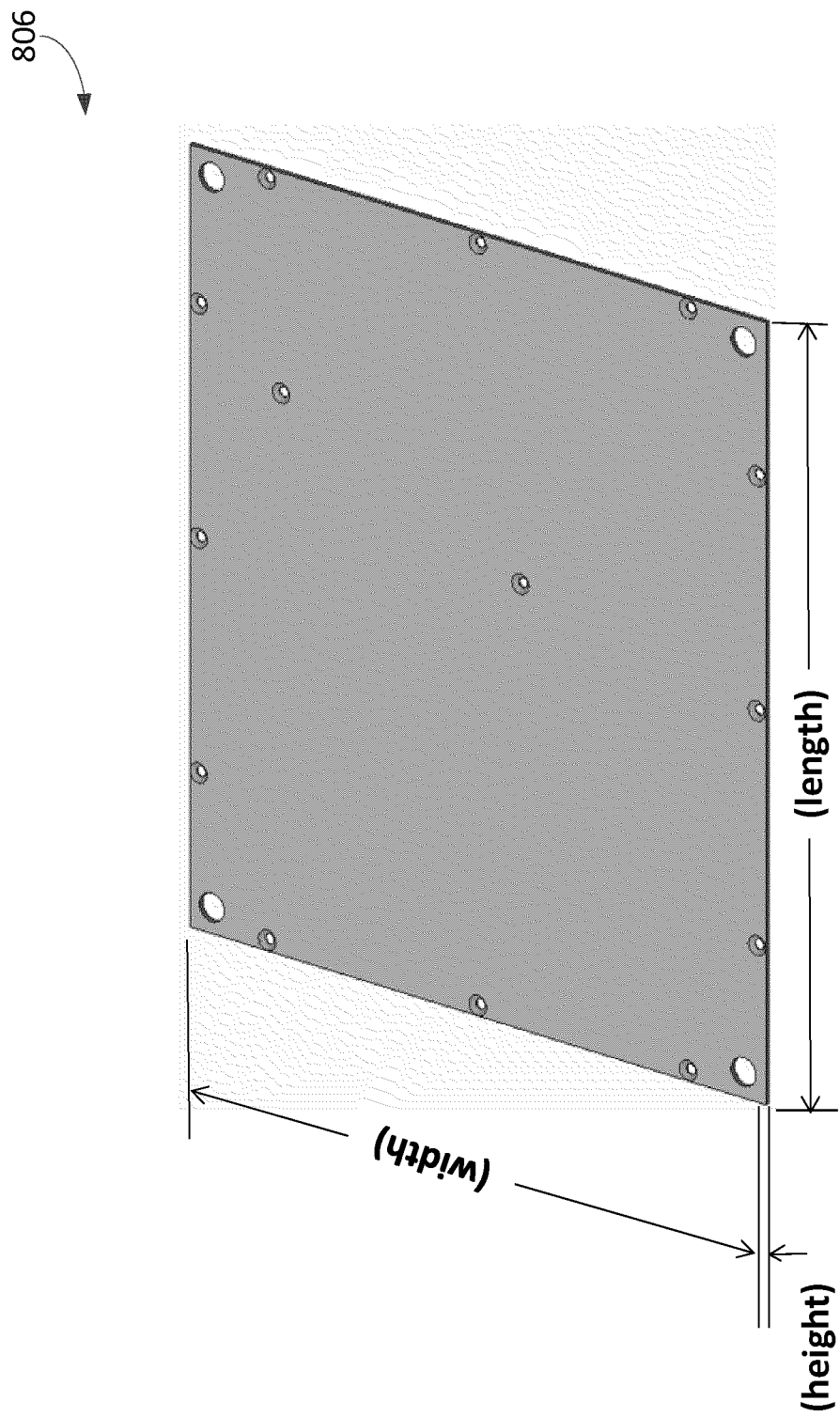

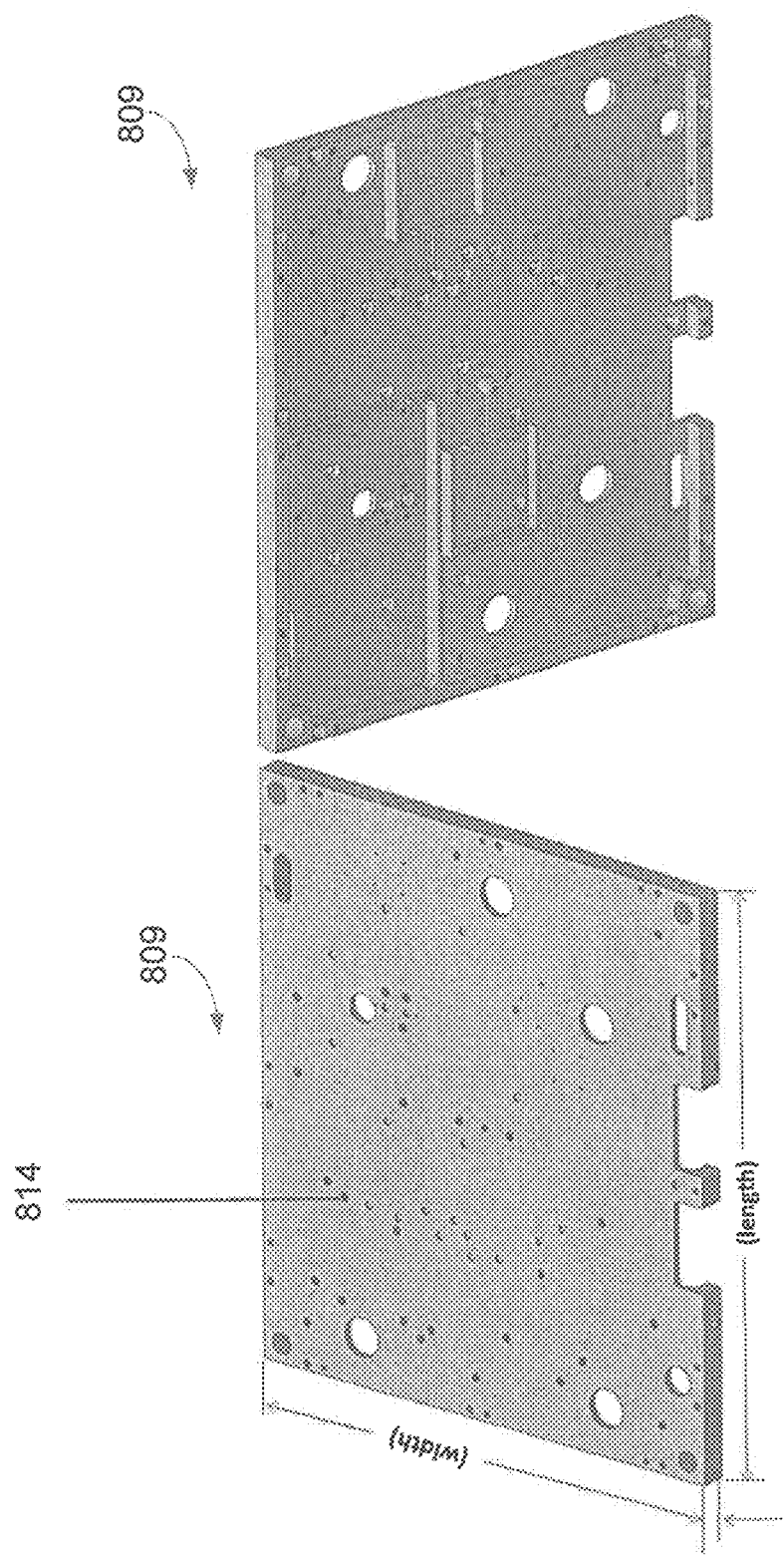

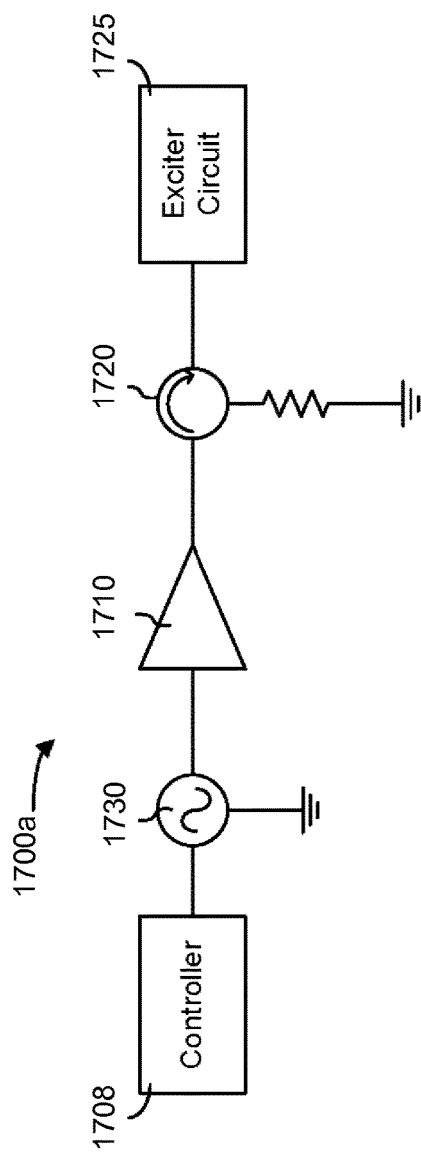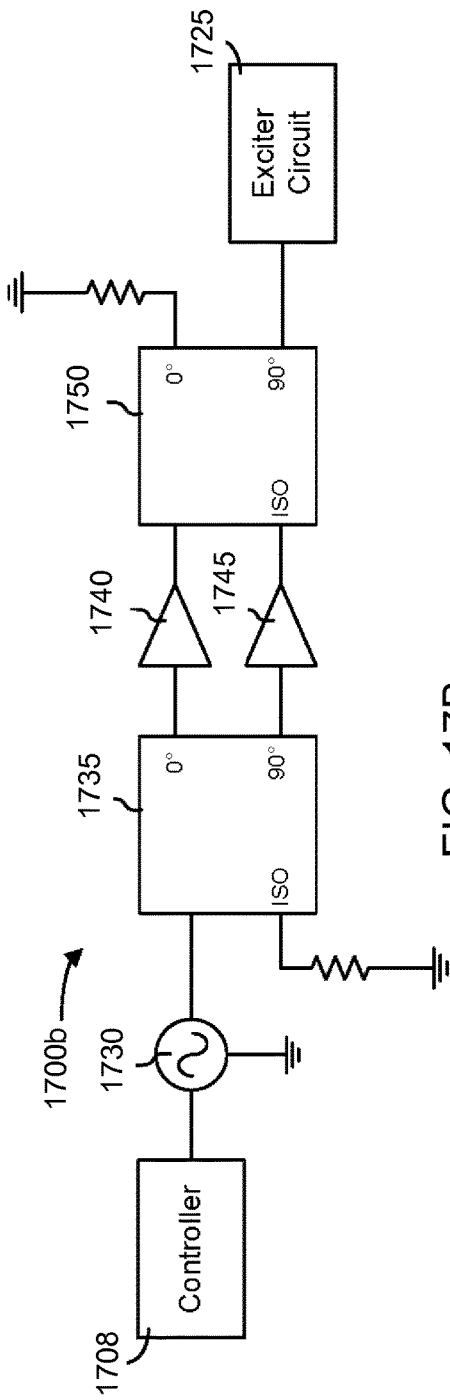
FIG. 17A
FIG. 17B

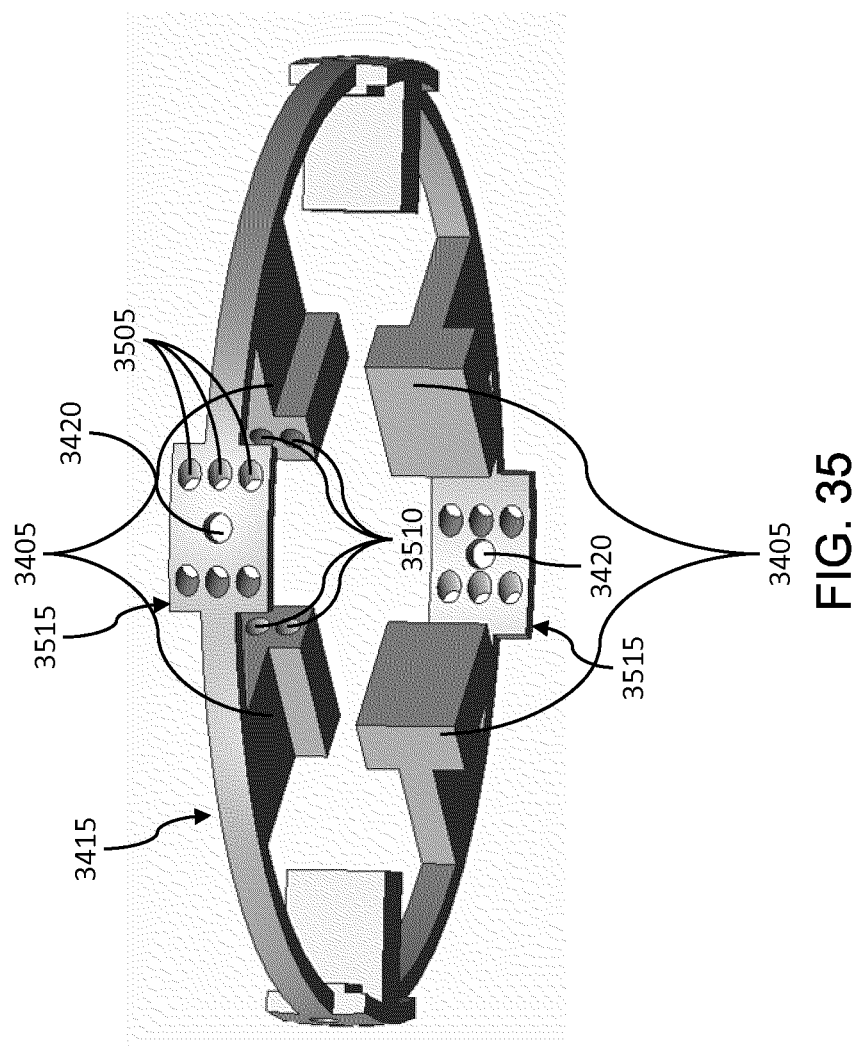

MAGNETIC DETECTION SYSTEM WITH HIGHLY INTEGRATED DIAMOND NITROGEN VACANCY SENSOR

CROSS-REFERENCE TO RELATED PATENT APPLICATIONS

This application is related to U.S. application Ser. No. 15/468,582, filed Mar. 24, 2017, entitled "STANDING-WAVE RADIO FREQUENCY EXCITER," which is incorporated by reference herein in its entirety. This application is related to U.S. application Ser. No. 15/468,951, filed Mar. 24, 2017, entitled "BIAS MAGNETIC ARRAY," which is incorporated by reference herein in its entirety. This application is related to U.S. application Ser. No. 15/468,559, filed Mar. 24, 2017, entitled "MAGNETO-OPTICAL DEFECT CENTER MATERIAL HOLDER," which is incorporated by reference herein in its entirety. This application is related to U.S. application Ser. No. 15/468,282, filed Mar. 24, 2017, entitled "VACANCY CENTER MATERIAL WITH HIGHLY EFFICIENT RF EXCITATION," which is incorporated by reference herein in its entirety. This application is related to U.S. application Ser. No. 15/468,314, filed Mar. 24, 2017, entitled "MAGNETO-OPTICAL DEFECT CENTER SENSOR WITH VIVALDI RF ANTENNA ARRAY," which is incorporated by reference herein in its entirety. This application is related to U.S. application Ser. No. 15/468,274, filed Mar. 24, 2017, entitled "USE OF WAVEPLATES IN MAGNETOMETER SENSOR," which is incorporated by reference herein in its entirety. This application is related to U.S. application Ser. No. 15/468,303, filed Mar. 24, 2017, entitled "PRECISION ADJUSTABILITY OF OPTICAL COMPONENTS IN A MAGNETOMETER SENSOR," which is incorporated by reference herein in its entirety.

FIELD

The present disclosure generally relates to magnetic detection systems, and more particularly, to a magnetic detection system with a highly integrated diamond nitrogen vacancy sensor.

BACKGROUND

The following description is provided to assist the understanding of the reader. None of the information provided or references cited is admitted to be prior art. Some magnetometers use magneto-optical defect center materials to determine a magnetic field. Such magnetometers can direct light into the magneto-optical defect center material. Magneto-optical defect center materials with defect centers can be used to sense an applied magnetic field by transmitting light into the materials and measuring the responsive light that is emitted.

A number of industrial and scientific areas such as physics and chemistry can benefit from magnetic detection and imaging with a device that has improved sensitivity and/or the ability to capture signals that fluctuate rapidly (i.e., improved bandwidth) with a package that is small in size, efficient in power and reduced in volume.

SUMMARY

According to some embodiments, there is a system for magnetic detection that can include a housing, a magneto-optical defect center material including at least one magneto-optical defect center that emits an optical signal when excited by an excitation light, a radio frequency (RF) exciter system configured to provide RF excitation to the magneto-optical defect center material, an optical light source configured to direct the excitation light to the magneto-optical defect center material, and an optical detector configured to receive the optical signal emitted by the magneto-optical defect center material based on the excitation light and the RF excitation. According to some embodiments, the magneto-optical defect center material can include a nitrogen vacancy (NV) diamond material having one or more NV centers.

According to some embodiments, the housing further comprises: a top plate; a bottom plate; and at least one side plate. The top plate, the bottom plate, and the at least one side plate form an enclosure that contains the magneto-optical defect center material, the RF exciter system, the optical light source, and the optical detector.

According to some embodiments, the top plate is made from Noryl, the bottom plate is made from copper, stainless steel, aluminum or copper, and the at least one side plate is made from Noryl.

According to some embodiments, the housing further comprises one or more separation plates configured to isolate at least one of the magneto-optical defect center material, the RF exciter system, the optical light source, and the optical detector within the housing.

According to some embodiments, the housing further comprises a main plate provided between the side plate and the bottom plate. The magneto-optical defect center material, the RF exciter system, the optical light source, and the optical detector are mounted to the main plate.

According to some embodiments, the main plate is made from Noryl.

According to some embodiments, the main plate can include a plurality of holes positioned to allow the magneto-optical defect center material, the RF exciter system, the optical light source, and the optical detector to be mounted to the main plate in a plurality of locations on the main plate.

According to some embodiments, the system for magnetic detection can further include a gasket configured to hermetically seal the top plate, the bottom plate, the at least one side plate, and the main plate together.

According to some embodiments, the system for magnetic detection can further include a hydrogen absorber positioned within the housing, the hydrogen absorber configured to absorb hydrogen released by materials used in the system for magnetic detection.

According to some embodiments, the system for magnetic detection can further include a nitrogen cooling system configured to cool or otherwise reduce thermal loading on components of the system for magnetic detection. The nitrogen cooling system may be in thermal communication with the at least one of the top plate or the bottom plate including the cooling fins such that heat removed by the nitrogen cooling system is convectively dissipated to atmosphere via the cooling fins.

According to some embodiments, at least one of the top plate or the bottom plate include cooling fins can be configured to thermally dissipate heat transferred to the at least one of the top plate or the bottom plate.

According to some embodiments, the system for magnetic detection can further include a nitrogen cooling system configured to cool or otherwise reduce thermal loading on components of the system for magnetic detection. The nitrogen cooling system is in thermal communication with the at least one of the top plate or the bottom plate including the cooling fins such that heat removed by the nitrogen cooling system is convectively dissipated to atmosphere via the cooling fins.

According to some embodiments, the system for magnetic detection can further include a controller programmed to: receive an indication of a frequency of the excitation light; receive an indication of a frequency of the optical signal emitted by the magneto-optical defect center material; and determine a magnitude of an external magnetic field based at least in part on a comparison between the frequency of the excitation light and the frequency of the optical signal emitted by the magneto-optical defect center material. The controller may be further programmed to determine a direction of the external magnetic field based at least in part on a comparison between the frequency of the excitation light and the frequency of the optical signal emitted by the magneto-optical defect center material.

According to some embodiments, the RF exciter system can include a radio frequency (RF) source; a radio frequency (RF) input; a radio frequency (RF) ground; and a microstrip line electrically connected to the RF input and short circuited to the RF ground adjacent the magneto-optical defect center material. The controller is further programmed to control the RF source such that a standing wave RF field is created in the magneto-optical defect center material.

According to some embodiments, the RF exciter system can include an RF feed connector; and a metallic material coated on the magneto-optical defect center material and electrically connected to the RF feed material.

According to some embodiments, the RF exciter system can further include a circuit board comprising an insulating board and conductive traces formed on the insulating board, the conductive traces electrically connecting the RF feed connector to the metallic material.

According to some embodiments, the system for magnetic detection can further include a plurality of magnets configured to provide a bias magnetic field to the magneto-optical defect center material; a ring magnet holder comprising: an outer ring with an outside surface, and a plurality of holders extending from the ring, wherein the plurality of holders are configured to hold the plurality of magnets in a same orientation with respect to one another; and a mount comprising an inside surface, wherein the outside surface of the outer ring slides along the inside surface of the mount.

According to some embodiments, the ring magnet holder can further include a fixation member configured to secure the ring magnet holder in a location within the mount.

According to some embodiments, the mount can include a through-hole configured to allow the excitation light to pass through the through-hole of the mount.

According to some embodiments, the system for magnetic detection can further include a slot configured to adjust the optical light source in a respective linear direction relative to the main plate; a lens; and a drive screw mechanism configured to adjust a position of the lens relative to the optical light source.

According to some embodiments, the system for magnetic detection can further include a plurality of drive screw mechanisms configured to adjust a position of the lens relative to the optical light source, each of the plurality of drive screw mechanisms configured to adjust in a direction orthogonal to the other drive screw mechanisms.

According to some embodiments, the system for magnetic detection can further include a waveplate assembly comprising: a waveplate, a mounting disk adhered to the waveplate, and a mounting base configured such that the mounting disk can rotate relative to the mounting base around an axis of the waveplate. The excitation light emitted by the optical light source can be directed through the waveplate before the excitation light is directed to the magneto-optical defect center material.

According to some embodiments, the optical light source can emit green light, and the magneto-optical defect center material can include a plurality of defect centers in a plurality of orientations. According to some embodiments, the system for magnetic detection can further include a half-wave plate, through which at least some of the green light passes, rotating a polarization of such green light to thereby provide an orientation to light waves emitted from the half-wave plate, the half-wave plate capable of being orientated relative to the defect centers in a plurality of orientations. The orientation of the light waves can coincide with an orientation of the defect centers, thereby imparting substantially increased energy transfer to the defect center with coincident orientation while imparting substantially decreased energy transfer to the defect centers that are not coincident. The excitation light emitted by the optical light source can be directed through the half-wave plate before the excitation light is directed to the magneto-optical defect center material.

According to some embodiments, the system for magnetic detection can further include a beam former in electrical communication with the RF excitation source; and an array of Vivaldi antenna elements in electrical communication with the beam former. The magneto-optical defect center material can be positioned in a far field of the array of Vivaldi antenna elements. The array of Vivaldi antenna elements can generate a RF magnetic field that is uniform over the magneto-optical defect center material, wherein the optical light source transmits excitation light at a first wavelength to the magneto-optical defect center material to detect a magnetic field based on a measurement of excitation light at a second wavelength that is different from the first wavelength.

According to some embodiments, the system for magnetic detection can further include a mount base. The RF exciter system can include a radio frequency circuit board configured to generate a radio frequency field around the magneto-optical defect center material. The magneto-optical defect center material and the radio frequency circuit board can be mounted to the mount base. The mount base can be configured to be fixed to the housing in a plurality of orientations.

According to some embodiments, in each of the plurality of orientations, the excitation light can enter the magneto-optical defect center material in a respective side of the magneto-optical defect center material.

According to some embodiments, the excitation light can be injected into a first side of the magneto-optical defect center material when the mount base is fixed in a first orientation in the plurality of orientations, and the excitation light can be injected into a second side of the magneto-optical defect center material when the mount base is fixed in a second orientation in the plurality of orientations.

According to some embodiments, when the mount base is fixed in the first orientation, a portion of the excitation light can pass through the magneto-optical defect center material and can be detected by a second light sensor, and when the mount base is fixed in the second orientation, a portion of the excitation light cannot detected by the second light sensor.

Precision Adjustability of Optical Components in a Magnetometer Sensor

In order to adjust optical excitation through a plurality of lenses to magneto-optical defect center materials, the relative position of an optical excitation assembly material can be controlled. During manufacture of a sensor system, there may be small variations in how a magneto-optical defect center material is mounted or in the tolerances of sensor components including the lenses and spacers such that adjustment is needed after assembly to adjust and focus the generated optical excitation. In some implementations, the generated optical excitation is laser light from a laser diode. In some implementations, an initial calibration is done on the sensor system to adjust the relative position of the optical excitation assembly to a base structure to benefit the final intended purpose of the sensor.

According to some embodiments, there is an optical excitation assembly for attachment to a base structure that can include a defect center in a magneto-optical defect center material in a fixed position relative to the base structure, a slot configured to adjust the optical excitation assembly in a respective linear direction relative to the base structure, an optical excitation source, a lens, and a drive screw mechanism. The drive screw mechanism can be configured to adjust a position of the lens relative to the optical excitation source. In some implementations, the optical excitation assembly can further include a plurality of drive screw mechanisms, where the plurality of drive screw mechanisms are configured to adjust a position of the lens relative to the optical excitation source. In some implementations, each of the plurality of drive screw mechanisms may be configured to adjust in a direction orthogonal to the other drive screw mechanisms. According to some embodiments, the magneto-optical defect center material can include a nitrogen vacancy (NV) diamond material having one or more NV centers.

According to some embodiments, the optical excitation assembly can further include a shim configured to adjust the optical excitation assembly in a linear direction relative to the base structure. In some embodiments, the optical excitation assembly can further include a magneto-optical defect center material with defect centers. The light from the optical excitation source can be directed through the lens into the magneto-optical defect center material with defect centers.

According to some embodiments, the optical excitation assembly can further include a half-wave plate assembly. The half-wave plate assembly can include a half-wave plate, a mounting disk adhered to the half-wave plate, and a mounting base configured such that the mounting disk can rotate relative to the mounting base around an axis of the half-wave plate. In some embodiments, the lens can be configured to direct light from the optical excitation source through the half-wave plate before the light is directed to the magneto-optical defect center material. In some implementations, the optical excitation assembly can further include a pin adhered to the mounting disk. The mounting base can include a mounting slot configured to receive the pin. The pin can slide along the mounting slot and the mounting disk can rotate relative to the mounting base around the axis of the half-wave plate, with the axis perpendicular to a length of the mounting slot.

According to some embodiments, the optical excitation assembly can further include a screw lock inserted through the slot and configured to prevent relative motion of the optical excitation assembly to the base structure when tightened.

According to some embodiments, there is an assembly for attachment to a base structure that can include a slot configured to adjust the assembly in a respective linear direction relative to the base structure, an optical excitation source, a plurality of lenses, an adjustment mechanism, and a magneto-optical defect center material with defect centers. The adjustment mechanism can be configured to adjust a position of the plurality of lenses relative to the optical excitation source. The light from the optical excitation source can be directed through the plurality of lenses into the magneto-optical defect center material with defect centers. In some embodiments, the assembly can be configured to direct light from the optical excitation source through a half-wave plate before the light is directed to the magneto-optical defect center material.

According to some embodiments, the assembly can further include a mounting disk adhered to the half-wave plate. The mounting disk can be configured to rotate relative to the mounting base around the axis of the half-wave plate. In some embodiments, the assembly can further include a pin adhered to the mounting disk. The mounting base can include a mounting slot configured to receive the pin. The pin can slide along the slot and the mounting disk can rotate relative to the mounting base around the axis of the half-wave plate, the axis perpendicular to a length of the slot.

According to some embodiments, the optical excitation source can be one of a laser diode or a light emitting diode.

According to some embodiments, the assembly may further include a screw lock inserted through the slot. The screw lock can be configured to prevent relative motion of the optical excitation assembly to the base structure when tightened. A second screw lock attached to the mounting disk can be configured to prevent rotation of the mounting disk relative to the mounting base when tightened.

According to some embodiments, the lens of the assembly can be configured to direct light from the optical excitation source through the half-wave plate before the light is directed to the magneto-optical defect center material.

According to some embodiments, a sensor assembly can include a base structure and an optical excitation assembly. The optical excitation assembly can include an optical excitation means, for providing optical excitation through a plurality of lenses, magneto-optical defect center material comprising a plurality of magneto-optical defect centers, and an adjustment means, for adjusting the location of the provided optical excitation where it reaches the magneto-optical defect center material.

According to some embodiments, there is a method of adjusting an optical excitation assembly relative to a base structure that can include adjusting an optical excitation source in a respective linear direction relative to the base structure using a slot and adjusting a position of a lens in the optical excitation assembly relative to the optical excitation source using a drive screw mechanism. The adjusting the optical excitation source and adjusting the position of a lens may direct light from the optical excitation source to a defect center in a magneto-optical defect center that is in a fixed position relative to the base structure. According to some embodiments, the magneto-optical defect center material can include a nitrogen vacancy (NV) diamond material having one or more NV centers.

According to some embodiments, the method can further include adjusting the position of the lens in the optical excitation assembly using a plurality of drive screw mechanisms. Each of the plurality of drive screw mechanisms may adjust in a direction orthogonal to the other drive screw mechanisms. In some embodiments, the method may further include adjusting the optical excitation assembly in a linear direction relative to the base structure using a shim. In some implementations, the method may direct the light from the optical excitation source through the lens to the defect center.

According to some embodiments, the method can further include rotating a half-wave plate attached to the optical excitation assembly around an axis of the half-wave plate using a half-wave plate assembly. The half-wave plate assembly can include a mounting disk adhered to the half-wave plate. In some embodiments, the method may further include sliding a pin adhered to the mounting disk along a mounting slot in the mounting disk, the axis of the half-wave plate perpendicular to a length of the mounting slot when rotating the half-wave plate. In some embodiments, the method may further include tightening a screw lock inserted through the slot to prevent relative motion of the optical excitation assembly to the base structure.

Use of Waveplates in Magnetometer Sensor

In order to tune the magnetic field measurement for certain axes of the magneto-optical defect center materials the polarization of light entering the magneto-optical defect center material may be controlled. During manufacture of a sensor system, there may be small variations in how a magneto-optical defect center material is mounted to the sensor such that axes have deviation in orientation as well as inherent differences between different magneto-optical defect center materials. In such manufacturing, a calibration can be conducted by adjusting the polarization of the light to benefit the final intended purpose of the sensor.

According to some embodiments, there is a sensor that can include an optical excitation source emitting green light, a magneto-optical defect center material with defect centers in a plurality of orientations, and a half-wave plate. At least some of the green light may pass through the half-wave plate, rotating a polarization of such green light to thereby provide an orientation to the light waves emitted from the half-wave plate. The half-wave plate may be capable of being orientated relative to the defect centers in a plurality of orientations, wherein the orientation of the light waves coincides with an orientation of the defect centers, thereby imparting substantially increased energy transfer to the defect center with coincident orientation while imparting substantially decreased energy transfer to the defect centers that are not coincident. According to some embodiments, the magneto-optical defect center material can include a nitrogen vacancy (NV) diamond material having one or more NV centers.

According to some embodiments, there is a sensor that can include a waveplate assembly, an optical excitation source and a magneto-optical defect center material with defect centers. The waveplate assembly can include a waveplate, mounting base, and a mounting disk. The mounting disk can be adhered to the waveplate. The mounting base can be configured such that the mounting disk can rotate relative to the mounting base around an axis of the waveplate. According to some embodiments, the magneto-optical defect center material can include a nitrogen vacancy (NV) diamond material having one or more NV centers.

According to some embodiments, the sensor can be configured to direct light from the optical excitation source through the waveplate before the light is directed to the magneto-optical defect center material. In some embodiments, the sensor can further comprise a pin adhered to the mounting disk. The mounting base can comprise a slot configured to receive the pin, the pin can slide along the slot and the mounting disk can rotate relative to the mounting base around the axis of the waveplate with the axis perpendicular to a length of the slot. In some embodiments, the magneto-optical defect center material with defect centers can be comprised of a nitrogen vacancy (NV) diamond material comprising a plurality of NV centers. In some embodiments, the optical excitation source can be one of a laser (e.g., a laser diode) or a light emitting diode. In some embodiments, the sensor can further comprise a screw lock attached to the mounting disk. The screw lock can be configured to prevent rotation of the mounting disk relative to the mounting base when tightened. In some embodiments, the sensor can further comprise a controller electrically coupled to the waveplate assembly. The controller can be configured to control an angle of the rotation of the waveplate relative to the mounting base.

According to some embodiments, there is an assembly that can include a half-wave plate, a mounting base, an optical excitation source, and a magneto-optical defect center material with defect centers. The mounting base can be configured such that the half-wave plate can rotate relative to the mounting base around an axis of the half-wave plate. In some embodiments, the assembly can further comprise a pin adhered to the mounting disk. The mounting base can comprise a slot configured to receive the pin, the pin can slide along the slot and the mounting disk can rotate relative to the mounting base around the axis of the half-wave plate with the axis perpendicular to a length of the slot. In some embodiments, the magneto-optical defect center material with defect centers can be comprised of a nitrogen vacancy (NV) diamond material comprising a plurality of NV centers. In some embodiments, the optical excitation source can be one of a laser (e.g., a laser diode) or a light emitting diode. In some embodiments, the assembly can further comprise a screw lock attached to the mounting disk. The screw lock can be configured to prevent rotation of the mounting disk relative to the mounting base when tightened. In some embodiments, the assembly can further comprise a controller electrically coupled to the half-wave plate assembly. The controller can be configured to control an angle of the rotation of the half-wave plate relative to the mounting base. According to some embodiments, the magneto-optical defect center material can include a nitrogen vacancy (NV) diamond material having one or more NV centers.

According to some embodiments, there is a sensor assembly that can include a mounting base and a half-wave plate assembly. The half-wave plate assembly can further comprise a half-wave plate, an optical excitation means for providing optical excitation through the half-wave plate, a magneto-optical defect center material comprising a plurality of magneto-optical defect centers, and a detector means, for detecting optical radiation. According to some embodiments, the magneto-optical defect center material can include a nitrogen vacancy (NV) diamond material having one or more NV centers.

According to some embodiments, there is a sensor assembly that can include a half-wave plate, a mounting base, an optical excitation source, and a magneto-optical defect center material with defect centers. The mounting base can be configured such that the half-wave plate can rotate relative to the mounting base around an axis of the half-wave plate. According to some embodiments, the magneto-optical defect center material can include a nitrogen vacancy (NV) diamond material having one or more NV centers.

According to some embodiments, there is a sensor that can include an optical excitation source emitting light, a magneto-optical defect center material with defect centers in a plurality of orientations, and a polarization controller. The polarization controller may control the polarization orientation of the light emitted from the optical excitation source, wherein the polarization orientation coincides with an orientation of the defect centers, thereby imparting substantially increased energy transfer to the defect center with coincident orientation while imparting substantially decreased energy transfer to the defect centers that are not coincident. In some embodiments, the magneto-optical defect center material with defect centers comprises a nitrogen vacancy (NV) diamond material comprising one or more NV centers. In some embodiments, the optical excitation source is one of a laser diode or a light emitting diode.

According to some embodiments, there is a sensor assembly that can include a mounting base and an optical excitation transmission assembly. The optical excitation transmission assembly may further comprise an optical excitation means for providing optical excitation, a polarization means, for changing a polarization of light received from the optical excitation means, a magneto-optical defect center material comprising one or more magneto-optical defect centers, and a detector means, for detecting optical radiation. According to some embodiments, the magneto-optical defect center material can include a nitrogen vacancy (NV) diamond material.

Magneto-Optical Defect Center Material Holder

According to some embodiments, there is a magnetometer that can include a housing; a light source configured to provide excitation light; a magneto-optical defect center material with at least one defect center that emits light when excited by the excitation light; a light sensor configured to receive the emitted light; a radio frequency circuit board configured to generate a radio frequency field around the magneto-optical defect center material; and a mount base, wherein the magneto-optical defect center material and the radio frequency circuit board are mounted to the mount base, and wherein the mount base is configured to be fixed to the housing in a plurality of orientations. According to some embodiments, the magneto-optical defect center material can include a nitrogen vacancy (NV) diamond material having one or more NV centers.

According to some embodiments, in each of the plurality of orientations, the excitation light can enter the magneto-optical defect center material in a respective side of the magneto-optical defect center material.

According to some embodiments, the excitation light can be injected into a first side of the magneto-optical defect center material when the mount base is fixed in a first orientation in the plurality of orientations, and the excitation light can be injected into a second side of the magneto-optical defect center material when the mount base is fixed in a second orientation in the plurality of orientations.

According to some embodiments, when the mount base is fixed in the first orientation, a portion of the excitation light can pass through the magneto-optical defect center material and is detected by a second light sensor, and when the mount base is fixed in the second orientation, a portion of the excitation light cannot detected by the second light sensor.

According to some embodiments, the mount base can be configured to be fixed to the housing in the plurality of orientations via a plurality of sets of fixation holes.

According to some embodiments, each of the fixation holes of the sets of fixation holes can include a threaded hole.

According to some embodiments, the mount base can be configured to be fixed to the housing via at least one threaded shaft.

According to some embodiments, each set of the plurality of sets of fixation holes can include two fixation holes.

According to some embodiments, each set of the plurality of sets of fixation holes can be two fixation holes.

According to some embodiments, the light source and the light sensor can be fixed to the housing.

According to some embodiments, the magnetometer can further include a processor configured to: receive an indication of a frequency of the excitation light; receive an indication of a frequency of the emitted light; and determine a magnitude of an external magnetic field based at least in part on a comparison between the frequency of the excitation light and the frequency of the emitted light.

According to some embodiments, the processor can be further configured to determine a direction of the external magnetic field based at least in part on a comparison between the frequency of the excitation light and the frequency of the emitted light.

According to some embodiments, the processor can be further configured to determine the magnitude of the external magnetic field based in part on the radio frequency field.

According to some embodiments, the radio frequency field can have a frequency that is time-varying.

According to some embodiments, a frequency of the excitation light can be different than a frequency of the emitted light.

According to some device embodiments, the magneto-optical defect center material can include at least one defect center that transmits emitted light when excited by excitation light. The devices may also include a radio frequency circuit board that can be configured to generate a radio frequency field around the magneto-optical defect center material. The devices may further include a mount base. The magneto-optical defect center material and the radio frequency circuit board can be mounted to the mount base. The mount base may be configured to be fixed to a housing in a plurality of orientations.

Vacancy Center Material with Highly Efficient RF Excitation

According to some embodiments, there is a system for magnetic detection that can include a magneto-optical defect center material comprising a plurality of magneto-optical defect centers; an optical light source configured to provide optical excitation to the magneto-optical defect center material; an optical detector configured to receive an optical signal emitted by the magneto-optical defect center material; and a radio frequency (RF) excitation source configured to provide RF excitation to the magneto-optical defect center material, the RF excitation source comprising: an RF feed connector; and a metallic material coated on the magneto-optical defect center material and electrically connected to the RF feed connecter. According to some embodiments, the magneto-optical defect center material can include a nitrogen vacancy (NV) diamond material having one or more NV centers.

According to some embodiments, the RF excitation source can further include a circuit board comprising an insulating board and conductive traces formed on the insulating board, the conductive traces electrically connecting the RF feed connector to the metallic material.

According to some embodiments, the conductive traces can include a first trace having a first width and a first length, and a second trace contacting the first trace, the second trace having a second width and a second length different from the first width and the first length.

According to some embodiments, the second width can match the width of the magneto-optical defect center material.

According to some embodiments, the metallic material can be at least one of gold, copper, silver, or aluminum.

According to some embodiments, the RF excitations source can further include metallic material is coated at least over a top surface and a bottom surface of the magneto-optical defect center material.

According to some embodiments, there is a system for magnetic detection that can include a magneto-optical defect center material comprising a plurality of magneto-optical defect centers; a radio frequency (RF) excitation source configured to provide RF excitation to the magneto-optical defect center material; an optical detector configured to receive an optical signal emitted by the magneto-optical defect center material; and an optical light source comprising: a readout optical light source configured to provide optical excitation to the magneto-optical defect center material to transition relevant magneto-optical defect center electrons to excited spin states in the magneto-optical defect center material; and a reset optical light source configured to provide optical light to the magneto-optical defect center material to reset spin states in the magneto-optical defect center material to a ground state, wherein the RF excitation light source comprises a block portion having a support portion which supports the magneto-optical defect center material, the block portion having a first wall portion adjacent to and on one side of the support portion and a second wall portion adjacent to and on another side of the support portion opposite to the first side, a face of the second wall portion being slanted with respect to a face of the first wall portion so as to allow light emitted by the readout optical light source and the reset optical light source to be directed to the magneto-optical defect center material. According to some embodiments, the magneto-optical defect center material can include a nitrogen vacancy (NV) diamond material having one or more NV centers.

According to some embodiments, the block portion can be formed of an electrically and thermally conductive material.

According to some embodiments, the block portion can be formed of one of copper or aluminum.

According to some embodiments, the block portion can be a heat sink.

According to some embodiments, the block portion can have side holes and bottom holes to allow for side mounting and bottom mounting, respectively, of the block portion.

According to some embodiments, the RF excitation source can include an RF feed connector; and a metallic material coated on the magneto-optical defect center material and electrically connected to the RF feed connecter.

According to some embodiments, upon the RF feed connector can be driven by an RF signal, the metallic material shorts to the block portion.

Standing-Wave Radio Frequency Exciter

According to some embodiments, there is a system for magnetic detection that can include a magneto-optical defect center material comprising a plurality of magneto-optical defect centers; a radio frequency (RF) exciter system configured to provide RF excitation to the magneto-optical defect center material; an optical light source configured to direct excitation light to the magneto-optical defect center material; and an optical detector configured to receive an optical signal emitted by the magneto-optical defect center material based on the excitation light and the RF excitation. The RF exciter system can include a RF source; a controller configured to control the RF source; the RF input; a RF ground; and a microstrip line electrically connected to the RF input and short circuited to the RF ground adjacent the magneto-optical defect center material. The controller is configured to control the RF source such that a standing wave RF field is created in the magneto-optical defect center material.

According to some embodiments, the microstrip line can include conductive traces comprising a first trace having a first width and a first length, and a second trace contacting the first trace, the second trace having a second width and a second length different from the first width and the first length.

According to some embodiments, the second trace can have an impedance of less than 10Ω.

According to some embodiments, the impedance of the first trace can match a system impedance.

According to some embodiments, the first trace can have an impedance of about 50Ω.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can further include a metallic material coated at least over a top surface, a bottom surface, and a side surface of the magneto-optical defect center material, and short circuited to the RF ground adjacent the magneto-optical defect center material.

According to some embodiments, the microstrip line can have a wavelength of about a quarter wavelength of an RF carrier frequency.

According to some embodiments, there is radio frequency (RF) exciter system that can provide RF excitation to a magneto-optical defect center material comprising a plurality of magneto-optical defect centers. The RF exciter system include a RF input; a controller configured to control an RF source to apply a RF signal to the RF input; a RF ground; and a microstrip line electrically connected to the RF input and short circuited to the RF ground adjacent a magneto-optical defect center material; wherein the controller is configured to control the RF source to apply an RF signal to the RF input such that a standing wave RF field is created in the magneto-optical defect center material. According to some embodiments, the magneto-optical defect center material can include a nitrogen vacancy (NV) diamond material having one or more NV centers.

According to some embodiments, the microstrip line can include conductive traces comprising a first trace having a first width and a first length, and a second trace contacting the first trace, the second trace having a second width and a second length different from the first width and the first length.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can have a wavelength of about a quarter wavelength of an RF carrier frequency.

According to some embodiments, there is a radio frequency (RF) exciter system that can include a RF exciter circuit for providing RF excitation to a magneto-optical defect center material comprising a plurality of magneto-optical defect centers, the RF exciter circuit comprising: a RF input; a RF ground; and a microstrip line electrically connected to the RF input and short circuited to the ground adjacent a magneto-optical defect center material; a controller configured to control an RF source to apply an RF signal to the RF input; wherein the controller is configured to control the RF source to apply an RF signal to the RF input such that a standing wave RF field is created in the magneto-optical defect center material; and a RF termination component configured to reduce back reflection of a RF signal from the short circuit. According to some embodiments, the magneto-optical defect center material can include a nitrogen vacancy (NV) diamond material having one or more NV centers.

According to some embodiments, the RF termination component can include one of a non-reciprocal isolator device, or a balanced amplifier configuration.

According to some embodiments, the microstrip line can include a metallic material coated at least over a top surface, a bottom surface, and a side surface of the magneto-optical defect center material, and is short circuited to the RF ground adjacent the magneto-optical defect center material.

According to some embodiments, the microstrip line can have a wavelength of about a quarter wavelength of an RF carrier frequency.

According to some embodiments, the polarization of light entering the magneto-optical defect center material can be changed through other ways such as free space phase modulators, fiber coupled phase modulators, and/or other ways known by persons of skill in the art. In some embodiments, the change of polarization may be affected by an applied electric field on the index of refraction of a crystal in the modulator. In some embodiments, the change of polarization is affected by phase modulation such that an electric field is applied along a principal axis of a crystal in the modulator and light polarized along any other principal axis experiences an index of refraction change that is proportional to the applied electric field. In some embodiments, an electro-optic amplitude modulator allows the crystal in the modulator to act as a variable waveplate, allowing linear polarization to change to circular polarization, as well as circular polarization to change to linear polarization, as an applied voltage is increased. In some embodiments, modulators allowing for polarization control may be in a fiber-coupled form in an optical fiber cable or other waveguide.

Bias Magnetic Array

According to some embodiments, there is a magnetometer that can include a light source configured to provide excitation light; a magneto-optical defect center material with at least one defect center that transmits emitted light when excited by the excitation light; a light sensor configured to receive the emitted light; a plurality of magnets configured to provide a bias magnetic field to the magneto-optical defect center material; a ring magnet holder; and a mount comprising an inside surface, wherein the outside surface of the outer ring slides along the inside surface of the mount. The ring magnet holder can include an outer ring with an outside surface; and a plurality of holders extending from the ring, wherein the plurality of holders are configured to hold the plurality of magnets in a same orientation with respect to one another. According to some embodiments, the magneto-optical defect center material can include a nitrogen vacancy (NV) diamond material having one or more NV centers.

According to some embodiments, the magnetometer can further include a processor configured to: receive an indication of a frequency of the excitation light; receive an indication of a frequency of the emitted light; and determine a magnitude of an external magnetic field based at least in part on a comparison between the frequency of the excitation light and the frequency of the emitted light.

According to some embodiments, the processor can be further configured to determine a direction of the external magnetic field based at least in part on a comparison between the frequency of the excitation light and the frequency of the emitted light.

According to some embodiments, the magnet holder can further include a fixation member configured to secure the ring magnet holder in a location within the mount. The fixation member may comprise a set screw.

According to some embodiments, the mount can include a through-hole configured to allow the excitation light to pass through the through-hole of the mount.

According to some embodiments, the inside surface of the mount can have a shape that is semi-spherical.

According to some embodiments, the outside surface of the mount can have a shape that is semi-spherical.

According to some embodiments, the mount can include a first portion and a second portion that are secured together with a plurality of fasteners.

According to some embodiments, the first portion can include half of the inside surface.

According to some embodiments, the plurality of magnets can be permanent magnets.

According to some embodiments, the plurality of holders can each comprise at least one magnet hole, wherein each of the at least one magnet hole can be configured to hold one of the plurality of magnets.

According to some embodiments, the ring magnet holder can further include at least one mounting tab, and the at least one mounting tab can include a fixation member configured to secure the ring magnet holder in a location within the mount.

According to some embodiments, the mounting tab can further include at least one through-hole, wherein the at least one through-hole can include a central axis that is coaxial to a central axis of one of the at least one magnet hole.

According to some embodiments, the bias magnetic field can be substantially uniform through the magneto-optical defect center material.

According to some embodiments, the magneto-optical material can be capable of fluorescing upon the application of certain light and providing different fluorescence depending upon applied magnetic fields.

According to some embodiments, a plurality of magnets that can be configured to provide a bias magnetic field to a magneto-optical defect center material. The devices may also include a ring magnet holder that has an outer ring with an outside surface and a plurality of holders extending from the ring. The plurality of holders may be configured to hold a plurality of magnets in a same orientation with respect to one another. The devices may further include a mount that has an inside surface. The outside surface of the outer ring may slide along the inside surface of the mount.

Magneto-Optical Defect Center Sensor with Vivaldi RF Antenna Array

According to some embodiments, there is a magnetic field sensor assembly that can include an optical excitation source; a radio frequency (RF) generator; a beam former in electrical communication with the RF generator; an array of Vivaldi antenna elements in electrical communication with the beam former; and a magneto-optical defect center material positioned in a far field of the array of Vivaldi antenna elements, wherein the array of Vivaldi antenna elements generate a RF magnetic field that is uniform over the magneto-optical defect center material, wherein the optical excitation source transmits optical light at a first wavelength to the magneto-optical defect center material to detect a magnetic field based on a measurement of optical light at a second wavelength that is different from the first wavelength. According to some embodiments, the magneto-optical defect center material can include a nitrogen vacancy (NV) diamond material having one or more NV centers.

According to some embodiments, the array of Vivaldi antenna elements can be configured to operate in a range from 2 gigahertz (GHz) to 50 GHz.

According to some embodiments, the array of Vivaldi antenna elements can include a plurality of Vivaldi antenna elements and an array lattice.

According to some embodiments, the beam former can be configured to operate the array of Vivaldi antenna elements at 2 GHz.

According to some embodiments, the beam former can be configured to operate the array of Vivaldi antenna elements at 2.8-2.9 GHz.

According to some embodiments, the beam former can be configured to spatially oversample the array of Vivaldi antenna elements.

According to some embodiments, the array of Vivaldi antenna elements can be adjacent the magneto-optical defect center material.

According to some embodiments, the magneto-optical defect center material can be a diamond having nitrogen vacancies.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 5A is a schematic illustrating a Ramsey sequence of optical excitation pulses and RF excitation pulses.

FIG. 9A illustrates the top plate of the housing of FIG. 8A.

FIG. 9D illustrates a top view of the main plate of the housing of FIG. 8A.

FIG. 9E illustrates a bottom view of the main plate of the housing of FIG. 8A.

FIG. 17A illustrates some embodiments of a circuit diagram of a RF exciter system.

FIG. 17B illustrates some embodiments of a circuit diagram of another RF exciter system.

FIG. 35 illustrates a bias magnet ring mount in accordance with some illustrative embodiments.

Figure 1:
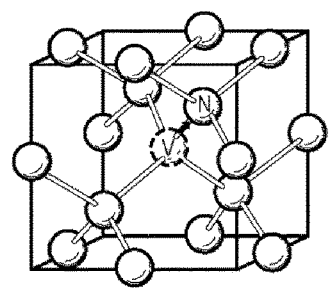
FIG. 1 illustrates one orientation of an Nitrogen-Vacancy (NV) center in a diamond lattice.

It will be recognized that some or all of the figures are schematic representations for purposes of illustration. The figures are provided for the purpose of illustrating embodiments with the explicit understanding that they will not be used to limit the scope or the meaning of the claims.

DETAILED DESCRIPTION

Atomic-sized magneto-optical defect centers, such as nitrogen-vacancy (NV) centers in diamond lattices, can have excellent sensitivity for magnetic field measurement and enable fabrication of small magnetic sensors. Magneto-optical defect center materials include but are not be limited to diamonds, Silicon Carbide (SiC), Phosphorous, and other materials with nitrogen, boron, carbon, silicon, or other defect centers. Diamond nitrogen vacancy (DNV) sensors may be maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe triplet spin states (e.g., with ms=−1, 0, +1) of the NV centers to split based upon an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers.

Magneto-optical defect center materials are those that can modify an optical wavelength of light directed at the defect center based on a magnetic field in which the magneto-defect center material is exposed. In some implementations, the magneto-optical defect center material may utilize nitrogen vacancy centers. Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field, the frequency of the microwave radiation at which the diamond generates red light and the intensity of the generated red light change. By measuring this change and comparing the change to the microwave frequency that the diamond generates red light at when not in the presence of the external magnetic field, the external magnetic field strength can be determined. Accordingly, NV centers can be used as part of a magnetic field sensor.

In some implementations, microwave RF excitation is used in a DNV sensor. The more uniform the microwave signal is across the NV centers in the diamond, the better and more accurate a NV sensor can perform. Uniformity, however, can be difficult to achieve. Also, the larger the bandwidth of the element, the better the NV sensor can perform. Large bandwidth, such as octave bandwidth, however, can be difficult to achieve. Various NV sensors respond to a microwave frequency that is not easily generated by RF antenna elements that are comparable to the small size of the NV sensor. In addition, RF elements reduce the amount of light within the sensor that is blocked by the RF elements. When a single RF element is used, the RF element is offset from the NV diamond when the RF element maximizes the faces and edges of the diamond that light can enter or leave. Moving the RF element away from the NV diamond, however, impacts the uniformity of strength of the RF that is applied to the NV diamond.

Some of the embodiments realize that the DNV magnetic sensors with dual RF elements provide a number of advantages. As described in greater detail below, using a two RF element arrangement in a DNV sensor can allow greater access to the edges and faces of the diamond for light input and egress, while still exciting the NV centers with a uniform RF field. In some implementations, each of the two microwave RF elements is contained on a circuit board. The RF elements can include multiple stacked spiral antenna coils. These stacked coils can occupy a small footprint and can provide the microwave RF field such that the RF field is uniform over the NV diamond.

In addition, all edges and faces of the diamond can be used for light input and egress. The more light captured by photo-sensing elements of a DNV sensor can result in an increased efficiency of the sensor. Various implementations use the dual RF elements to increase the amount of light collected by the DNV sensor. The dual RF elements can be fed by a single RF feed or by two separate RF feeds. If there are two RF feeds, the feeds can be individual controlled creating a mini-phased array antenna effect, which can enhance the operation of the DNV sensor.

The NV Center, its Electronic Structure, and Optical and RF Interaction

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. The neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
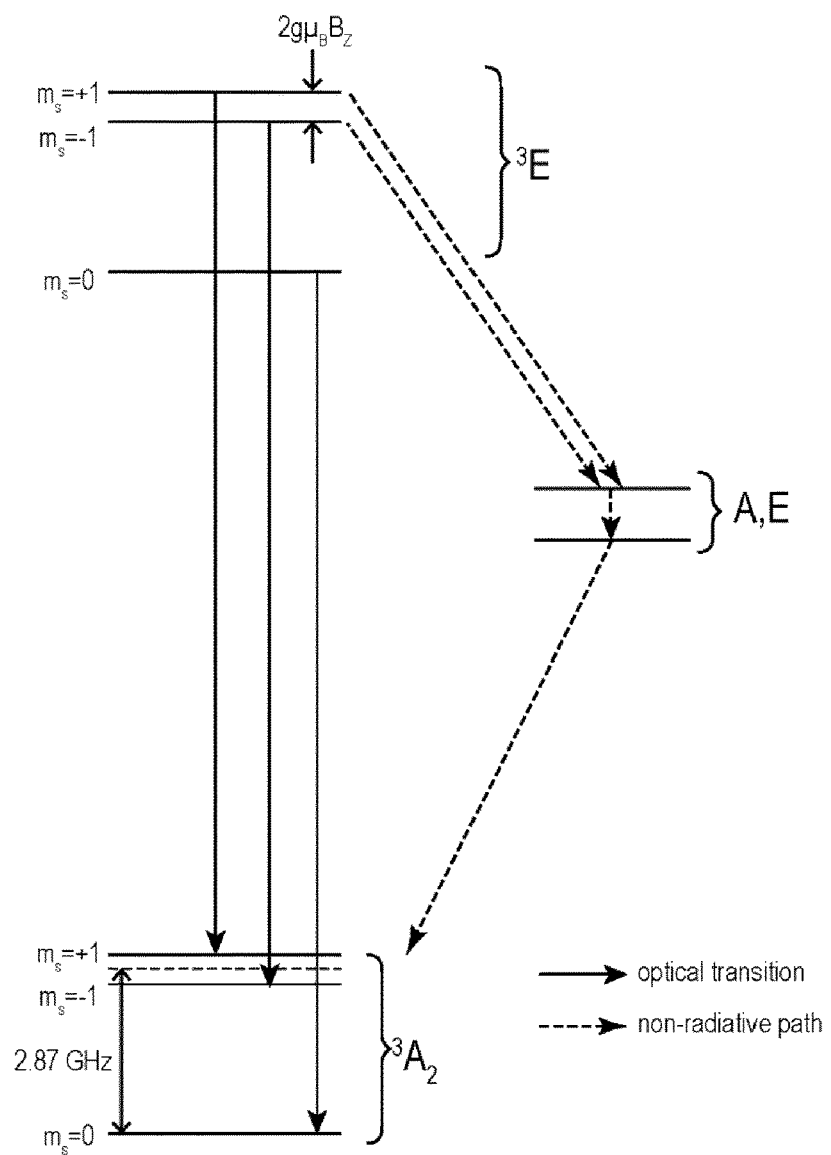
FIG. 2 illustrates an energy level diagram showing energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of approximately 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B B_z$, where g is the g-factor, $\mu_B$ is the Bohr magneton, and $B_z$ is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

The NV Center, or Magneto-Optical Defect Center, Magnetic Sensor System

Figure 3A:
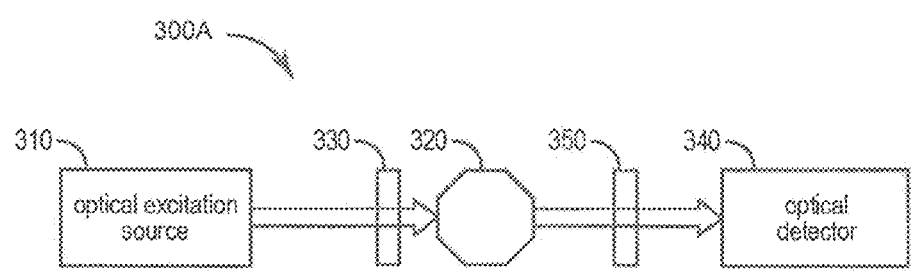
FIG. 3A is a schematic diagram illustrating a NV center magnetic sensor system.

FIG. 3A is a schematic diagram illustrating a NV center magnetic sensor system 300A that uses fluorescence intensity to distinguish the $m_s=\pm 1$ states, and to measure the magnetic field based on the energy difference between the $m_s=+1$ state and the $m_s=-1$ state, as manifested by the RF frequencies corresponding to each state. The system 300A includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance and a subsequent decrease in fluorescence intensity occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state.

The optical excitation source 310 may be a laser or a light emitting diode, for example, which emits light in the green (light having a wavelength such that the color is green), for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

Figure 4:
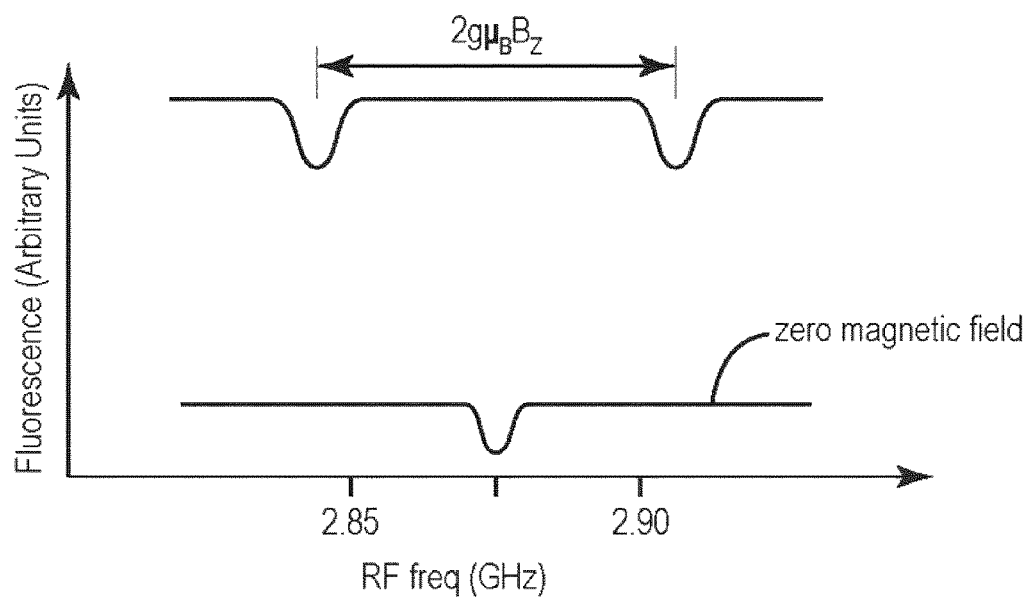
FIG. 4 is a graph illustrating the fluorescence as a function of an applied RF frequency of an NV center along a given direction for a zero magnetic field, and also for a non-zero magnetic field having a component along the NV axis.

For continuous wave excitation, the optical excitation source 310 continuously pumps the NV centers, and the RF excitation source 330 sweeps across a frequency range that includes the zero splitting (when the $m_s=\pm 1$ spin states have the same energy) photon energy of approximately 2.87 GHz. The fluorescence for an RF sweep corresponding to a NV diamond material 320 with NV centers aligned along a single direction is shown in FIG. 4 for different magnetic field components $B_z$ along the NV axis, where the energy splitting between the $m_s=-1$ spin state and the $m_s=+1$ spin state increases with $B_z$. Thus, the component $B_z$ may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

The Ramsey pulse sequence is a pulsed RF-pulsed laser scheme that measures the free precession of the magnetic moment in the NV diamond material 320 with NV centers, and is a technique that quantum mechanically prepares and samples the electron spin state. FIG. 5A is a schematic diagram illustrating the Ramsey pulse sequence. As shown in FIG. 5A, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s=0$ spin state). This is followed by a first RF excitation pulse 520 (in the form of, for example, a microwave (MW) $\pi/2$ pulse) during a period 1. The first RF excitation pulse 520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and dephase) over a time period referred to as tau ($\tau$). During this free precession time period, the system measures the local magnetic field and serves as a coherent integration. Next, a second RF excitation pulse 540 (in the form of, for example, a MW $\pi/2$ pulse)

is applied during a period 3 to project the system back to the $m_s=0$ and $m_s=+1$ basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

Figure 5B:
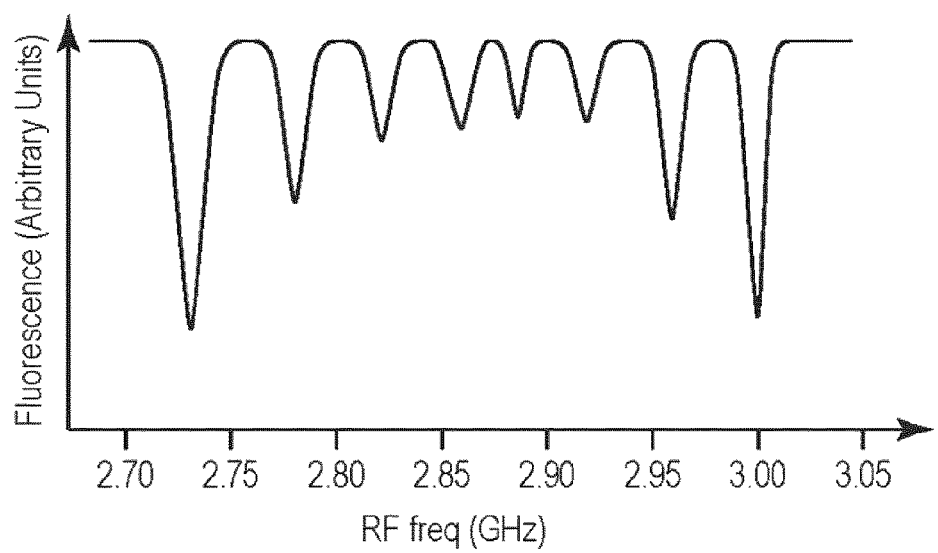
FIG. 5B is a graph illustrating the fluorescence as a function of an applied RF frequency for four different NV center orientations for a non-zero magnetic field.

In general, the NV diamond material 320 will have NV centers aligned along directions of four different orientation classes. FIG. 5B illustrates fluorescence as a function of RF frequency for the case where the NV diamond material 320 has NV centers aligned along directions of four different orientation classes. In this case, the component $B_z$ along each of the different orientations may be determined. These results, along with the known orientation of crystallographic planes of a diamond lattice, allow not only the magnitude of the external magnetic field to be determined, but also the direction of the magnetic field.

Figure 3B:
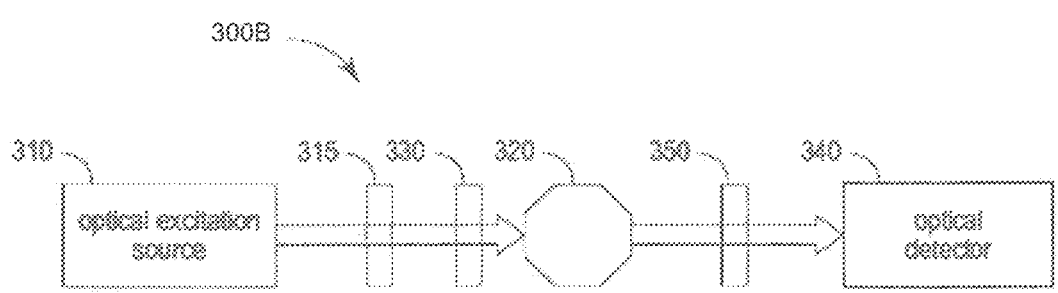
FIG. 3B is a schematic diagram illustrating a NV center magnetic sensor system with a waveplate in accordance with some illustrative embodiments.

FIG. 3B is a schematic diagram illustrating a NV center magnetic sensor system 300B with a waveplate 315. The NV center magnetic sensor system 300B uses fluorescence intensity to distinguish the $m_s=\pm1$ states, and to measure the magnetic field based on the energy difference between the $m_s=+1$ state and the $m_s=-1$ state. The system 300B includes an optical excitation source 310, which directs optical excitation through a waveplate 315 to a NV diamond material 320 with defect centers (e.g., NV diamond material). The system further includes an RF excitation source 330, which provides RF radiation to the NV diamond material 320. Light from the NV diamond may be directed through an optical filter 350 to an optical detector 340.

In some implementations, the RF excitation source 330 may be a microwave coil. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, the light from the optical excitation source 310 is directed through a waveplate 315. In some implementations, light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

In some implementations, the light is directed through a waveplate 315. In some implementations, the waveplate 315 may be in a shape analogous to a cylinder solid with an axis, height, and a base. In some implementations, the performance of the system is affected by the polarization of the light (e.g., light from a laser) as it is lined up with a crystal structure of the NV diamond material 320. In some implementations, a waveplate 315 may be mounted to allow for rotation of the waveplate 315 with the ability to stop and/or lock the waveplate 315 in to position at a specific rotation orientation. This allows the tuning of the polarization relative to the NV diamond material 320. Affecting the polarization of the system allows for the affecting the responsive Lorentzian curves. In some implementations where the waveplate 315 is a half-wave plate such that, when a laser polarization is lined up with the orientation of a given lattice of the NV diamond material 320, the contrast of the dimming Lorentzian, the portion of the light sensitive to magnetic fields, is deepest and narrowest so that the slope of each side of the Lorentzian is steepest. In some implementations where the waveplate 315 is a half-wave plate, a laser polarization lined up with the orientation of a given lattice of the NV diamond material 320 allows extraction of maximum sensitivity for the measurement of an external magnetic field component aligned with the given lattice. In some implementations, four positions of the waveplate 315 are determined to maximize the sensitivity to different lattices of the NV diamond material 320. In some implementations, a position of the waveplate 315 is determined to get similar sensitivities or contrasts to the four Lorentzians corresponding to lattices of the NV diamond material 320.

In some implementations where the waveplate 315 is a half-wave plate, a position of the waveplate 315 is determined as an initial calibration for a light directed through a waveplate 315. In some implementations, the performance of the system is affected by the polarization of the light (e.g., light from a laser) as it is lined up with a crystal structure of the NV diamond material 320. In some implementations, a waveplate 315 is mounted to allow for rotation of the waveplate 315 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration is set to allow for high contrast with steep Lorentzians for a particular lattice plane. In some implementations, the initial calibration is set to create similar contrast and steepness of the Lorentzians for each of the four lattice planes. The structural details of the waveplate 315 will be discussed in further detail below While FIGS. 3A-3B illustrate an NV center magnetic sensor system 300A, 300B with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material. Magneto-optical defect center materials include but are not limited to diamonds, Silicon Carbide (SiC) and other materials with nitrogen, boron, or other chemical defect centers. Our references to diamond-nitrogen vacancies and diamonds are applicable to magneto-optical defect center materials and variations thereof.

Figure 6A:
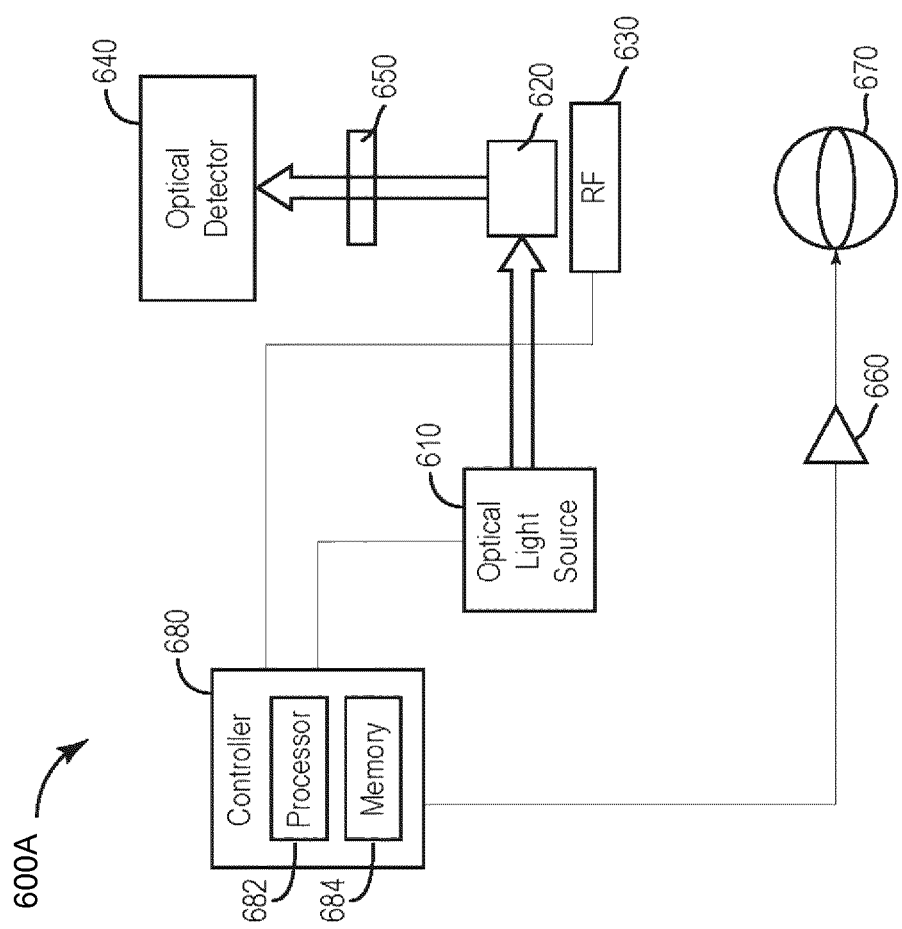
FIG. 6A is a schematic diagram illustrating some embodiments of a magnetic field detection system.

FIG. 6A illustrates a magnetic field detection system 600A according to some embodiments. The system 600A includes an optical light source 610 (i.e., the optical light source 310 of FIGS. 3A and 3B), which directs optical light to an NV diamond material 620 (i.e., the NV diamond material 320 of FIGS. 3A and 3B) with NV centers, or another magneto-optical defect center material with magneto-optical defect centers. An RF excitation source 630 (i.e., the RF excitation source 330 of FIGS. 3A and 3B) provides RF radiation to the NV diamond material 620. The system 600A may include a magnetic field generator 670 which generates a magnetic field, which may be detected at the NV diamond material 620, or the magnetic field generator 670 may be external to the system 600A. The magnetic field generator 670 may provide a biasing magnetic field.

Figure 6B:
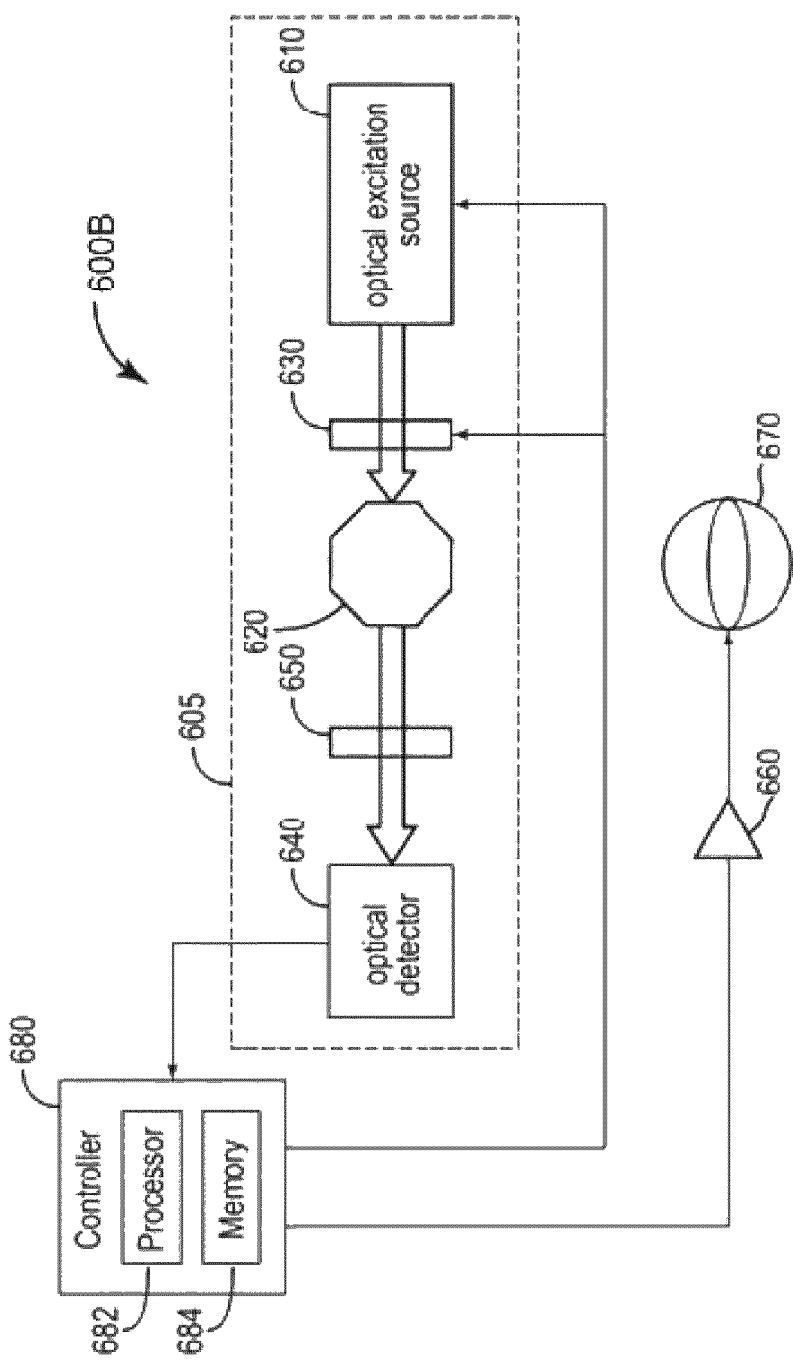
FIG. 6B is another schematic diagram illustrating some embodiments of a magnetic field detection system.

FIG. 6B is another schematic diagram of a magnetic field detection system 600B according to some embodiments. The system 600B includes an optical excitation source 610 (i.e., the optical excitation source 310 of FIGS. 3A and 3B), which directs optical excitation to a NV diamond material 620 (i.e., the NV diamond material 320 of FIGS. 3A and 3B) with defect centers. An RF excitation source 630 (i.e., the RF excitation source 330 of FIGS. 3A and 3B) provides RF radiation to the NV diamond material 620. A magnetic field generator 670 generates a magnetic field, which is detected at the NV diamond material 620.

Referring to both FIGS. 6A and 6B, the system 600A, 600B further includes a controller 680 arranged to receive a light detection signal from the optical detector 640 (i.e., the optical detector 340 of FIGS. 3A and 3B) and to control the optical light source 610, the RF excitation source 630, and the magnetic field generator 670. The controller 680 may be a single controller, or multiple controllers. For a controller 680 including multiple controllers, each of the controllers may perform different functions, such as controlling different components of the system 600A, 600B. The magnetic field generator 670 may be controlled by the controller 680 via an amplifier 660, for example.

The RF excitation source 630 may be controlled to emit RF radiation with a photon energy resonant with the transition energy between the ground $m_s=0$ spin state and the $m_s=\pm 1$ spin states as discussed above with respect to FIG. 3A or 3B, or to emit RF radiation at other nonresonant photon energies.

The controller 680 is arranged to receive a light detection signal from the optical detector 640 and to control the optical light source 610, the RF excitation source 630, and the magnetic field generator 670. The controller 680 may include a processor 682 and a memory 684, in order to control the operation of the optical light source 610, the RF excitation source 630, and the magnetic field generator 670. The memory 684, which may include a nontransitory computer readable medium, may store instructions to allow the operation of the optical light source 610, the RF excitation source 630, and the magnetic field generator 670 to be controlled. That is, the controller 680 may be programmed to provide control.

The magnetic field generator 670 may generate magnetic fields with orthogonal polarizations, for example. In this regard, the magnetic field generator 670 may include two or more magnetic field generators, such as two or more Helmholtz coils. The two or more magnetic field generators may be configured to provide a magnetic field having a predetermined direction, each of which provide a relatively uniform magnetic field at the NV diamond material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600A may be arranged to include one or more optical detection systems 605, where each of the optical detection systems 605 includes the optical detector 640, optical excitation source 610, and NV diamond material 620. Similarly, the system 600B also includes the optical detector 640, optical excitation source 610, and NV diamond material 620. The magnetic field generator 670 may have a relatively high power as compared to the optical detection systems 605. In this way, the optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The RF excitation source 630 may be a microwave coil, for example behind the light of the optical excitation source 610. The RF excitation source 630 is controlled to emit RF radiation with a photon energy resonant with the transition energy between the ground $m_s=0$ spin state and the $m_s=\pm 1$ spin states as discussed above with respect to FIGS. 3A and 3B.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and a second magnetic field generator (not illustrated). The controller may include a processor 682 and a memory 684, in order to control the operation of the optical excitation source 610, the RF excitation source 630, and the second magnetic field generator. The memory 684, which may include a nontransitory computer readable medium, may store instructions to allow the operation of the optical excitation source 610, the RF excitation source 630, and the second magnetic field generator to be controlled. That is, the controller 680 may be programmed to provide control.

Figure 6C:
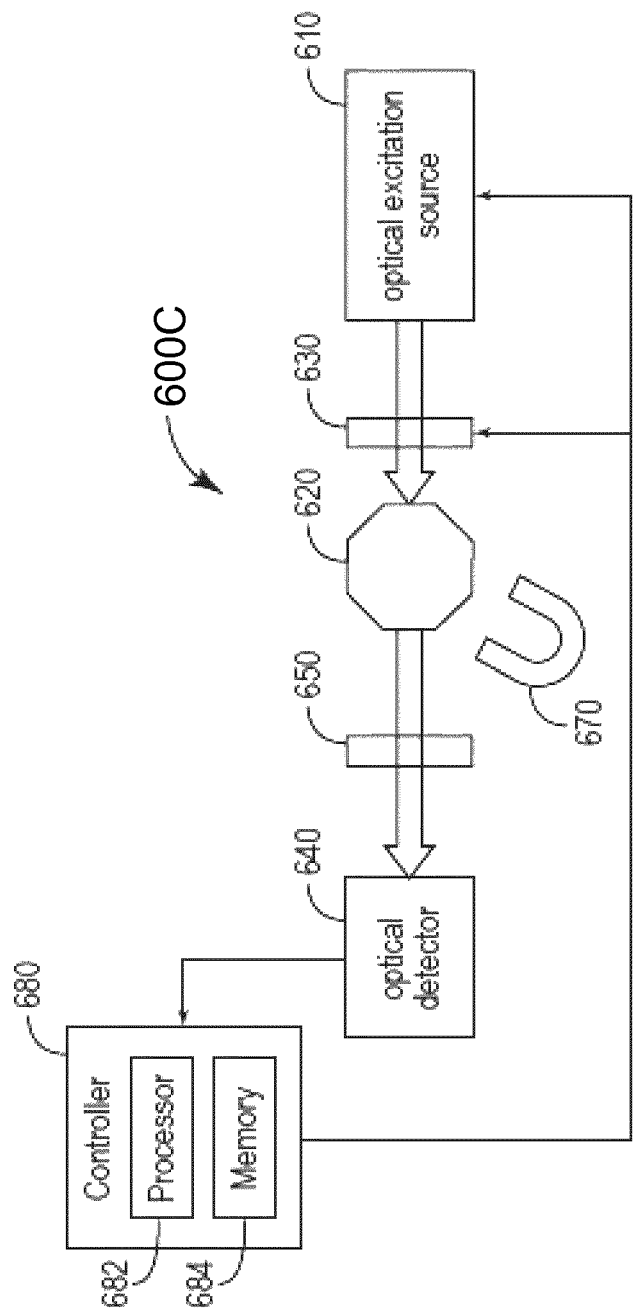
FIG. 6C is another schematic diagram illustrating some embodiments of a magnetic field detection system.

FIG. 6C is a schematic of an NV center magnetic sensor system 600C, according to an embodiment. The sensor system 600C includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor system 600C may include a bias magnet (bias magnetic field generator 670) applying a bias magnetic field to the NV diamond material 620. Unlike FIGS. 6A and 6B, the sensor system 600C of FIG. 6C does not include the amplifier 660. However, in some implementations of the NV center magnetic sensor system 600C, an amplifier 660 may be utilized. Light from the NV diamond material 620 may be directed through an optical filter 650 and optionally, an electromagnetic interference (EMI) filter (not illustrated), which suppresses conducted interference, to an optical detector 640. The sensor system 600C further includes a controller 680 arranged to receive a light detection signal from the optical detector 640 and to control the optical excitation source 610 and the RF excitation source 630.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. In implementations including the EMI filter, the EMI filter is arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

Magnetic Detection System

Figure 7A:
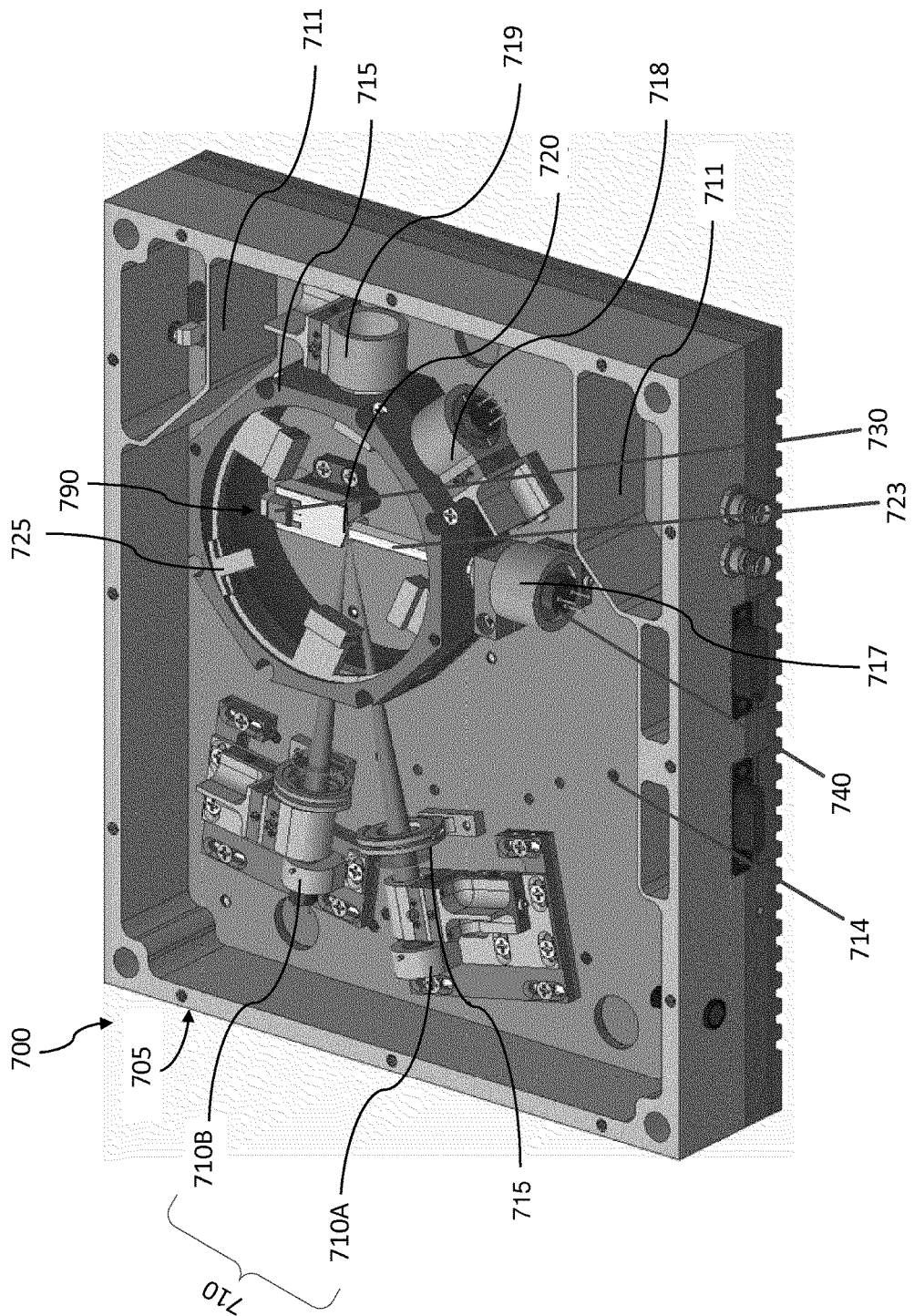
FIG. 7A illustrates an inside view of a magnetic field detection system in accordance with some illustrative embodiments.
Figure 7B:
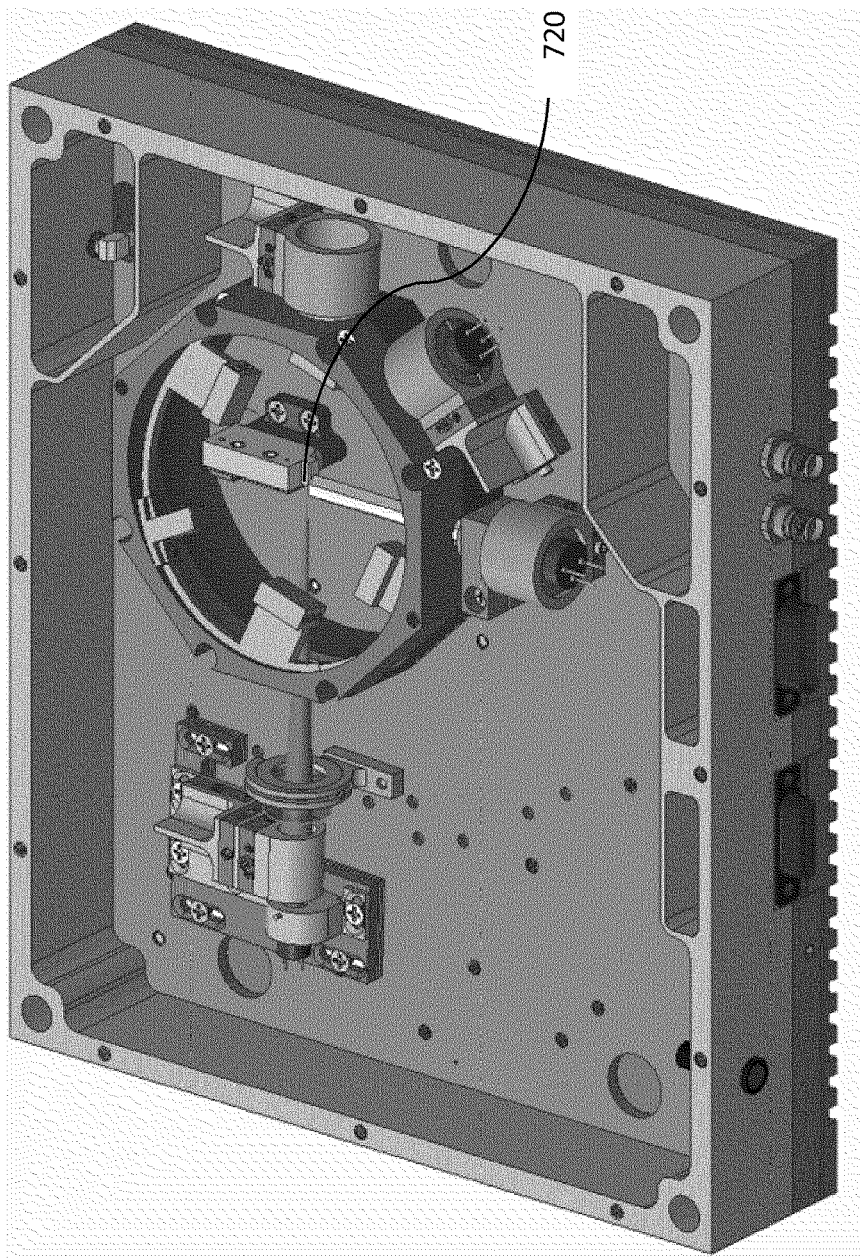
FIG. 7B illustrates an inside view of a magnetic field detection system in accordance with some illustrative embodiments in which the NV diamond material is provided in a different orientation than in FIG. 7A.

Referring to FIGS. 7A and 7B, a magnetic detection system 700 includes a magneto-optical defect center material comprising at least one magneto-optical defect center that emits an optical signal when excited by an excitation light, a radio frequency (RF) exciter system configured to provide RF excitation to the magneto-optical defect center material, an optical light system configured to direct the excitation light to the magneto-optical defect center material, and an optical detector configured to receive the optical signal emitted by the magneto-optical defect center material based on the excitation light and the RF excitation. In particular, the magnetic detection system 700 includes a housing 705, an optical excitation source 710, which directs optical light to a magneto-optical defect center material 720 (e.g., a nitrogen vacancy (NV) diamond material with one or more NV centers, or another magneto-optical defect center material with one or more magneto-optical defect centers), a magnet ring mount 715, and a bias magnet ring 725. In alternative embodiments, additional, fewer, and/or different elements may be used. For example, although two light sources 710A and 710B are shown in the embodiment of FIG. 7A, the optical excitation source 710 may include any suitable number of light sources, such as one, three, four, etc. light sources. The magneto-optical defect center material 720 may be held by a holder 790. FIGS. 7A and 7B illustrate the same components, except that an orientation of the magneto-optical defect center material 720 is different in FIG. 7A than in FIG. 7B (discussed in further detail below).

Figure 8A:
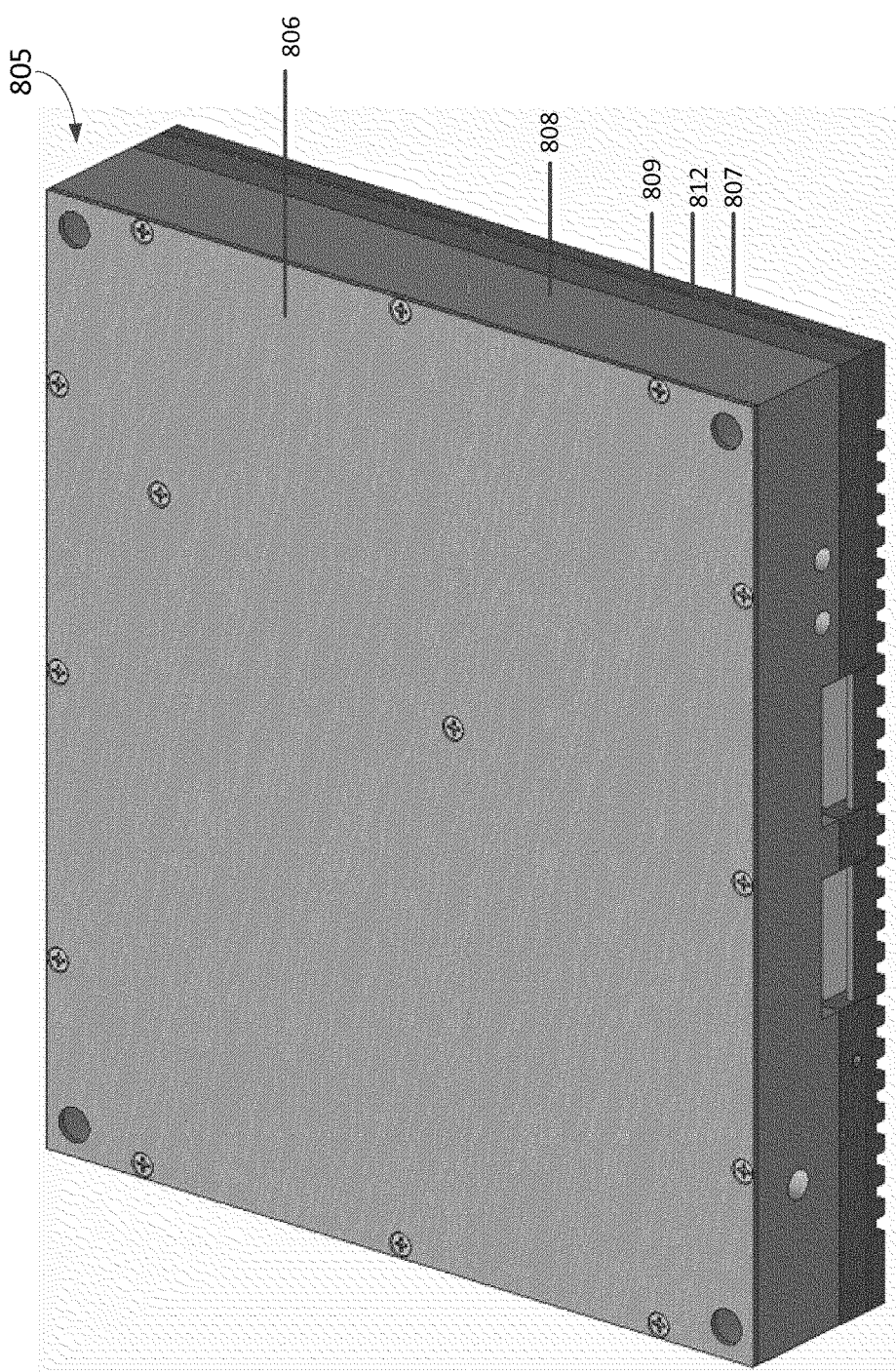
FIG. 8A illustrates a housing of the magnetic field detection system of FIG. 7A, which includes a top plate, a bottom plate, one or more side plates, a main plate and a gasket.
Figure 8B:
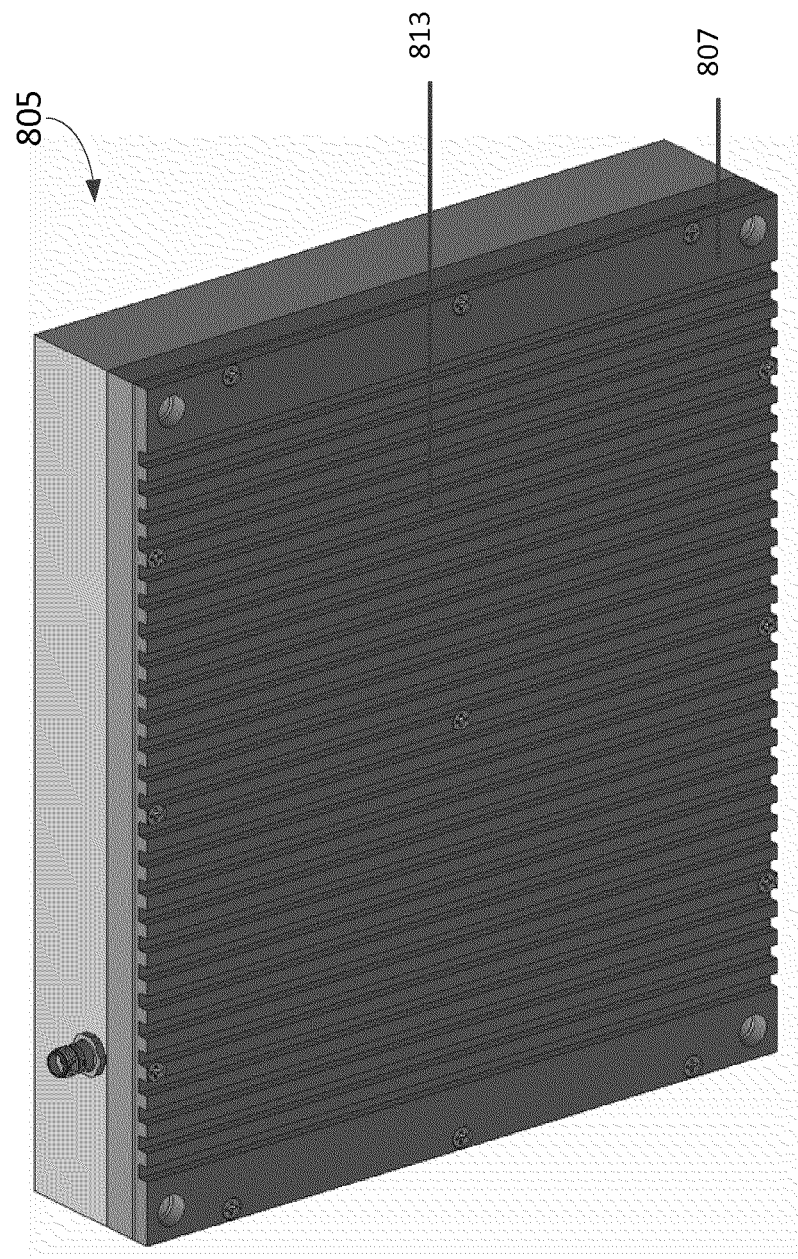
FIG. 8B illustrates a bottom view of the housing of FIG. 8A in which the bottom plate includes cooling fins.

Referring to FIGS. 8A and 8B, in some implementations, a housing 805 can include a top plate 806, a bottom plate 807, one or more side plates 808 and a main plate 809 containing the components of the system 600 therein. In some embodiments, the housing 705 may be the housing 705 of FIG. 7A. The one or more side plates 808 may be integrated into the top plate 806, the main plate 809 and/or bottom plate 807. The top plate 806, bottom plate 807, and/or main plate 809 can be secured to the one or more side plates 808 and/or the one or more side plates 808 may include one or more openings therethrough with an attachment member, such as a screw, bolt, etc., to couple the top plate 806, the bottom plate 807 and/or the main plate 809 with the one or more side plates 808. The coupling of the top plate 806, the bottom plate 807, and/or the main plate 809 to the one or more side plates 808 and/or to each other may substantially seal the magnetic detection system (e.g., the magnetic detection system 700 of FIG. 7A) to limit exposure of the components therein to external light and/or contaminants. External light may interfere with reception of light from the magneto-optical defect center material when detecting a magnetic field, thereby introducing error into the measurements. Similarly, external contaminants, such as dust, dirt, etc., may disrupt transmission of the excitation source to the magneto-optical defect center material and/or reception of light from the magneto-optical defect center material, such as dust or dirt on the optical excitation source, on one or more lenses, on the magneto-optical defect center material itself, on a light tube transmitting light from the magneto-optical defect center component to the optical detector, and/or on the optical detector itself. The top plate and/or bottom plate may include convective cooling features, such as cooling fins 813, to thermally dissipate heat transferred to the top plate 806 and/or bottom plate 807.

Figure 9B:
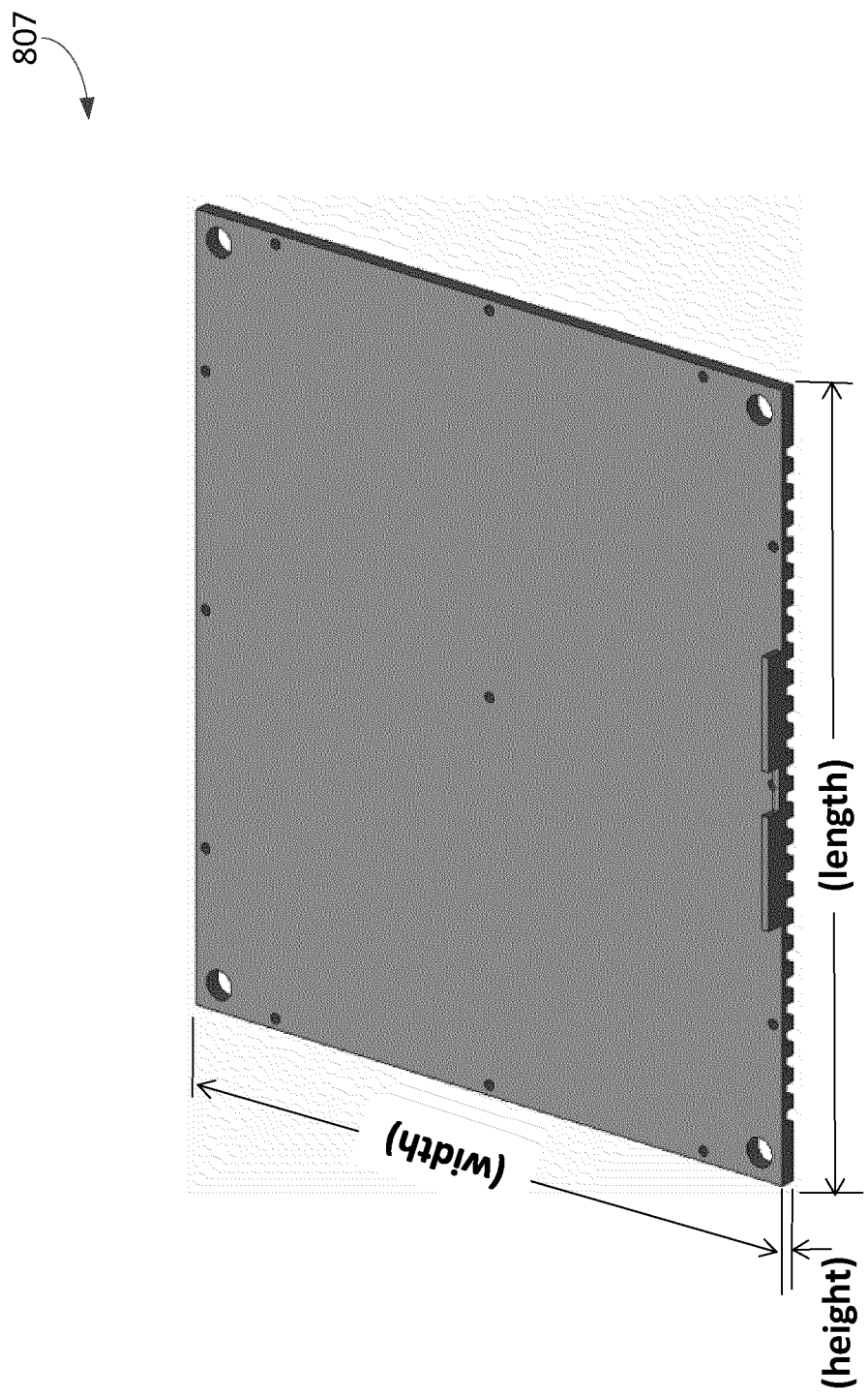
FIG. 9B illustrates the bottom plate of the housing of FIG. 8A.
Figure 9C:
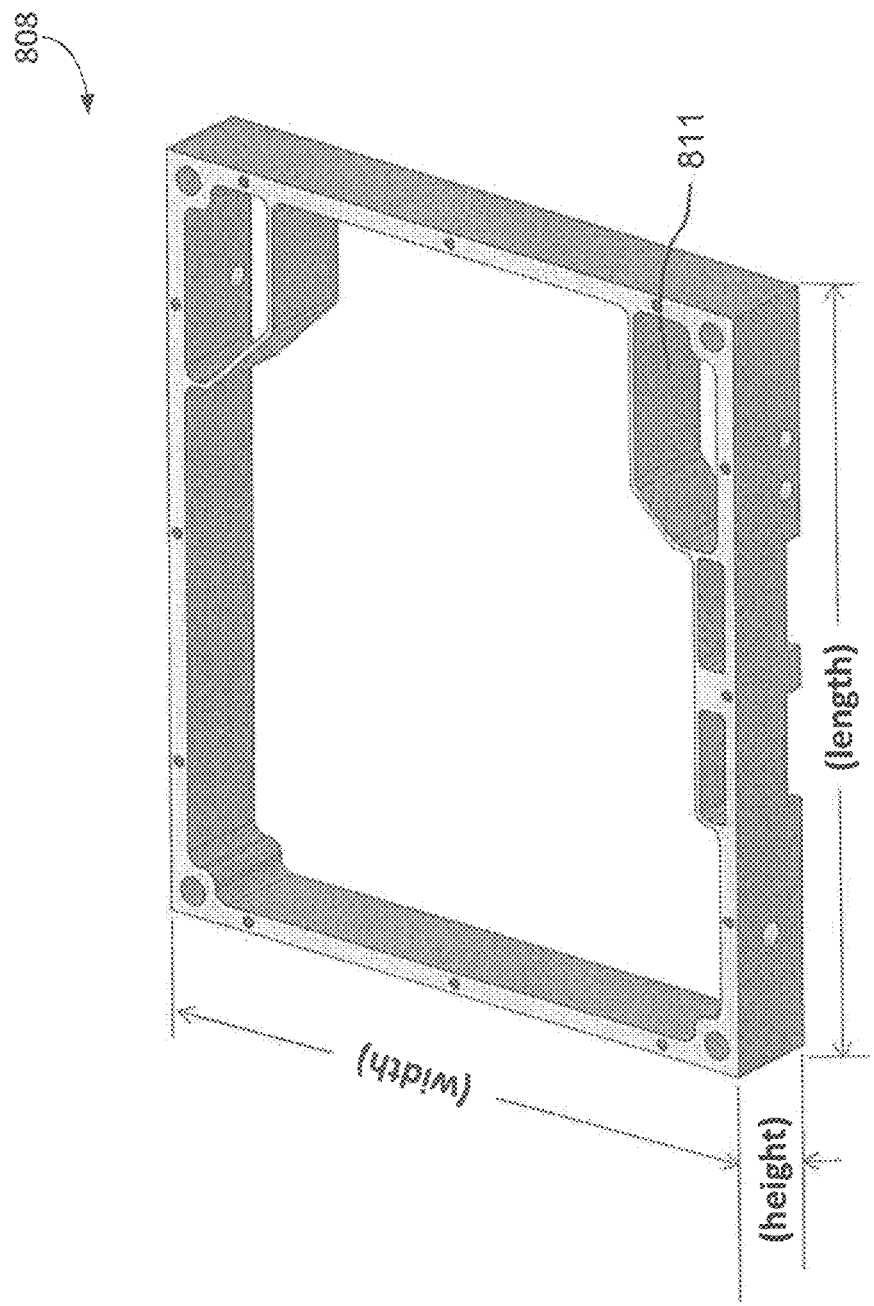
FIG. 9C illustrates the side plate of the housing of FIG. 8A.

Referring to FIG. 9A, the top plate 806 may be made from any suitable material, for example, Noryl such as Black Noryl PPO Plastic from McMaster-Carr, which is a modified PPE resin including amorphous blends of PPO polyphenylene ether (PPE) resin and polystyrene. Noryl provides high heat resistance, good electrical insulation properties, dimensional stability, low thermal conductivity, low reflection, and low density. Referring to FIG. 9B, the bottom plate 807 may be made from the same material as the top plate 806 or from a different material than the top plate 806. For example, the bottom plate 807 may be made from copper (e.g., copper per UNS C10100, full hard to half hard temper), stainless steel (e.g., 316 stainless steel), aluminum (e.g., aluminum 6061-T6 per ASTM 8209), or titanium grade 5 (e.g., Ti 6Al-4V). Referring to FIG. 9C, the side plate 808 may be made from the same material as the top plate 806 or the bottom plate 807, or a different material than the top plate 806 or the bottom plate 807. In some implementations, the side plate 808 may be made from Noryl such as Black Noryl PPO Plastic from McMaster-Carr. In other implementations, the side plate 808 may be made of metal, or a metal coated with a low reflecting paint. Referring to FIGS. 9D (top view) and 9E (bottom view), the main plate 809 may be made from the same material as the top plate 806, the bottom plate 807, or the side plate 808, or the main plate 809 can be made from a different material than the top plate 806, the bottom plate 807, or the side plate 808. For example, the main plate 809 may be made from copper (e.g., copper per UNS C10100, full hard to half hard temper), stainless steel (e.g., 316 stainless steel), aluminum (e.g., aluminum 6061-T6 per ASTM 8209), or titanium grade 5 (e.g., Ti 6Al-4V).

Referring to FIGS. 9A-9E, the top plate 806, the bottom plate 807, the side plate 808 and the main plate 809 may be any suitable shape having the same overall width and length. For example, each of the top plate 806, the bottom plate 807, the side plate 808 and the main plate 809 may be rectangular and have a width of 6.5 inches and a length of 7.5 inches. The top plate 806, the bottom plate 807, the side plate 808 and the main plate 809 may have the same thickness (i.e., height) or may vary in thickness. For example, the top plate 806 may have a thickness of 0.050 inches, the bottom plate 807 may have a thickness of 0.150 inches, the side plate 808 may have a thickness of 0.950 inches, and the main plate 809 may have a thickness of 0.325 inches. In the example illustrated in FIG. 8A, the housing components have the following ascending order in thickness: the top plate 806, the bottom plate 807, the main plate 809, and the side plate 808. The housing may have the overall dimensions of 7.5 inches× 6.5 inches×1.515 inches (length×width×height). These dimensions are representative sizes that are foreseen to reduce as the technology progresses.

Referring to FIGS. 7A and 7B, in some embodiments, the components of the system 700 may be mounted on a main plate such as the main plate 809. In these embodiments, the main plate 809 includes a plurality of through holes 814 positioned to allow the location of the system components (e.g., the optical excitation source, the optical detection systems, the waveplate, the magneto-optical defect center material, the RF excitation source, the optical detector, the optical filter, the bias magnet ring mount, the bias magnet ring, the magnetic field generator, etc. of the system 700 of FIG. 7A) to be repositioned within the housing 805. As seen in FIG. 7A, components of the system 700, for example, the optical components and the magnetic components, may be directly mounted to a top surface of the main plate 809. Other components, for example, a circuit board, may be directly mounted to a bottom surface of the main plate 809. The circuit board includes circuitry, for example, circuitry that drives the optical excitation source 710, the photo diodes in the red collection 717 and the green collection 718 (described below), the RF exciter system (e.g., an RF amplifier), the thermal electric coolers 1000A, 1000B (described below), etc. By repositioning the location of the system components, it is possible to change at least one of a location or angle of incidence of the excitation light on the magneto-optical defect center material. The system components may be repeatedly mounted to, removed from, relocated, and remounted to the main plate 809. Any of the system components may be mounted in a particular set of through holes 814 with attachment members, such as screws, bolts, etc. The through holes 814 and attachment members may be threaded.

In the system 700, light from the magneto-optical defect center material 720 is directed through an optical filter to filter out light in the excitation band (in the green, for example), and to pass light in the red fluorescence band through a light pipe 723, which in turn is detected by the optical detector 740. A red collection 717, a green collection 718 and a beam trap 719 may be mounted to an exterior of the bias magnet ring mount 715 (i.e., the side of the bias magnet ring mount 715 that does not face the magneto-optical defect center material 720. The position of the green collection 718 and the beam trap 719 may be switched in other implementations. The red collection 717 is a system of parts that includes, for example, a photo diode, the light pipe 723, and filters that measure the red light emitted from the magneto-optical defect center material 720. The red collection 717 provides the main signal of interest, used to measure external magnetic fields. The green collection 718 is a system of parts that includes, for example, a photo diode, a light pipe, and filters that measure the green light from the excitation light that passes through the magneto-optical defect center material 720. The green collection 718 may be used in tandem with the red collection 717 to remove common mode noise in the detection signal, and therefore, increase device sensitivity. The green beam 719 is configured to capture any portion of the excitation light (e.g., a green light portion) that is not absorbed by the magneto-optical defect center material 720 to ensure that the excitation light does not bounce around and add noise to the measurement. This noise could result from the excitation light bouncing off other components of the system 700 and hitting the magneto-optical defect center material 720 at a later time, where the excitation light would be absorbed and contaminate the signal. The excitation light that is not absorbed by the magneto-optical defect center material 720 might also be captured on the green or red collection photodiodes, directly adding noise to those signals.

In some implementations, one or more separation plates 711 may be provided between optical components of the system 700 and other components of the system 700, thereby physically isolating the optical components from other components (e.g., control circuitry, data analytics circuitry, signal generation circuitry, etc.). The separation plate 711 may be a ground shield to also electrically isolate the optical components from the other components. In some implementations, the separation plate 711 may also thermally isolate the optical components from the other components. In the example illustrated in FIG. 7A, the separation plate 711 is integrally formed with the side plate of the housing 705 (e.g., the separation plate 811 is integrally formed with the side plate 808 of the housing 805 of FIG. 9C). In other examples, the separation plate 711 maybe a separate piece provided within an inner perimeter of the side plate.

In some implementations, the system 700 may be hermetically sealed such as through the use of a gasket or other sealant (e.g., a gasket 812 of the housing 805 of FIG. 8A). The gasket 812 is configured to seal the top plate 806, bottom plate 807, one or more side plates 808, and main plate 809 together. The gasket 812 may be made of any suitable material, for example, Noryl such as black Noryl PPO from McMaster-Carr and/or aluminum (e.g., aluminum 6061-T6 per ASTM B209). In one example, the gasket 812 may have the following dimensions: 6.5 inches×7.5 inches× 0.040 inches. In implementations in which the housing includes a separation plate, the gasket 812 provided may include an internal contour corresponding to the location of the separator plate 811.

Figure 10:
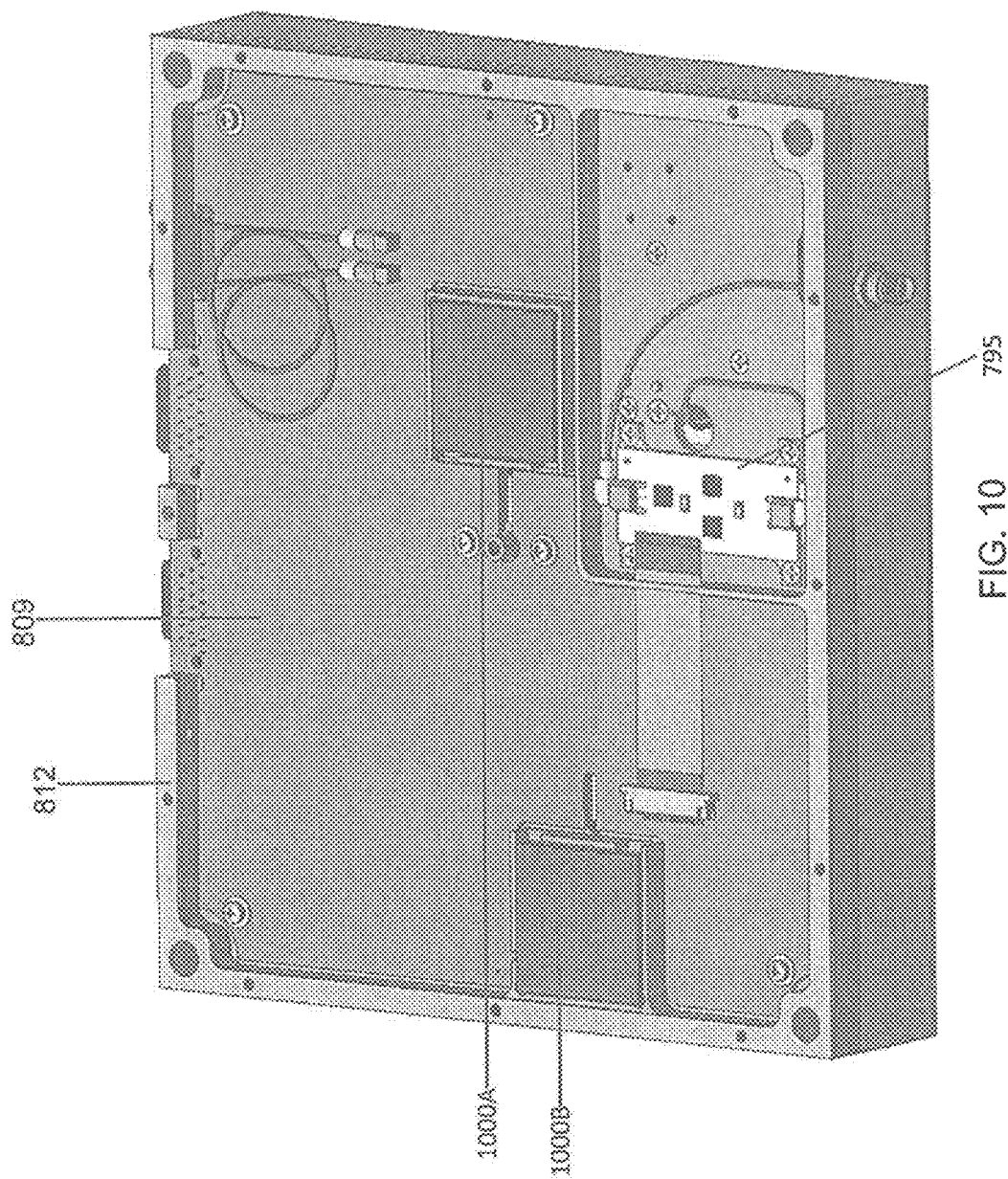
FIG. 10 illustrates components fixed to a bottom side of the main plate of the housing of FIG. 8A. The components are provided between the bottom side of the main plate and a top side of the bottom plate.

Referring to FIG. 10, which illustrates components fixed to a bottom side of the main plate 809, the system 700 may further include one or more thermal electric coolers (TECs) configured to move heat from the main plate 809. In the example of FIG. 10, two thermal electric coolers 1000A and 1000B are illustrated, but in other implementations, any number of thermal electric coolers may be used (for example, one, three, four, five, ten, etc.). A controller such as the controller 680 of FIGS. 6A-6C or separate controller (e.g., a proportional-integral-derivative (PID) controller) controls the thermal electric coolers 1000A and 1000B to maintain a predetermined temperature of the main plate 809. This, in turn, controls a temperature of the components of the system 700 (e.g., the laser diode of the optical excitation system 710) and keeps the temperature stable. If the temperature of the components of the system 700 (e.g., the laser diode of the optical excitation system 710) is not stable, the sensitivity of the system 700 is lowered.

The system 700 further includes an RF exciter system 730 that will be discussed in further detail below. The RF exciter system 730 may include an RF amplifier assembly 795. The RF amplifier assembly 795 includes the RF circuitry that amplifies the signal from the RF source to a desired power level needed in the RF excitation element.

In implementations in which the system 700 is hermetically sealed, a hydrogen absorber (not illustrated) and/or nitrogen cooling system (not illustrated) may be used. The hydrogen absorber can be positioned within a magnetic detection system such as the system 700 of FIG. 7A to absorb hydrogen released from components therein that results from hydrogen trapped in materials used to make the components (e.g., metals, thermoplastics, etc.). The hydrogen absorber or hydrogen getter may be, for example, Cookson Group's STAYDRY® H2-3000 Hydrogen and Moisture Getter, which employs an active hydrogen getter and desiccant for water absorption, dispersed in a flexible silicone polymer matrix. The hydrogen absorber material may be a film or a sheet that can be molded or stamped to a desired shape. In other implementations, other commercially available hydrogen absorbers or hydrogen getters may be used.

The nitrogen cooling system can be implemented in a magnetic detection system such as the system 700 of FIG. 7A to cool or otherwise reduce thermal loading on components therein, such as the optical excitation source 710, the magneto-optical defect center material 720, control circuitry, etc, and/or to prevent condensation. The nitrogen cooling system may include a nitrogen source, a pressure regulator valve, and a controller configured to control a flow rate of nitrogen from the nitrogen source to the system 700. The nitrogen source may be, for example, a nitrogen air tank or a system capable of extracting nitrogen from air. In some implementations, the nitrogen cooling system may be in thermal communication (e.g., conductive) with the housing, for example the top plate 806 and/or bottom plate 807 of FIGS. 9A and 9B having the convective cooling features 813. Accordingly, the nitrogen cooling system can form a heat transfer system to remove heat from one or more components within the system 700 to be convectively dissipated to atmosphere via the convective cooling features. As seen in FIG. 10, the various cables (e.g., the green and red collection cables, the RF cables, etc.) are provided between the bottom side of the main plate 809 and the bottom plate 807 such that all of the components of the system 700 are located within the housing 705 (e.g., the 805 of FIG. 8A).

Readout Optical Light Source and Reset Optical Light Source

Figure 11A:
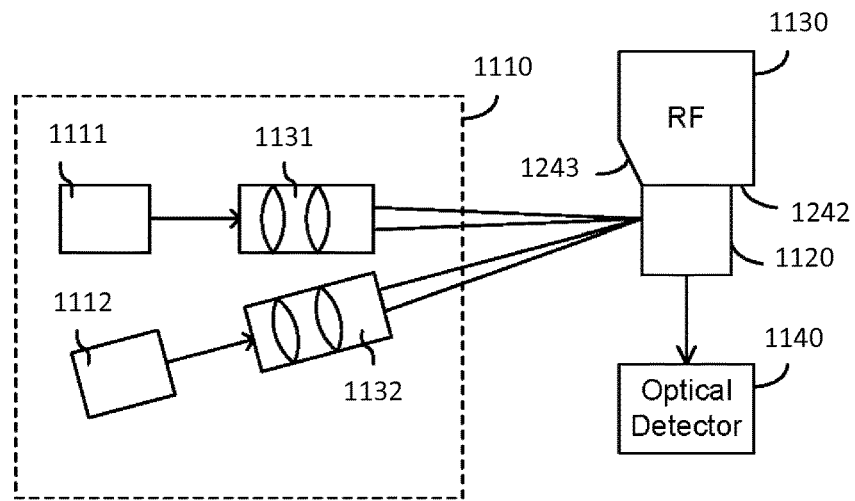
FIG. 11A is a schematic diagram illustrating some embodiments of a portion of a magnetic field detection system.

FIG. 11A is a schematic diagram of a portion 1100 of a magnetic detection system according to some embodiments. In some embodiments, the portion 1100 may be part of the magnetic detection system 700 of FIG. 7A. The portion 1100 includes an optical excitation source 1110, a magneto-optical defect center material 1120, an RF excitation system 1130, and an optical detector 1140. In some embodiments, the optical excitation source 1110, the magneto-optical defect center material 1120, the RF excitation system 1130, and the optical detector 1140 correspond to the optical excitation source 710, the magneto-optical defect center material 720, the RF excitation system 730, and the optical detector 740, respectively, of the system 700 of FIG. 7A.

The optical excitation source 1110 may include a readout optical light source 1111 and reset optical light source 1112. The readout optical light source 1111 may be a laser or a light emitting diode, for example, which emits light in the green which may be focused to the magneto-optical defect center material 1120 via focusing optics 1131. The readout optical light source 1111 induces fluorescence in the red from the magneto-optical defect center material 1120, where the fluorescence corresponds to an electronic transition of the NV electron pair from the excited state to the ground state. Referring back to FIGS. 3A and 3B, light from the magneto-optical defect center material (NV diamond material) 320 is directed through the optical filter 350 to filter out light in the excitation band (in the green, for example), and to pass light in the red fluorescence band, which in turn is detected by the optical detector 340. The readout optical light source 1111 induces fluorescence which is then detected by the optical detector 1140, i.e., the fluorescence induced by the readout optical light source 1111 is read out.

The reset optical light source 1112 may provide light which is focused to the magneto-optical defect center material 1120 via focusing optics 1132. The reset optical light source 1112 of the optical excitation source 1110 serves to reset the population of the $m_s=0$ spin state of the ground state $^3A_2$ to a maximum polarization, or other desired polarization. In general, it may be desired in a reset stage to reset the spin population to the desired spin state relatively quickly to reduce the reset time, and thus to increase sensor bandwidth. In this case the reset optical light source 1112 provides light of a relatively high power. Further, the reset optical light source 1112 may have a lower duty cycle than readout optical light source 1111, thus providing reduced heating of the system.

On the other hand, a relatively lower power may be desired for the readout optical light source 1111 to provide a higher accuracy readout. The relatively lower power readout optical light source 1111 beneficially allows for easier control of the spectral purity, a slower readout time with lower noise, reduced laser heating, and may be light weight and compact. Thus, the reset optical light source 1112 may provide light of a higher power than that of the readout optical light source 1111. The readout optical light source 1111 does provide some amount of a reset function. However, a lower powered light source takes longer to provide a reset and thus is tolerable.

The readout optical light source 1111 may be a laser or an LED, for example, while the reset optical light source 1112 may a laser, or an LED. Exemplary arrangements are as follows. The readout optical light source 1111 may be a lower powered laser, and the reset optical light source 1112 may be a higher powered laser with a lower duty cycle. The readout optical light source 1111 may be a lower powered laser, and the reset optical light source 1112 may be a bank of LED flash-bulbs. The readout optical light source 1111 may be an LED, and the reset optical light source 1112 may be a bank of LED flash-bulbs.

RF Excitation Source and NV Diamond Material

Figure 11B:
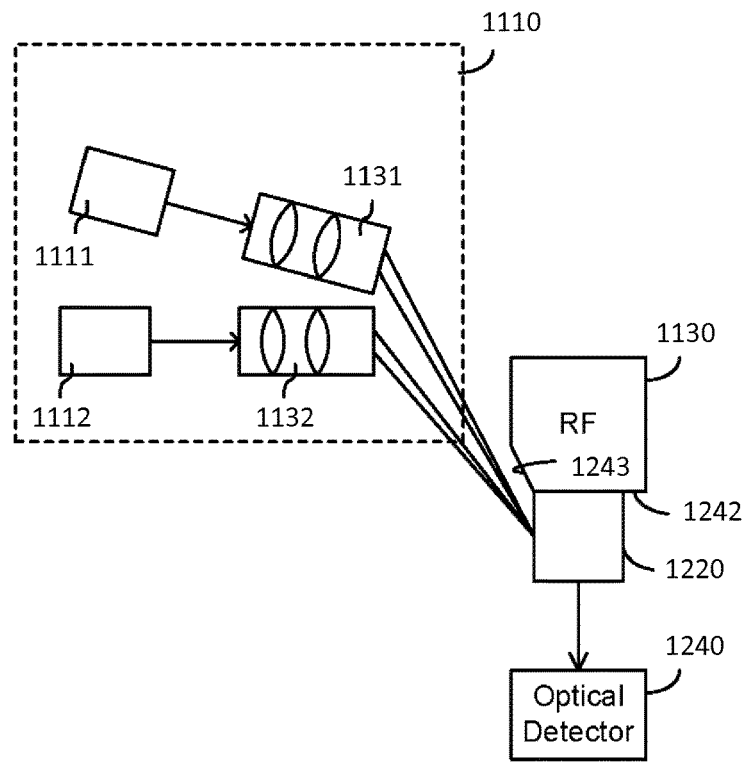
FIG. 11B is a schematic diagram illustrating some embodiments of a portion of a magnetic field detection system with a different arrangement of the light sources than in FIG. 11A.
Figure 12:
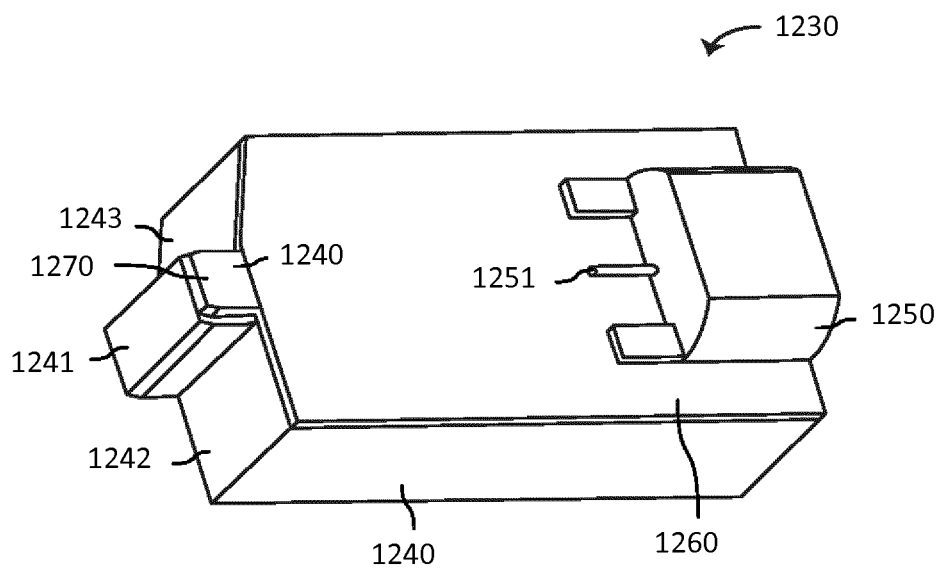
FIG. 12 illustrates some embodiments of an RF excitation source of a magnetic field detection system.

FIG. 12 illustrates some embodiments of a RF excitation source 1230 with the magneto-optical defect center material 1220 with NV centers. In some embodiments, the RF excitation source 1230 and the magneto-optical defect center material 1220 may correspond to the RF excitation source 1130 and the magneto-optical defect center material 1120, respectively, of FIGS. 11A and 11B. The RF excitation source 1230 includes a block portion 1240, RF feed connector 1250 with output 1251, and circuit board 1260. The RF feed connector 1250 may be electronically connected to a controller such as the controller 680 of FIGS. 6A-6C, via a cable, for example, where the controller 680 provides an RF signal whereby the controller 680 may provide an RF signal to the RF feed connector 1250.

The block portion 1240 may include a support portion 1241, which supports the magneto-optical defect center material 1220. The block portion 1240 may further include a first wall portion 1242 and a second wall portion 1243 adjacent the support portion 1241. The first wall portion 1242 is on one side of the support portion 1241, while the second wall portion 1243 is on another side of the support portion 1241 opposite to the first side. The face of the second wall portion 1243 is slanted with respect to the first wall portion 1242, and thus the second wall portion 1243 makes an angle θ with respect to the first wall portion 1242.

FIG. 11B shows some embodiments of a portion of a magnetic field detection system with a different arrangement of the light sources than in FIG. 11A. In the embodiments in which the RF excitation source 1230 and the magneto-optical defect center material 1220 correspond to the RF excitation source 1130 and the magneto-optical defect center material 1120 of FIGS. 11A and 11B, respectively, the slanted second wall portion 1243 allows both the light emitted by the readout optical light source 1111 and the light emitted by the reset optical light source 1112 (see FIGS. 7A and 7B) to be directed at a proper angle to the magneto-optical defect center material 1120, 1220 with NV centers over a variety of arrangements of the readout optical light source 1111 and the reset optical light source 1112. In particular, the slanted second wall portion 1243 allows the readout optical light source 1111 and the reset optical light source 1112 to be positioned relatively close to each other, over a variety of arrangements of the readout optical light source 1111 and the reset optical light source 1112, while directing light to the same portion of the NV magneto-optical defect center material 1120, 1220 with NV centers.

In the arrangement of FIG. 11A, the readout optical light source 1111 and the reset optical light source 1112 direct light on one side of the first wall portion 1242, while in FIG. 11B the readout optical light source 1111 and the reset optical light source 1112 direct light on another side of the of the first wall portion 1242. The face of the second wall portion 1243 is slanted with respect to the first wall portion 1242 to allow either of the arrangements of the plurality of the readout optical light source 1111 and the reset optical light source 1112 in FIG. 11A or 11B to direct light to the magneto-optical defect center material 1120 with NV centers without blocking the light.

The block portion 1240 may comprise an electrically and thermally conductive material. For example, the block portion 1240 may be formed of a metal such as copper or aluminum. The good thermal conductivity of the block portion 1240 allows the block portion to function as a heat sink drawing heat away from the magneto-optical defect center material 1220 with NV centers. The electrically conductive nature of the block portion 1240 allows that a metallic material 1270 provided on the magneto-optical defect center material 1220 with NV centers may electrically short with the block portion 1240.

Figure 13:
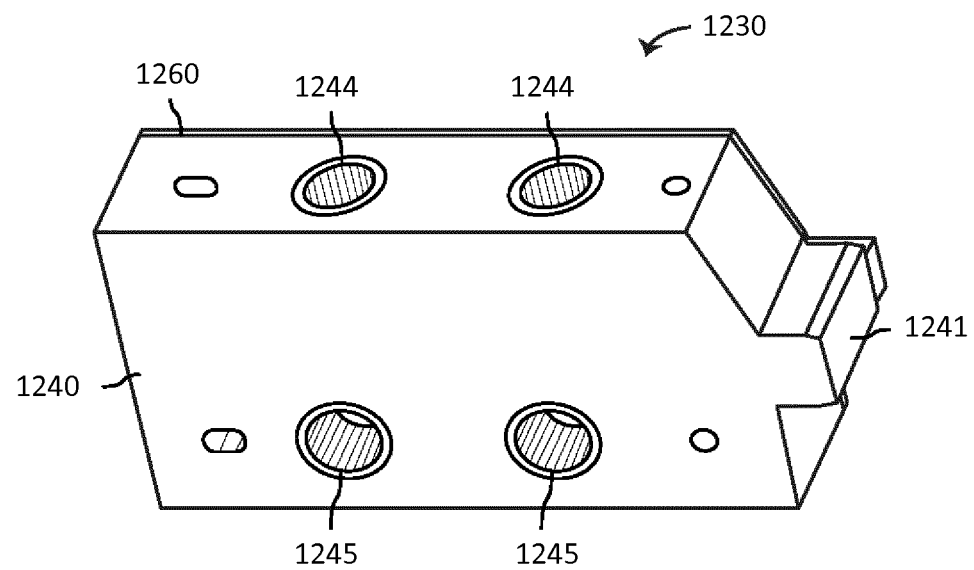
FIG. 13 illustrates some embodiments of an RF excitation source oriented on its side.

FIG. 13 illustrates the RF excitation source 1230 with the magneto-optical defect center material 1220 of FIG. 12 oriented on its side. The block portion 1240 has both side holes 1244 and bottom holes 1245. The side holes 1244 allow for mounting the block portion 1240 on its side for edge injection of light into the magneto-optical defect center material 1220. The bottom holes 1245 allow for mounting the block portion 1240 on its bottom for side injection of light. Other orientations for the block portion 1240 are possible.

Figure 14:
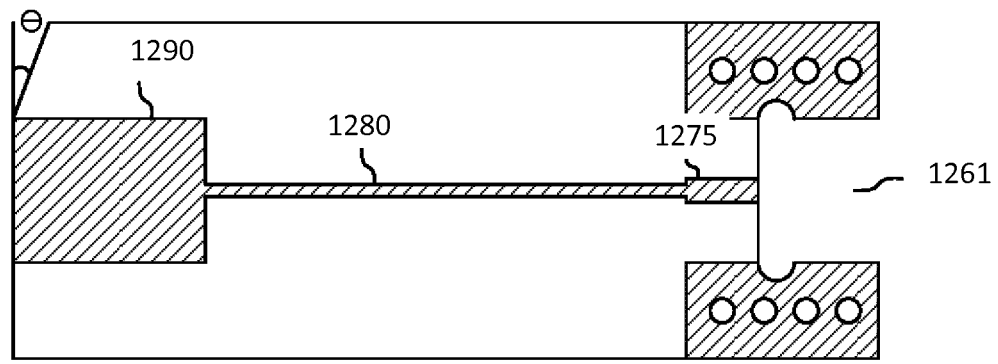
FIG. 14 illustrates some embodiments of a circuit board of an RF excitation source.

FIG. 14 illustrates a top view of the circuit board 1260 of FIG. 12 in more detail with conductive traces shown. The circuit board 1260 includes a notch 1261 within which the RF feed connector 1250 is positioned. The circuit board 1260 may include an insulating board with conductive traces thereon. The output 1251 of the RF feed connector 1250 is electrically connected to a RF connector output trace 1275, which in turn is connected to a first trace 1280, which in turn is electrically connected to a second trace 1290. The traces 1275, 1280, and 1290 may be conducting metals, for example, such as copper or aluminum.

Figure 15A:
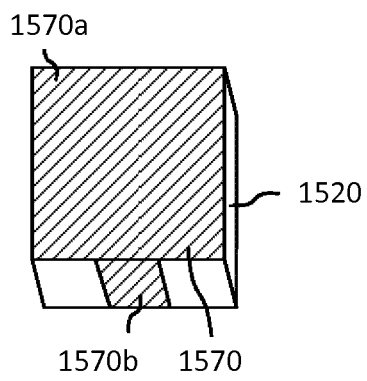
FIG. 15A illustrates some embodiments of a diamond material coated with a metallic material from a top perspective view.
Figure 15B:
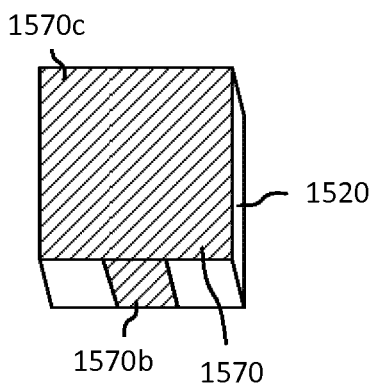
FIG. 15B illustrates some embodiments of a diamond material coated with a metallic material from a bottom perspective view.

FIG. 15A illustrates a magneto-optical defect center material 1520 coated with a metallic material 1570 from a top perspective view. FIG. 15B illustrates the magneto-optical defect center material 1520 coated with a metallic material 1570 from a bottom perspective view. In some embodiments, the magneto-optical defect center material 1520 of FIGS. 15A and 15B corresponds to the magneto-optical defect center material 1120 of FIGS. 11A and 11B or the magneto-optical defect center material 1220 of FIG. 12. The metallic material 1570 may be gold, copper, silver, or aluminum, for example. The metallic material 1570 has a top 1570*a*, bottom 1570*c*, and a side portion 1570*b* connecting the top 1570*a* and bottom 1570*c*, and is designed to electrically short to the underlying block portion (e.g., the underlying block portion 1240 of FIG. 12) via the metallic material on the side portion, where the block portion 1240 functions as a RF ground. The second trace 1290 (see FIG. 14) is electrically connected to the metallic material 1570 on the magneto-optical defect center material 1220, 1520 with NV centers. As mentioned above, the electrically conductive nature of the block portion 1240 allows that the metallic material 1270 provided on the magneto-optical defect center material 1220 with NV centers may electrically short with the block portion 1240. In this regard, the second trace 1290 is electrically connected to the metallic material 1270, 1570, and the RF feed connector 1250 is driven by an RF signal, where the signal propagates along the traces 1275, 1280 and 1290. The second trace 1290 may have a width corresponding to the width of the magneto-optical defect center material 1220, 1520 with NV centers, and may be electrically connected to the metallic material 1270, 1570 along the width of the second trace 1290. The second trace 1290 may be electrically connected to the metallic material 1570 by a ribbon bond, for example.

Because the magneto-optical defect center material 1220, 1520 with NV centers is coated with a metallic material 1570, where the metallic material 1570 functions to provide an RF excitation to the magneto-optical defect center material 1220, 1520 with NV centers, a highly efficient RF excitation to the diamond material is possible.

Standing-Wave RF Exciter

Referring to FIGS. 6A-6C the RF excitation source 630 provides RF radiation to the magneto-optical defect center material (NV diamond material) 620. The system 600 may include a magnetic field generator 670 which generates a magnetic field, which may be detected at the magneto-optical defect center material 620, or the magnetic field generator 670 may be external to the system 600. The magnetic field generator 670 may provide a biasing magnetic field.

Figure 16:
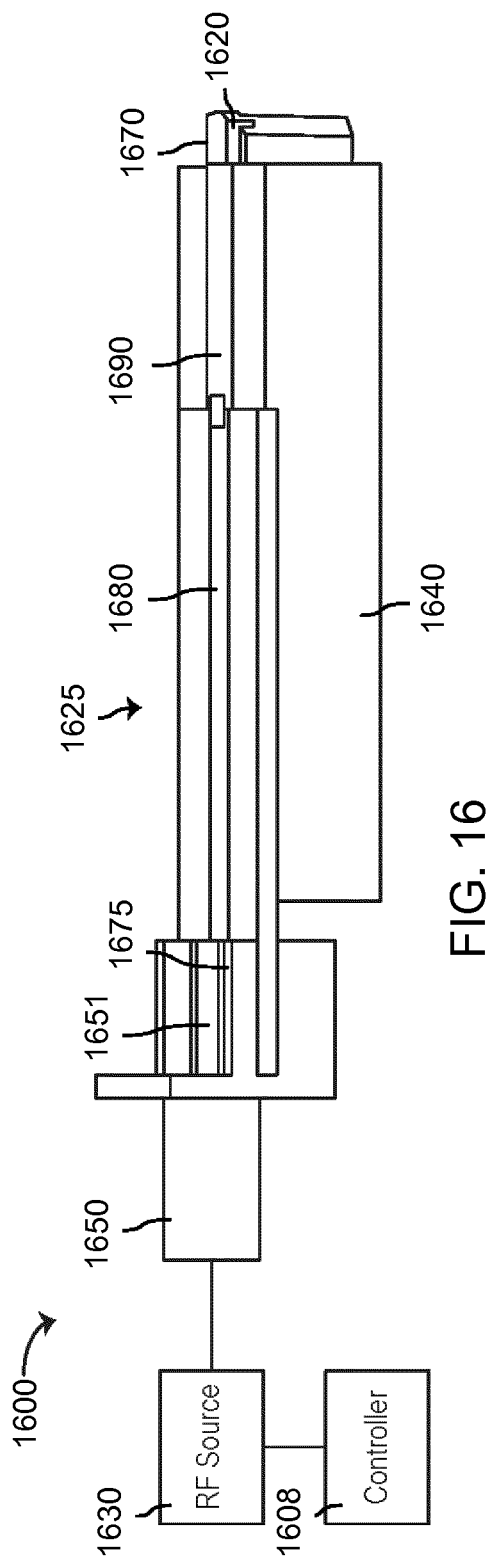
FIG. 16 illustrates some embodiments of a standing-wave RF exciter system.

FIG. 16 illustrates a standing-wave RF exciter system 1600 (i.e., RF excitation source 330) according to some embodiments. In some embodiments, the RF exciter system 1600 corresponds to the RF excitation source 1230 of FIG. 12 and may be utilized in the system 700 of FIG. 7A. The system 1600 includes a controller 1608 and an RF exciter circuit 1625. The RF exciter circuit 1625 includes an RF feed connector 1650 with an RF feed connector output 1651, and a conducting trace including a RF connector output trace 1675, a first trace 1680 and a second trace 1690. In some embodiments, the RF feed connector 1650, the RF feed connector output 1651, the RF connector output trace 1675, the first trace 1680 and the second trace 1690 correspond to the RF feed connector 1250, the RF feed connector output 1251, the RF connector output trace 1275, the first trace 1280 and the second trace 1290, respectively, of FIG. 12. The RF feed connector output 1651 of the RF feed connector 1650 is electrically connected to the RF connector output trace 1675. The RF connector output trace 1675 in turn is electrically connected to the first trace 1680, which in turn is electrically connected to second trace 1690. The first trace 1680 has an impedance which matches that of the system circuit impedance, for example, if the system circuit impedance is 50Ω, which is typical, the first trace 1680 should have an impedance of 50Ω.

The second trace 1690 has a width where the impedance of the second trace 1690 is lower than that of the first trace 1680. The second trace 1690 is electrically connected to a metallic material 1670 on a magneto-optical defect center material 1620. The metallic material 1670 is formed on a top, a bottom, and a side portion connecting the metal on the top and bottom, of the magneto-optical defect center material 1620, and is designed to electrically short to the underlying block portion 1640, which functions as a RF ground.

The controller 1608 is programmed or otherwise configured to control an RF excitation source 1630 so as to apply an RF signal to the RF feed connector output 1651. The controller 1608 may cause the RF excitation source 1630 to apply an RF signal to the RF feed connector 1650 which is then applied to the traces 1675, 1680, and 1690, which are short-circuited to the block portion 1640 via the metallic material 1670 on the magneto-optical defect center material 1620.

The controller 1608 may control the RF excitation source 1630 so as apply an RF signal to RF feed connector 1650 such that a standing wave is produced within the magneto-optical defect center material 1620. In this regard, the controller 1608 may include or control the RF excitation source 1630, which may comprise an external or internal oscillator circuit, for example. The signal may be a modulated sinusoidal with a RF carrier frequency, for example. The second trace 1690 has a width where the impedance of the second trace 1690 is lower relative to that of the first trace 1680. For example, if the impedance of the first trace 1680 is about 50Ω, then the impedance of the second trace 1690 may be less than 10Ω, for example. The low impedance of the second trace 1690 provides a relatively high RF field which is applied to the magneto-optical defect center material 1620.

The second trace 1690 may have a relatively wide width, such as for example greater than 2 mm, so that the second trace 1690 has a relatively low impedance. The traces 1680 and 1690, along with the metallic material 1670 on the magneto-optical defect center material 1620, act as a microstrip line. The relatively wide second trace 1690 along with the metallic material 1670 which is coated on the magneto-optical defect center material 1620 beneficially provides for a small field gradient of the RF field applied to the NV diamond material 620. The good RF field uniformity is due in part to the arranged microstrip line.

The metallic material 1670 on the magneto-optical defect center material 1620 is located at the end, and is part of, the microstrip line, which also comprises the traces 1680 and 1690. The short circuiting of the metallic material 1670 to the block portion 1640 provides current and thus an applied field maxima at the diamond. The standing wave field which is applied results in doubling the RF field applied to the magneto-optical defect center material 1620. This means a 4-times decrease in the power needed to maintain a particular RF field.

Thus, providing a standing wave application of the RF field to the magneto-optical defect center material 1620 using a microstrip line short circuit at the magneto-optical defect center material 1620 provided with the metallic material 1670 covering the magneto-optical defect center material 1620 provides a power reduction needed to maintain the RF field intensity in the magneto-optical defect center material 1620, and a low RF field gradient in the magneto-optical defect center material 1620.

The magnitude of the RF field applied at the magneto-optical defect center material 1620 will also depend on the length of the microstrip line, which includes traces 1680 and 1690, along with the metallic material 1670 on the magneto-optical defect center material 1620. In an ideal case a length of the microstrip line of a quarter wavelength of the RF carrier frequency will produce the maximum current, and thus the maximum RF field applied to the magneto-optical defect center material 1620. Incorporating the diamond to the system, however, affects the nature of the standing wave, resulting in a different optimal length than a quarter wavelength. This length can be found computationally, and is generally shorter than a quarter wavelength. Thus, the length of the microstrip lines is about a quarter wavelength and is set to provide a maximum magnitude of the RF applied field applied to the magneto-optical defect center material 1620.

FIGS. 17A and 17B are circuit diagrams illustrating RF exciter systems including the RF exciter circuit 1625 according to some embodiments having a non-reciprocal isolation arrangement and a balanced amplifier arrangement, respectively.

Except for small ohmic and radiative losses in the exciter, all of the power incident to the microstrip line will be reflected back from the short to an RF amplifier of the system. To avoid this back reflection, the systems 1700A and 1700B in FIGS. 17A and 17B, respectively, include an RF termination component. The RF termination component may be, for example, a non-reciprocal isolator device as in FIG. 17A, or a balanced amplifier configuration as in FIG. 17B. If the non-reciprocal isolator device has magnetic materials, a balanced amplifier is preferred to avoid interference due to the magnetic fields.

FIG. 17A includes, in addition to RF exciter circuit 1725, controller 1708 and RF excitation source 1730 of the FIG. 16 system (e.g., the RF exciter circuit 1625, controller 1608 and RF excitation source 1630 of the FIG. 16 system), an amplifier 1710 and a RF isolator 1720. The RF signal from the RF excitation source 1630 is amplified by the amplifier 1710, and the amplified signal is input to the RF isolator 1720, which provides an RF termination function, and is then output to the RF exciter circuit 1625.

The balanced amplifier arrangement of FIG. 17B includes, in addition to RF exciter circuit 1725, controller 1708 and RF excitation source 1730 of the FIG. 16 system (e.g., the RF exciter circuit 1625, controller 1608 and RF excitation source 1630 of the FIG. 16 system), a first quadrature component 1735 arranged before two amplifiers 1740 and 1745, followed by a second quadrature component 1750 arranged after the two amplifiers 1740 and 1745. The RF signal from the RF excitation source 1730 is input to the first quadrature component 1735, and then quadrature result is input to the two amplifiers 1740 and 1745. The amplified signal from the two amplifiers 1740 and 1745 is then output to the second quadrature component 1750, and the quadrature result is input to the RF exciter circuit 1725.

Figure 18A:
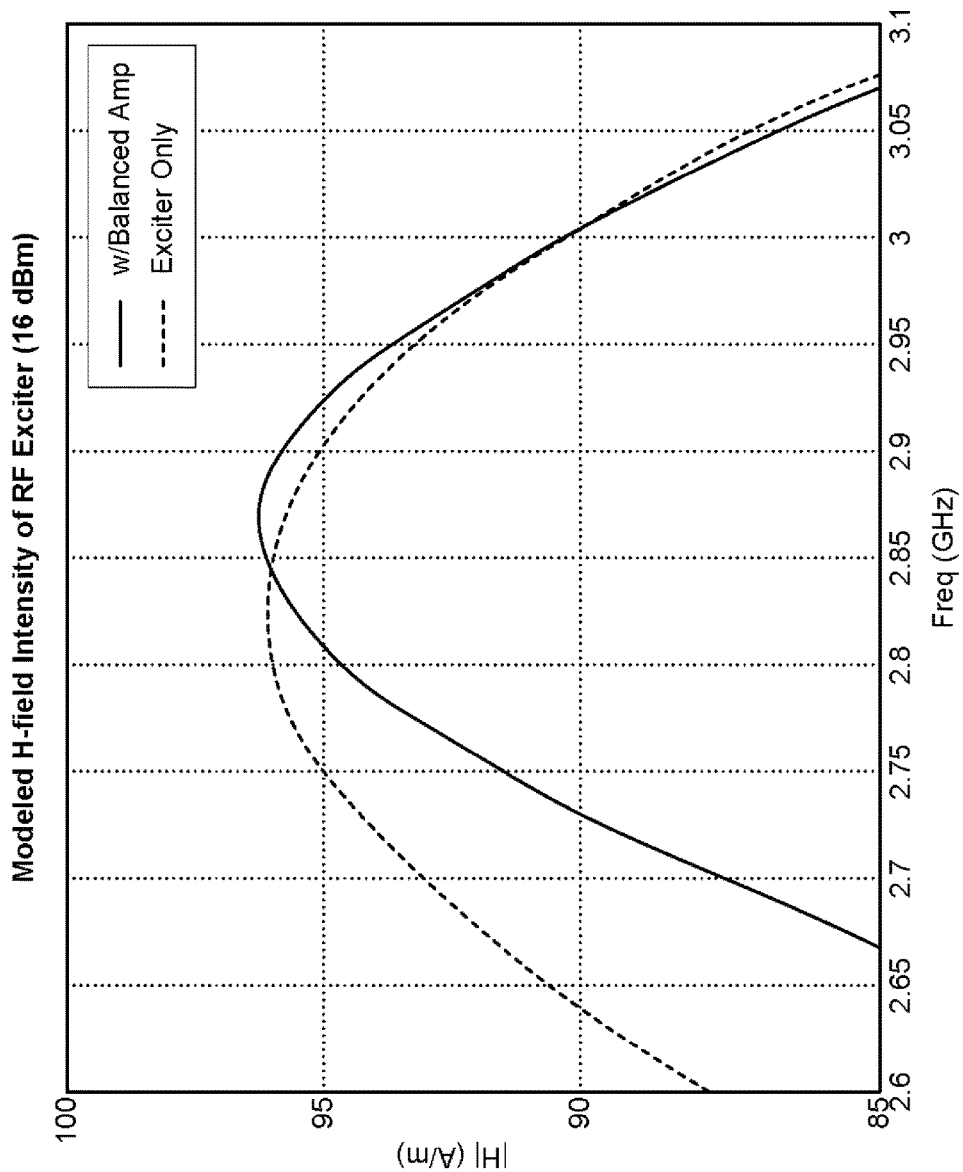
FIG. 18A is a graph illustrating an applied RF field as a function of frequency for a prior exciter.
Figure 18B:
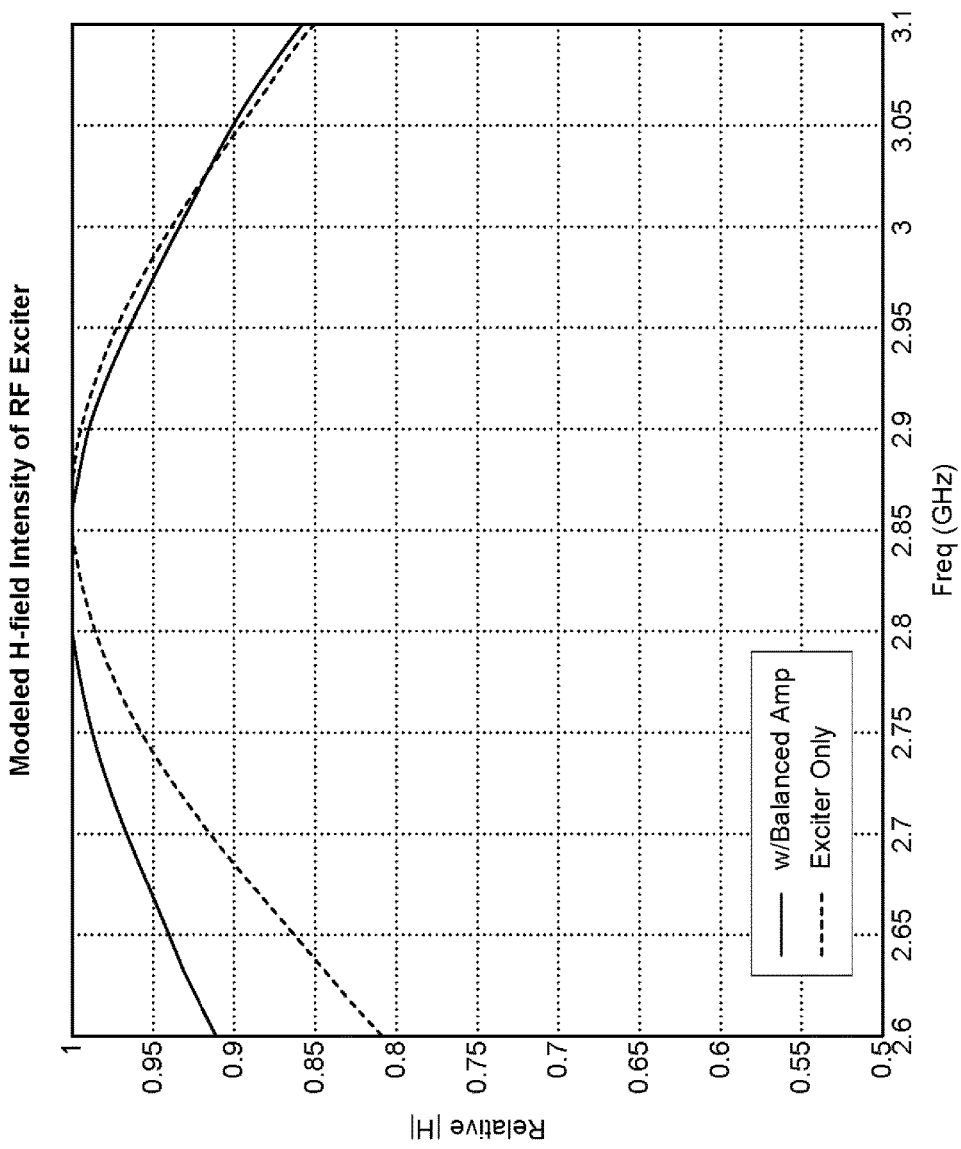
FIG. 18B is a graph illustrating an applied RF field as a function of frequency for some embodiments of an exciter.

FIGS. 18A and 18B illustrate the estimated applied field for, respectively, a prior RF exciter, and an RF exciter with a short circuited microstrip line with a standing wave applied field at the diamond. The prior RF exciter for FIG. 18A employed a 16 W RF power amplifier running at saturation. The RF exciter with a short circuited microstrip line with a standing wave applied field employed a 300 mW low noise amplifier (LNA) running in the linear regime (40 mW in) to produce an equivalent applied field. FIGS. 18A and 18B illustrate the applied field both with and without a balanced amplifier in the circuit. As can be seen, for the RF exciter with a short circuited microstrip line with a standing wave applied field in FIG. 18B the applied field (Relative |H|) as a function of frequency over the frequency range of 2.6 to 3.1 GHz shows a flat frequency response in particular with an addition of a balanced amplifier. The frequency response shown in FIG. 18B is an improvement over that in FIG. 18A.

The RF exciter with a short circuited microstrip line with a standing wave applied field at the diamond described above, provides a number of advantages. The field intensity applied to the diamond for a given incident RF power is maximized. The RF exciter provides both a small field gradient and a flat frequency response. Further setting the microstrip line of the RF exciter to have a length of about a quarter wavelength produces maximum current, and thus maximum applied field.

Precision Adjustability of Optical Components

Figure 19:
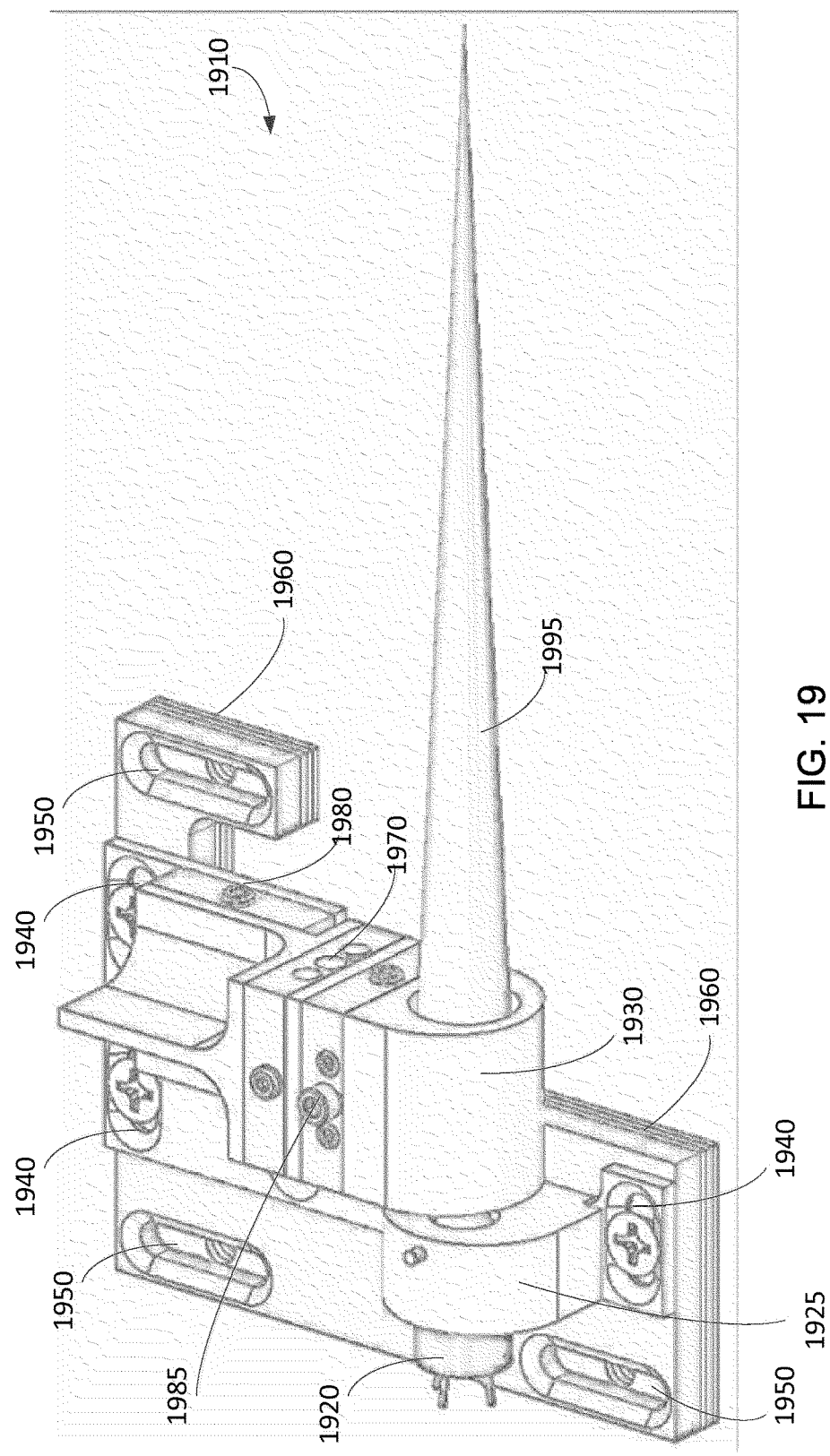
FIG. 19 illustrates an optical light source with adjustable spacing features in accordance with some illustrative embodiments.

FIG. 19 illustrates an optical light source 1910 (i.e., an optical excitation assembly) with adjustable spacing features in accordance with some illustrative embodiments. The optical light source 1910 may be, for example, one of the light sources in the optical excitation source 710 of FIG. 7A. The optical light source 1910 may be, for example, the readout optical light source 1111 and reset optical light source 1112. The optical light source 1910 includes, in brief, an optical excitation module 1920 (e.g., a laser diode), an optical excitation module mount 1925, a lens mount 1930, one or more X axis translation slots 1940, one or more y axis translation slots 1950, Z axis translation material 1960 (e.g., shims), an X axis lens translation mechanism 1970, and a Y axis lens translation mechanism 1980. In addition, FIG. 19 comprises an illustration of a representation of a light beam 1995.

Still referring to FIG. 19 and in further detail, the optical light source 1910 comprises an optical excitation module 1920. In some implementations, the optical excitation module 1920 is a directed light source. In some implementations, the optical excitation module 1920 is a light emitting diode. In some implementations, the optical excitation module 1920 is a laser diode. In some implementations, the optical light source 1910 comprises an optical excitation module mount 1925 that is configured to fasten the optical excitation module 1920 in position relative to the rest of the optical light source 1910.

In some implementations, the optical light source 1910 further comprises a lens mount 1930. In some implementations, the lens mount 1930 is configured to fasten a plurality of lenses in position relative to each respective lens as well as configured to fasten a plurality of lenses in position relative to the rest of the optical light source 1910.

In some implementations, the optical light source 1910 further comprises one or more X axis translation slots 1940. The one or more X axis translation slots 1940 can be configured to allow for a positive or negative adjustment of the optical light source 1910 in a linear direction. In some implementations, the linear direction is orthogonal to a path of a light beam 1995 generated by the optical light source 1910. In some implementations, the X axis translation slots 1940 are configured to, upon adjustment, be used to fasten the optical light source 1910 to an underlying mount. In some implementations, the X axis translation slots 1940 are configured to accept a screw or other fastener that can be tightened to an underlying mount to fasten the optical light source 1910 to an underlying mount in a fixed location. In some implementations, the X axis translation slots 1940 are used to align the path of a light beam 1995 to a desired target destination.

In some implementations, the optical light source 1910 further comprises one or more Y axis translation slots 1950. The one or more Y axis translation slots 1950 can be configured to allow for a positive or negative adjustment of the optical light source 1910 in a linear direction. In some implementations, the linear direction is parallel to a path of a light beam 1995 generated by the optical light source 1910. In some implementations the linear direction is orthogonal to the linear direction of the one or more X axis translation slots 1940. In some implementations, the Y axis translation slots 1950 are configured to, upon adjustment, be used to fasten the optical light source 1910 to an underlying mount. In some implementations, the Y axis translation slots 1950 are configured to accept a screw or other fastener that can be tightened to an underlying mount to fasten the optical light source 1910 to an underlying mount in a fixed location. In some implementations, the Y axis translation slots 1950 are used to adjust the distance of the path of a light beam 1995 from a desired target destination.

In some implementations, the optical light source 1910 further comprises Z axis translation material 1960. In some implementations, the Z axis translation material 1960 comprises one or more shims. In some implementations the Z axis translation material 1960 can be added to or removed from the optical light source 610 for a positive or negative adjustment of the optical light source 1910 in a linear direction relative to an underlying mount to which the optical light source 1910 is fastened. In some implementations, the linear direction is orthogonal to two or more of the linear direction of the one or more X axis translation slots 1940, the linear direction of the one or more Y axis translation slots 1950, and/or the path of a light beam 1995 generated by the optical light source 1910. In some implementations the linear direction is orthogonal to the linear direction of the one or more X axis translation slots 1940. In some implementations, the Z axis translation material 1960 is configured to, upon adjustment, be used to alter a distance of the fastening of the optical light source 1910 to an underlying mount. In some implementations, the Z axis translation material 1960 is configured to accommodate the one or more X axis translation slots 1940 and/or the one or more Y axis translation slots 1950 with similar or matching slots in the Z axis translation material 1960 in order to accept a plurality of screws or other fasteners that can be tightened to an underlying mount to fasten the optical light source 1910 to the underlying mount in a fixed location. In some implementations, the Z axis translation material 1960 are used to adjust the path of a light beam 1995 to a desired target destination.

In some implementations, the optical light source 1910 further comprises an X axis lens translation mechanism 1970. The X axis lens translation mechanism 1970 can be configured to allow for a positive or negative adjustment of the one or more lenses in a lens mount 1930 in a linear direction. In some implementations, the linear direction is parallel to a path of a light beam 1995 generated by the optical light source 1910. In some implementations, the X axis lens translation mechanism 1970 is used to align a lens to a path of a light beam 1995. In some implementations, the X axis lens translation mechanism 1970 is a drive screw mechanism configured to move the one or more lenses in a lens mount 1930 in the linear direction.

In some implementations, the optical light source 1910 further comprises a Y axis lens translation mechanism 1980.

The Y axis lens translation mechanism 1980 can be configured to allow for a positive or negative adjustment of the one or more lenses in a lens mount 1930 in a linear direction. In some implementations, the linear direction is orthogonal to a path of a light beam 1995 generated by the optical light source 1910. In some implementations, the Y axis lens translation mechanism 1980 is used to align a lens to a path of a light beam 1995. In some implementations, the Y axis lens translation mechanism 1980 is a drive screw mechanism configured to move the one or more lenses in a lens mount 1930 in the linear direction.

In some implementations, the optical light source 1910 further comprises a Z axis lens translation mechanism 1985. The Z axis lens translation mechanism 1985 can be configured to allow for a positive or negative adjustment of the one or more lenses in a lens mount 1930 in a linear direction. In some implementations, the linear direction is orthogonal to a path of a light beam 1995 generated by the optical light source 1910. In some implementations, the linear direction is orthogonal to a path of a light beam 1995 generated by the optical light source 610 and to one or more of the linear adjustment of the X axis lens translation mechanism 1970 or the Y axis lens translation mechanism 1980. In some implementations, the Z axis lens translation mechanism 1985 is used to align a lens to a path of a light beam 1995. In some implementations, the Z axis lens translation mechanism 1985 is a drive screw mechanism configured to move the one or more lenses in a lens mount 1930 in the linear direction.

Figure 20:
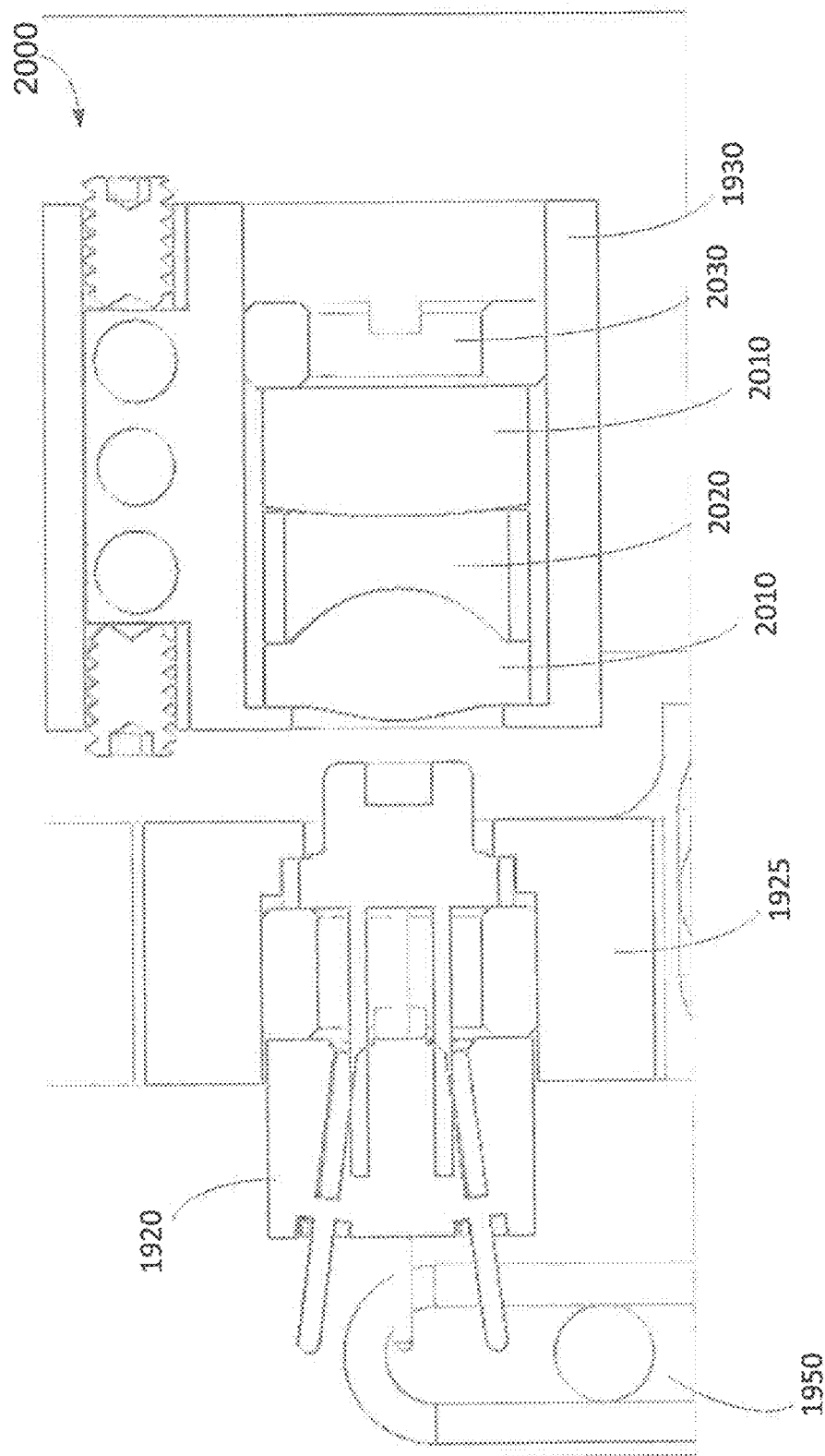
FIG. 20 illustrates a cross section as viewed from above of a portion of the optical light source in accordance with some illustrative embodiments.

FIG. 20 illustrates a cross section as viewed from above of a portion of the optical light source 1910 in accordance with some illustrative embodiments. The optical assembly cross section 2000 includes, in brief, an optical excitation module 1920 (e.g., a laser diode), an optical excitation module mount 1925, a lens mount 1930, one or more Y axis translation slots 1950, one or more lenses 2010, a lens spacer 2020, and a lens retaining ring 2030.

Still referring to FIG. 20 and in further detail, the optical assembly cross section 2000 comprises an optical excitation module 1920. In some implementations, the optical excitation module 1920 is a directed light source. In some implementations, the optical excitation module 1920 is a light emitting diode. In some implementations, the optical excitation module 1920 is a laser diode. In some implementations, the optical assembly cross section 2000 comprises an optical excitation module mount 1925 that is configured to fasten the optical excitation module 1920 in position relative to the rest of the optical assembly cross section 2000.

In some implementations, the optical assembly cross section 2000 further comprises a lens mount 1930. In some implementations, the lens mount 1930 is configured to fasten a plurality of lenses 2010 in position relative to each respective lens 2010 as well as configured to fasten a plurality of lenses 2010 in position relative to the rest of the optical assembly cross section 2000. In some implementations, a lens spacer 2020 is configured to maintain a fixed distance between one or more lenses 2010. In some implementations, a lens retaining ring 2030 is configured to hold one or more lenses 2010 in a proper position relative to the lens mount 1930.

In some implementations, the optical assembly cross section 2000 further comprises one or more Y axis translation slots 1950. The one or more Y axis translation slots 1950 can be configured to allow for a positive or negative adjustment of the optical assembly cross section 2000 in a linear direction. In some implementations, the linear direction is parallel to a path of a light beam generated by the optical assembly cross section 2000. In some implementations the linear direction is orthogonal to the linear direction of the one or more X axis translation slots 2040. In some implementations, the Y axis translation slots 1950 are configured to, upon adjustment, be used to fasten the optical light source (e.g., the optical light source 1910) to an underlying mount. In some implementations, the Y axis translation slots 1950 are configured to accept a screw or other fastener that can be tightened to an underlying mount to fasten the optical assembly cross section 2000 to an underlying mount in a fixed location. In some implementations, the Y axis translation slots 1950 are used to adjust the distance of the path of a light beam from a desired target destination.

Waveplate

Figure 21:
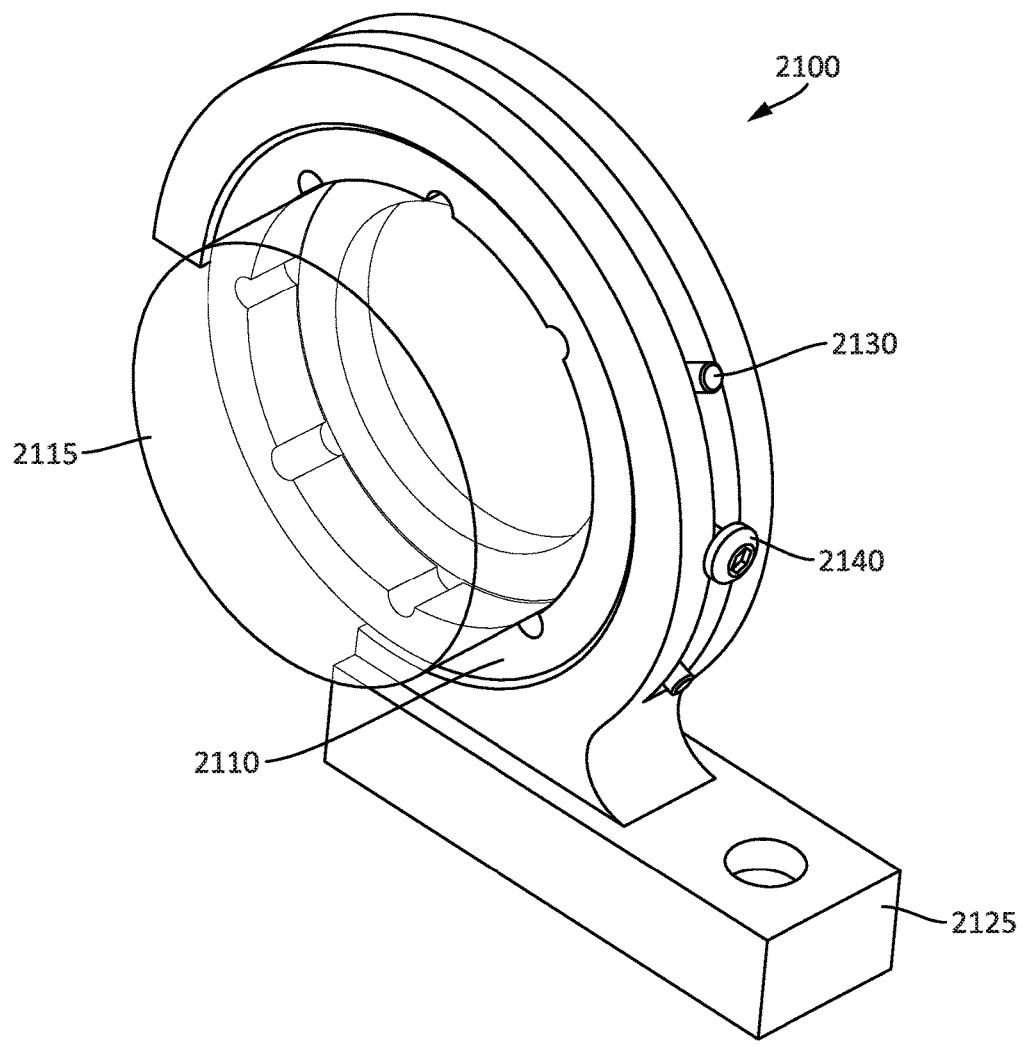
FIG. 21 is a schematic diagram illustrating a waveplate assembly in accordance with some illustrative embodiments.

FIG. 21 is a schematic diagram illustrating a waveplate assembly 2100 according to some embodiments. In some implementations, the waveplate assembly 2100, in brief, may be comprised of a waveplate 2115, a mounting disk 2110, a 420 mounting base 2125, a pin 2130, and a screw lock 2140. In some embodiments, the waveplate 2215 may correspond to the waveplate 315 of FIGS. 3A and 3B. In some implementations, the waveplate assembly 2100 may be configured to adjust the polarization of the light (e.g., light from a laser) as the light is passed through the waveplate assembly 2100. In some implementations, the waveplate assembly 2100 may be configured to mount the waveplate 2115 to allow for rotation of the waveplate 2115 with the ability to stop the plate in to a position at a specific rotation. In some implementations, the waveplate assembly 2100 may be configured to allow for rotation of the waveplate 2115 with the ability to lock the plate in to a position at a specific rotation. Stopping the waveplate 2115 at a specific rotation may allow the configuration of the waveplate assembly 2100 to tune the polarization of the light passing through the waveplate 2115. In some implementations, the waveplate 2115 tunes the polarization of the light passing through by being configured to have a different refractive index for a different polarization of light. In these implementations, the waveplate 2115 operates using the principle of birefringence, where the refractive index of the material of the waveplate 2115 depends on the polarization of the light and the phase is changed between two perpendicular polarizations by $\pi$ (i.e., half a wave), effectively rotating the polarization of the light passing through it by ninety degrees. In some implementations, the waveplate assembly 2100 may be configured to adjust the polarization of the light such that the orientation of a given lattice of a magneto-optical defect center material allows the contrast of a dimming Lorentzian to be deepest and narrowest such that the slope of each side of the Lorentzian is steepest. In some implementations, when the light polarization (e.g., laser polarization is lined up geometrically with the orientation of the given lattice, the contrast and the narrowness of the dimming Lorentzian, the portion of the light that is sensitive to magnetic fields is deepest and narrowest, meaning that the slope of each side of Lorentzian is steepest, and that equates directly to sensitivity for the magnetic field. In some implementations, one polarization of the light (e.g., laser light) aligns with one axis or one crystal lattice of the magneto-optical defect center material, the two Lorentzians associated with that one lattice are steep and narrow, the others are not as steep and not as narrow. The slope of each side of the Lorentzian is steepest when the polarization of the light is lined up geometrically with the orientation of the given lattice of the magneto-optical defect center material. In some implementations where the waveplate 2115 is a half-wave plate, the waveplate assembly 2100 may be configured such that the polarization of the light is lined up with the orientation of a given lattice of a magneto-optical defect center material such that it allows extraction of maximum sensitivity of the lattice (i.e., maximum sensitivity of a vector in free space). In some implementations, the waveplate assembly 2100 may be configured such that four determined positions of the waveplate 2115 increase (e.g., maximize) the sensitivity across all the different lattices of a magneto-optical defect center material. In some implementations, the orientation of the light waves consequent to the polarization of light causes the light waves to coincides with an orientation of one or more of the defect centers, thereby imparting substantially increased energy transfer to the one or more defect centers with coincident orientation while imparting substantially decreased energy transfer to the defect centers that are not coincident. In some implementations, the waveplate assembly 2100 may be configured where the position of the waveplate 2115 is such that similar sensitivities are achieved to the four Lorentzians corresponding to lattice orientations of a magneto-optical defect center material.

In some implementations where the waveplate 2115 is a quarter-wave plate, the waveplate assembly 2100 may be configured such that the polarization of the light is lined up with the orientation of a given lattice of a magneto-optical defect center material such that it allows extraction of maximum sensitivity of the lattice (i.e., maximum sensitivity of a vector in free space). In some implementations, the waveplate assembly 2100 may be configured such that certain determined positions of the waveplate 2115 increase (e.g., maximize) the sensitivity across all the different lattices of a magneto-optical defect center material. In some embodiments, the orientation of the light waves consequent to the polarization of light causes the light waves to coincides with an orientation of one or more of the defect centers, thereby imparting substantially increased energy transfer to the one or more defect centers with coincident orientation while imparting substantially decreased energy transfer to the defect centers that are not coincident. In some embodiments, the circular polarization of the light waves consequent to the polarization of light caused by passing through the quarter-wave assembly causes the light waves to impart substantially equivalent energy transfer to a plurality of defect centers such that similar sensitivities are achieved to the four Lorentzians corresponding to lattice orientations of the plurality of defect centers in the magneto-optical defect center material.

Still referring to FIG. 21, the mounting disk 2110, in some implementations, is attached to a waveplate 2115. The mounting disk 2110 may be attached to a waveplate 2115 such that rotation of the mounting disk 2110 also correspondingly rotates the waveplate 2115. In some implementations, the mounting disk 2110 may be securely adhered (e.g., using epoxy) to a portion of the perimeter of the waveplate 2115. In some implementations, the mounting disk 2110 may be configured to rotate freely and also be locked in place relative to the rest of the waveplate assembly 2100 while the adhered waveplate 2115 may be rotated and locked in place due to the attachment to the mounting disk 2110. In some implementations, the waveplate assembly 2100 may be comprised of a waveplate 2115, a mounting disk 2110, a 420 mounting base 2125, a pin 2130, and a screw lock 2140.

The 420 mounting base 2125, in some implementations, may be configured to restrict a movement of rotation of a waveplate 2115. In some implementations, the movement of rotation is restricted to a single plane such that the rotation occurs around an axis of the waveplate 2115. In some implementations, the 420 mounting base 2125 is configured to restrict a movement of rotation of the mounting disk 2110 such that the rotation of the waveplate 2115 attached to the mounting disk 2110 occurs around an axis of the waveplate 2115. In some implementations, one or more pins 2130 may be attached to the mounting disk 2110 slide through a slot in the 420 mounting base 2125 to allow the mounting disk 2110 to rotate relative to the 420 mounting base 2125. The one or more pins 2130 may be adhered to the mounting disk 2110 such that the one or more pins 2130 stay relative in position to the mounting disk 2110 during rotation of the mounting disk 2110 relative to the 420 mounting base 2125. In some implementations, the one or more pins 2130 may be adhered directly to the waveplate 2115 such that the one or more pins 2130 stay relative in position to the waveplate 2115 during rotation of the waveplate 2115 relative to the 420 mounting base 2125. In some implementations, one or more screw locks 2140 are attached to the mounting disk 2110 and are configured to restrict movement of the 420 mounting base 2125 relative to the 420 mounting base 2125 when tightened. In some implementations, one or more screw locks 2140 are attached to the mounting disk 2110 and lock the mounting disk 2110 in place when tightened. In some implementations, one or more screw locks 2140 may be attached directly to the waveplate 2115 and are configured to restrict movement of the waveplate 2115 when the one or more screw locks 2140 are tightened. In some implementations, the mounting disk 2110 and/or waveplate 2115 can be locked in place or have rotational motion restricted through other means such as through frictional force, electromagnetic force (e.g., an electromagnet is activated to restrict further rotation), other mechanical forces, and the like.

In some implementations, the waveplate assembly 2100 is configured such that a position of the waveplate 2115 is determined as an initial calibration for a light directed through a waveplate 2115. In some implementations, the performance of the system may be affected by the polarization of the light (e.g., light from a laser) as it is lined up with a crystal structure of the magneto-optical defect center material (e.g., NV diamond material) 2120. In some implementations, a waveplate 2115 is mounted to allow for rotation of the waveplate 2115 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration may be set to allow for high contrast with steep Lorentzians for a particular lattice plane. In some implementations, the initial calibration may be set to create similar contrast and steepness of the Lorentzians for each of the four lattice planes.

Figure 22:
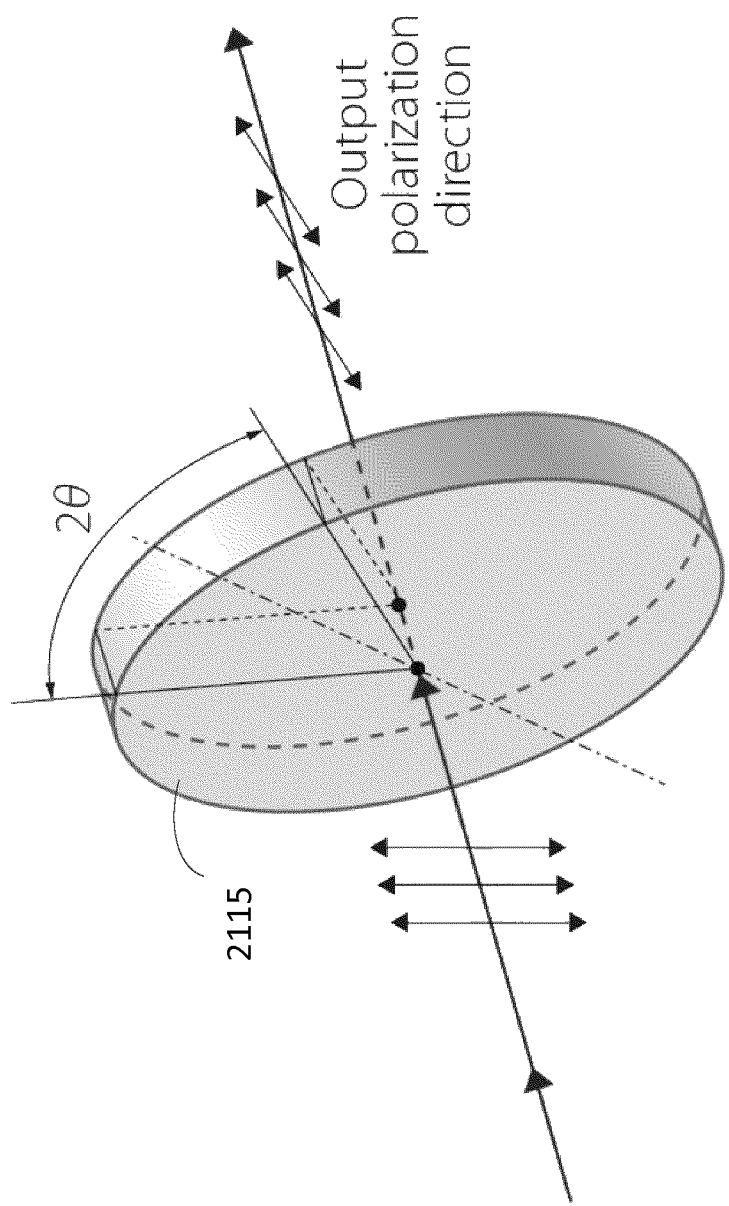
FIG. 22 is a half-wave plate schematic diagram illustrating a change in polarization of light when the waveplate of FIG. 21 is a half-wave plate.

FIG. 22 is a half-wave plate schematic diagram illustrating a change in polarization of light when the waveplate 2115 is a half-wave plate. In some implementations, plane polarized light entering the half-wave plate is rotated to an angle that is twice the angle (i.e., 2θ) of the entering plane polarized light with respect to a fast axis of the half-wave plate. In some implementations, the half-wave plate is used to turn left circularly polarized light into right circularly polarized light or vice versa.

Figure 23:
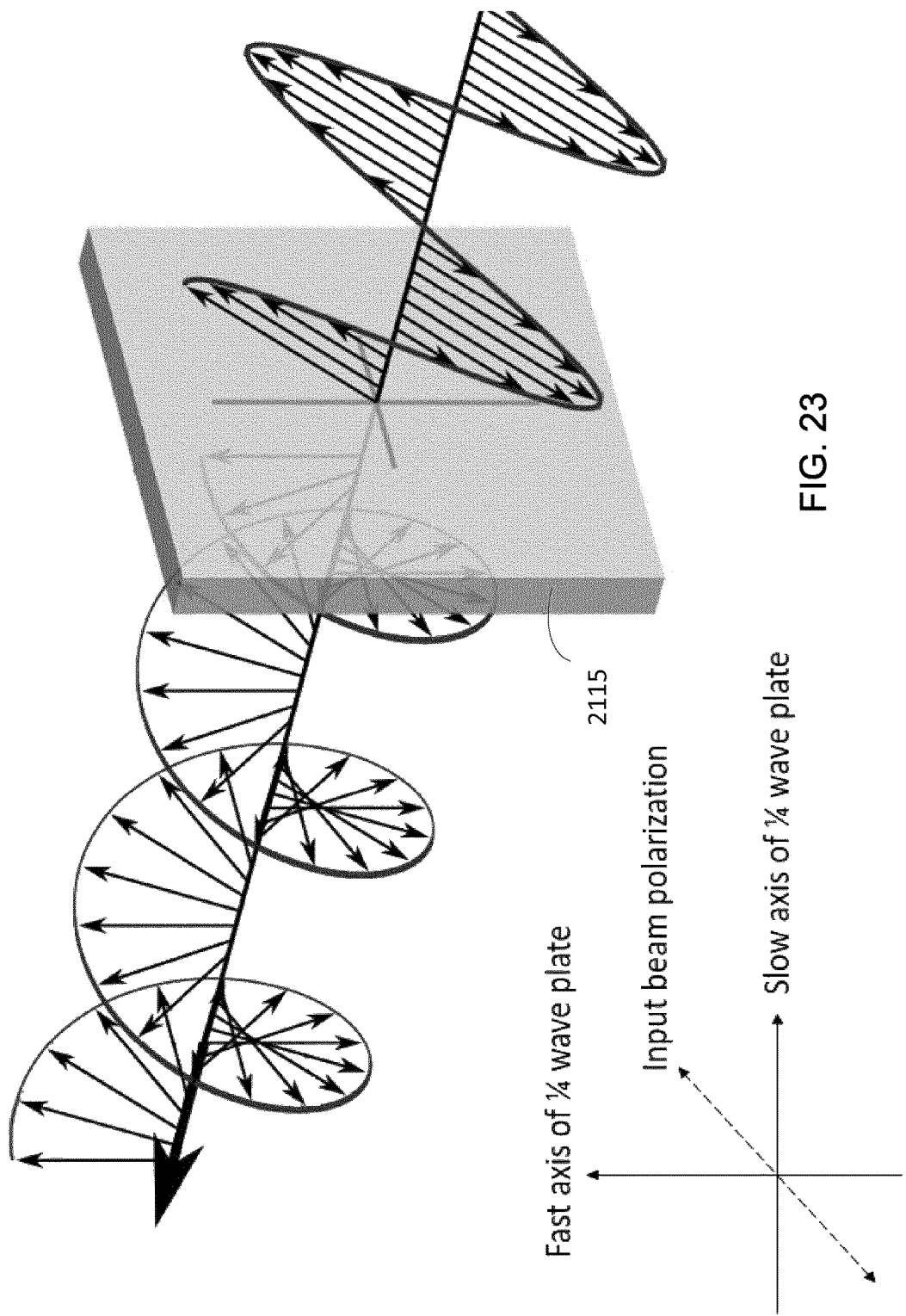
FIG. 23 is a quarter-wave plate schematic diagram illustrating a change in polarization of light when the waveplate of FIG. 21 is a quarter-wave plate.

FIG. 23 is a quarter-wave plate schematic diagram illustrating a change in polarization of light when the waveplate 2115 is a quarter-wave plate. In some implementations, plane polarized light entering the quarter-wave plate is turned into circularly polarized light. The exiting polarized light may be circularly polarized when the entering plane-polarized light is at an angle of 45 degrees to the fast or slow axis as shown in FIG. 23.

In order to tune the magnetic field measurement for certain axes of the magneto-optical defect center materials the polarization of light entering the magneto-optical defect center material may be controlled. During manufacture of a sensor system, there may be small variations in how a magneto-optical defect center material is mounted to the sensor such that axes have deviation in orientation as well as inherent differences between different magneto-optical defect center materials. In such manufacturing, a calibration can be conducted by adjusting the polarization of the light to benefit the final intended purpose of the sensor.

In some implementations a sensor is described comprising an optical excitation source emitting green light, a magneto-optical defect center material with defect centers in a plurality of orientations, and a half-wave plate. At least some of the green light may pass through the half-wave plate, rotating a polarization of such green light to thereby provide an orientation to the light waves emitted from the half-wave plate. The half-wave plate may be capable of being orientated relative to the defect centers in a plurality of orientations, wherein the orientation of the light waves coincides with an orientation of the defect centers, thereby imparting substantially increased energy transfer to the defect center with coincident orientation while imparting substantially decreased energy transfer to the defect centers that are not coincident.

In some implementations, a sensor is described comprising a waveplate assembly, an optical excitation source and a magneto-optical defect center material with defect centers. The waveplate assembly can include a waveplate, mounting base, and a mounting disk. The mounting disk can be adhered to the waveplate. The mounting base can be configured such that the mounting disk can rotate relative to the mounting base around an axis of the waveplate.

In some implementations, the sensor can be configured to direct light from the optical excitation source through the waveplate before the light is directed to the magneto-optical defect center material. In some implementations, the sensor can further comprise a pin adhered to the mounting disk. The mounting base can comprise a slot configured to receive the pin, the pin can slide along the slot and the mounting disk can rotate relative to the mounting base around the axis of the waveplate with the axis perpendicular to a length of the slot. In some implementations, the magneto-optical defect center material with defect centers can be comprised of a nitrogen vacancy (NV) diamond material comprising a plurality of NV centers. In some implementations, the optical excitation source can be one of a laser (e.g., a laser diode) or a light emitting diode. In some implementations, the sensor can further comprise a screw lock attached to the mounting disk. The screw lock can be configured to prevent rotation of the mounting disk relative to the mounting base when tightened. In some implementations, the sensor can further comprise a controller electrically coupled to the waveplate assembly. The controller can be configured to control an angle of the rotation of the waveplate relative to the mounting base.

In some implementations, an assembly can comprise a half-wave plate, a mounting base, an optical excitation source, and a magneto-optical defect center material with defect centers. The mounting base can be configured such that the half-wave plate can rotate relative to the mounting base around an axis of the half-wave plate. In some implementations, the assembly can further comprise a pin adhered to the mounting disk. The mounting base can comprise a slot configured to receive the pin, the pin can slide along the slot and the mounting disk can rotate relative to the mounting base around the axis of the half-wave plate with the axis perpendicular to a length of the slot. In some implementations, the magneto-optical defect center material with defect centers can be comprised of a nitrogen vacancy (NV) diamond material comprising a plurality of NV centers. In some implementations, the optical excitation source can be one of a laser (e.g., a laser diode) or a light emitting diode. In some implementations, the assembly can further comprise a screw lock attached to the mounting disk. The screw lock can be configured to prevent rotation of the mounting disk relative to the mounting base when tightened. In some implementations, the assembly can further comprise a controller electrically coupled to the half-wave plate assembly. The controller can be configured to control an angle of the rotation of the half-wave plate relative to the mounting base.

In some implementations, a sensor assembly is described comprising a mounting base and a half-wave plate assembly. The half-wave plate assembly can further comprise a half-wave plate, an optical excitation means for providing optical excitation through the half-wave plate, a magneto-optical defect center material comprising a plurality of magneto-optical defect centers, and a detector means, for detecting optical radiation.

In some implementations, an assembly is described and can comprise a half-wave plate, a mounting base, an optical excitation source, and a magneto-optical defect center material with defect centers. The mounting base can be configured such that the half-wave plate can rotate relative to the mounting base around an axis of the half-wave plate.

Holder for NV Diamond Material

Figure 24A:
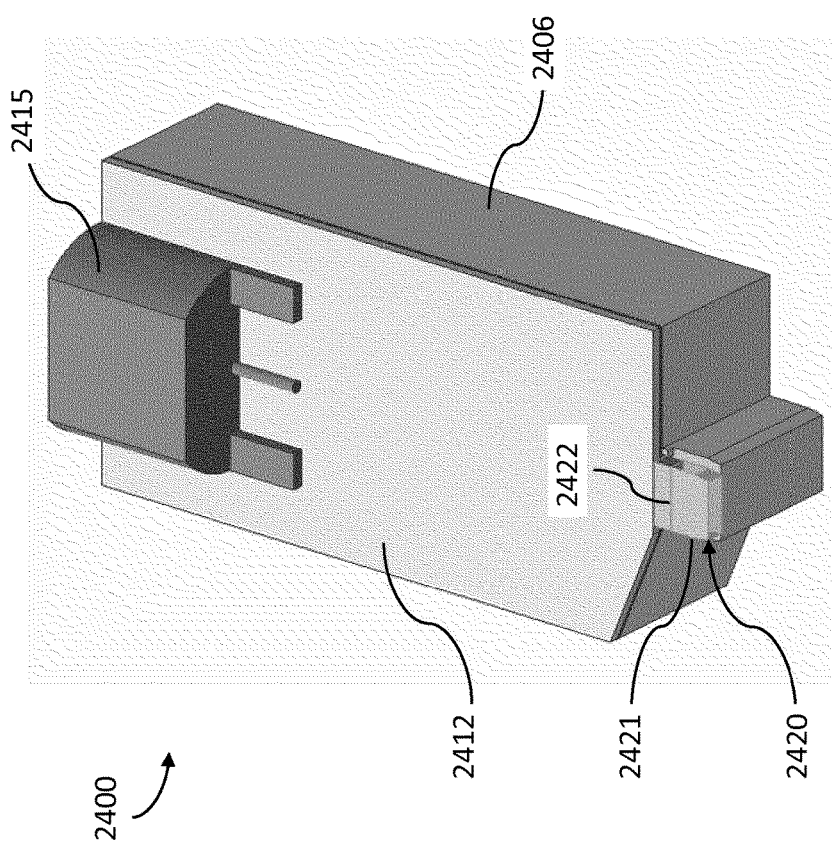
FIGS. 24A-24C are three-dimensional views of an element holder assembly in accordance with some illustrative embodiments.
Figure 24B:
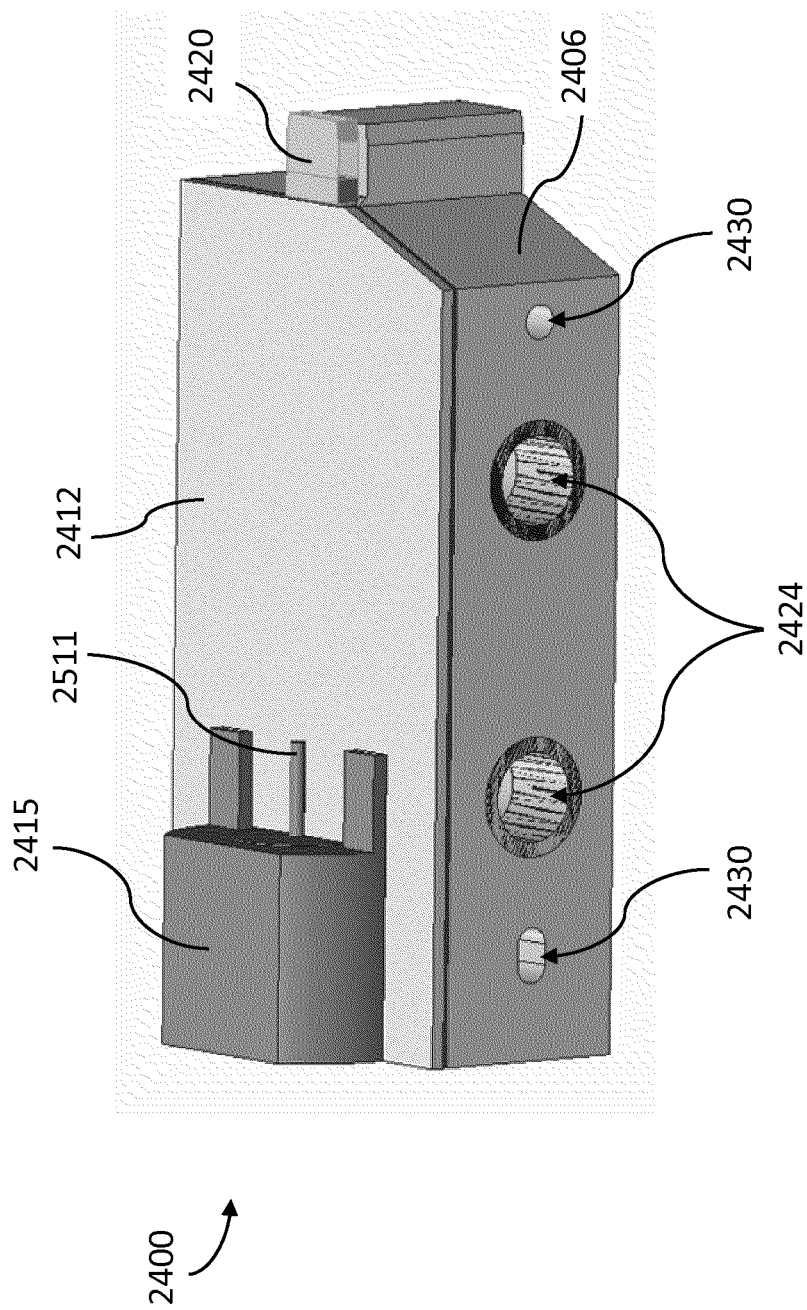
Figure 24C:
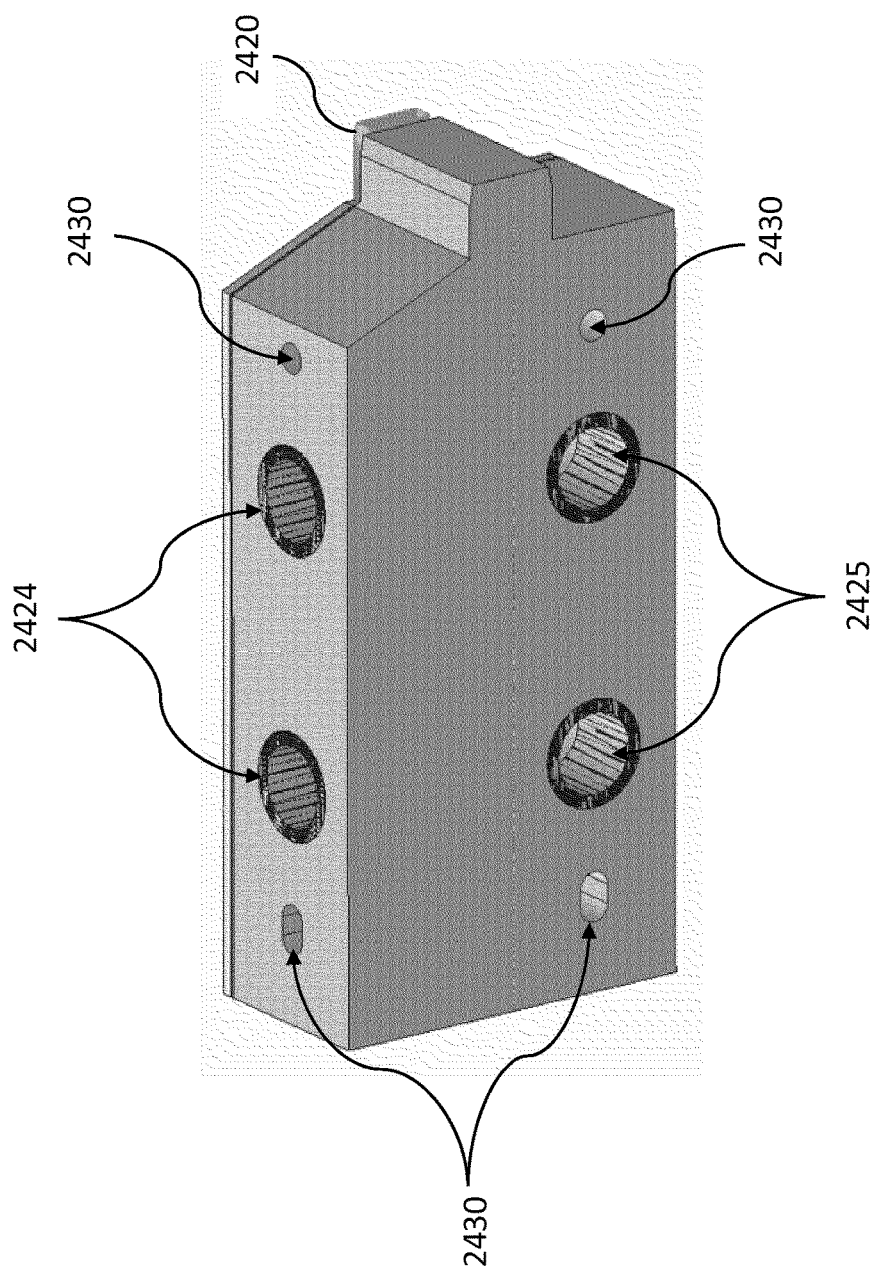

FIGS. 24A-24C are three-dimensional views of a holder 2400 for the magneto-optical defect center material 2420 (e.g., a nitrogen vacancy (NV) diamond material) in accordance with some illustrative embodiments. In some embodiments, the holder 2400 corresponds to the holder 790 of FIG. 7A. An illustrative holder 2400 includes the magneto-optical defect center material 2420, a base 2406, a radio frequency (RF) circuit board 2412, an RF signal connector 2415, first mounting holes 2424, and second mounting holes 2425. In the embodiment illustrated in FIGS. 24A-24C, the holder 2400 includes locating slots 2430. In alternative embodiments, additional, fewer, and/or different elements may be used.

As shown in FIG. 24A, the magneto-optical defect center material 2420 is attached to the base 2406. The magneto-optical defect center material 2420 can be mounted to the base 2406 using any suitable securing mechanism, such as a glue or an epoxy. In alternative embodiments, screws, bolts, clips, fasteners, or etc. may be used. In some embodiments, the magneto-optical defect center material 2420 can be fixed to the RF circuit board 2412. For example, a ribbon bond can be used between the magneto-optical defect center material 2420 and the RF circuit board 2412. In alternative embodiments, any other suitable methods can be used to attach the magneto-optical defect center material 2420 to the RF circuit board 2412.

In the embodiment shown in FIG. 24A, one side of the magneto-optical defect center material 2420 is adjacent to the base 2406, and one side of the magneto-optical defect center material 2420 is adjacent to the RF circuit board 2412. In such an embodiment, other sides of the magneto-optical defect center material 2420 are not adjacent to opaque objects and, therefore, can have light injected therethrough. In the embodiment shown in FIG. 24A, the magneto-optical defect center material 2420 has eight sides, six of which are not adjacent to an opaque object. In alternative embodiments, the magneto-optical defect center material 2420 can have greater than or fewer than eight sides.

For example, the magneto-optical defect center material 2420 includes two sides 2421 and 2422 through which light can be injected into the magneto-optical defect center material 2420. In such an example, light can be injected through the edge side 2421 or the face side 2422. When light is injected through the edge side 2421, the defect centers in the magneto-optical defect center material 2420 are excited less uniformly than when light is injected through the face side 2422. Also, when light is injected through the edge side 2421, more of the defect centers in the magneto-optical defect center material 2420 are excited than when light is injected through the face side 2422.

In some illustrative embodiments, the more of the defect centers in the magneto-optical defect center material 2420 are excited by light, the more red light is emitted from the magneto-optical defect center material 2420. In some illustrative embodiments, the more uniformly that the defect centers in the magneto-optical defect center material 2420 are excited by the light the more sensitive the magnetometer may be. Thus, in some instances, it may be preferential to inject light into the edge side 2421 while in other instances it may be preferential to inject light into the face side 2422.

In the embodiment shown in FIG. 24A, the side of the magneto-optical defect center material 2420 opposite the edge side 2421 is not obstructed by an opaque object (e.g., base 2406 or the RF circuit board 2412). That is, light injected into the edge side 2421 that is not absorbed by defect centers (e.g., used to excite defect centers) of the NV diamond material 620 may pass through the magneto-optical defect center material 2420. In an illustrative embodiment the light that passes through the magneto-optical defect center material 2420 may be sensed by an optical sensor. The light that passes through the magneto-optical defect center material 2420 may be used to eliminate or reduce correlated noise in the light captured by the optical detector.

In the embodiment shown in FIG. 24A, the side of the magneto-optical defect center material 2420 that is opposite the face side 2422 is adjacent to the base 2406. Thus, light that is injected through the face side 2422 that is not absorbed by defect centers is absorbed by the base 2406. That is, the light not absorbed by the defect centers is not detected by a light detector to be used to eliminate or reduce correlated noise. In some alternative embodiments, the base 2406 includes a through hole that unabsorbed light can pass through.

As shown in FIG. 24B, the base 2406 can include first mounting holes 2424. As shown in FIG. 24C, the base 2406 can include second mounting holes 2425. The first mounting holes 2424 and the second mounting holes 2425 can be configured to accept mounting means, such as a screw, a bolt, a clip, a fastener, etc. In some illustrative embodiments, the mounting holes 2424 are threaded. For example, a helical insert can be used to provide threaded means for accepting a screw or bolt. In some illustrative embodiments, the helical insert can be made of brass, steel, stainless steel, aluminum, nylon, plastic, etc. For example, the threaded inserts can have #2-56 threads. In alternative embodiments, the threaded inserts can have any other suitable threads. The first mounting holes 2424 can be used to secure the side of the base 2406 with the first mounting holes 2424 against a base of the housing 2405 (e.g., the housing 705 of FIG. 7A or the housing 805 of FIG. 8A). Thus, when the base 2406 is mounted to the housing 2405 via the first mounting holes 2424, light from the plurality of optical light sources 2410 (e.g., the optical excitation system 710 of FIG. 7A) can be injected through the face side 2422 of the magneto-optical defect center material 2420. Similarly, when the base 2406 is mounted to the housing 2405 via the second mounting holes 2425, light from the plurality of optical light sources 2410 can be injected through the edge side 2421.

In some illustrative embodiments, the base 2406 can include slots 2430. The slots 2430 can be used to receive pegs or other inserts that are attached to the housing 24. In such embodiments, the slots 2430 can be used to align the base 2406 with holes or fasteners associated with the first mounting holes 2424 or the second mounting holes 2425. Thus, the holder 2400 can easily and/or conveniently be rotated to optionally mount to the housing 2405 via either the first mounting holes 2424 or the second mounting holes 2425. In alternative embodiments, the holder 2400 can include additional sets of mounting holes. Also, although the embodiments shown in FIGS. 24A-24C include two holes in each set of the first mounting holes 2424 and the second mounting holes 2425, any other suitable number of mounting holes can be used.

Figure 25:
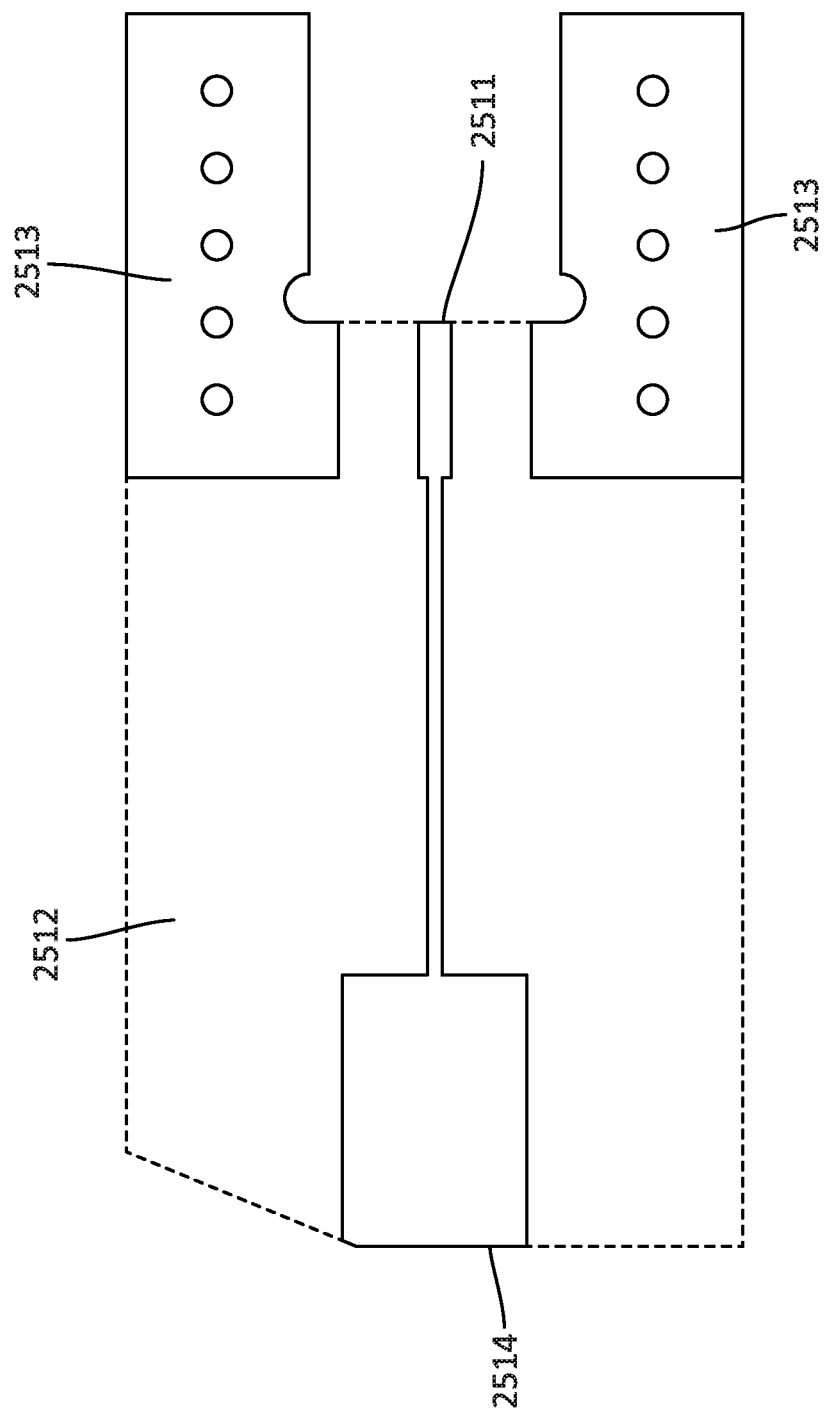
FIG. 25 is a circuit outline of a radio frequency element circuit board in accordance with some illustrative embodiments.

FIG. 25 is a circuit outline of a radio frequency element circuit board in accordance with some illustrative embodiments. An illustrative example RF circuit board 2512 can include a positive electrode 2511, an RF signal trace 2514, and ground connectors 2513. The RF circuit board 2512 may correspond to the RF circuit board 2412 of FIG. 24. In alternative embodiments, additional, fewer, and/or different elements may be used. As shown in FIG. 24A, the RF circuit board 2412 can be attached to the base 2406. The RF circuit board 2412 can be attached to the base 2406 using any suitable method, such as via a glue, epoxy, screws, bolts, clips, fasteners, etc.

An RF field can be applied to the magneto-optical defect center material 2420 to determine the external magnetic field. In some illustrative embodiments, the RF signal connector 2415 can be configured to receive a connector or cable over which an RF signal is transmitted. For example, the RF signal connector 2415 can be configured to accept a coaxial cable. The positive electrical connection of the RF signal connector 2415 can be connected to the positive electrode 2511. The positive electrode 2511 can, in turn, be electrically connected to the RF signal trace 2514. Similarly, the ground connection from the RF signal connector 2415 can be electrically connected to the ground connectors 2513. In some illustrative embodiments, the ground connectors 2513 are electrically connected to the base 2406, which can be connected to a ground of the system 2500. Thus, an RF signal transmitted to the RF signal connector 2415 can be transmitted through the RF signal trace 2514, which can transmit an RF field. The RF field can be applied to the magneto-optical defect center material 2420. Thus, the signal transmitted to the RF signal connector 2415 can be used to apply the RF field to the magneto-optical defect center material 2420.

Figure 26A:
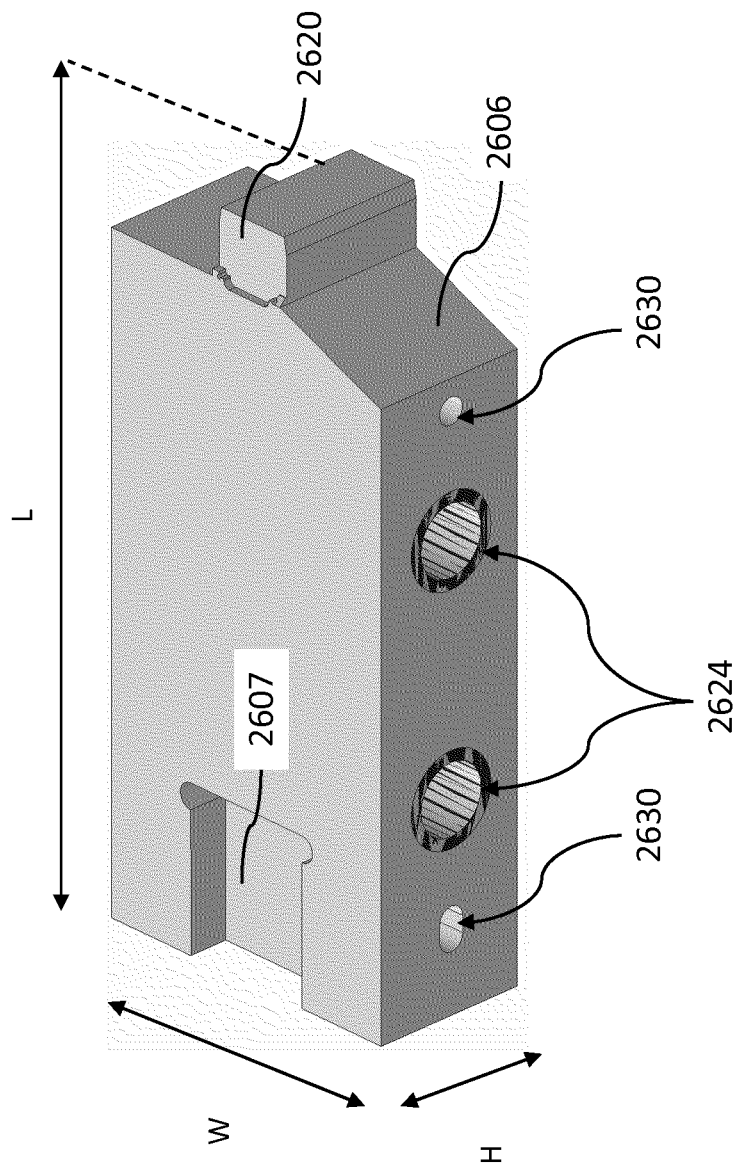
FIGS. 26A and 26B are three-dimensional views of an element holder base in accordance with some illustrative embodiments.
Figure 26B:
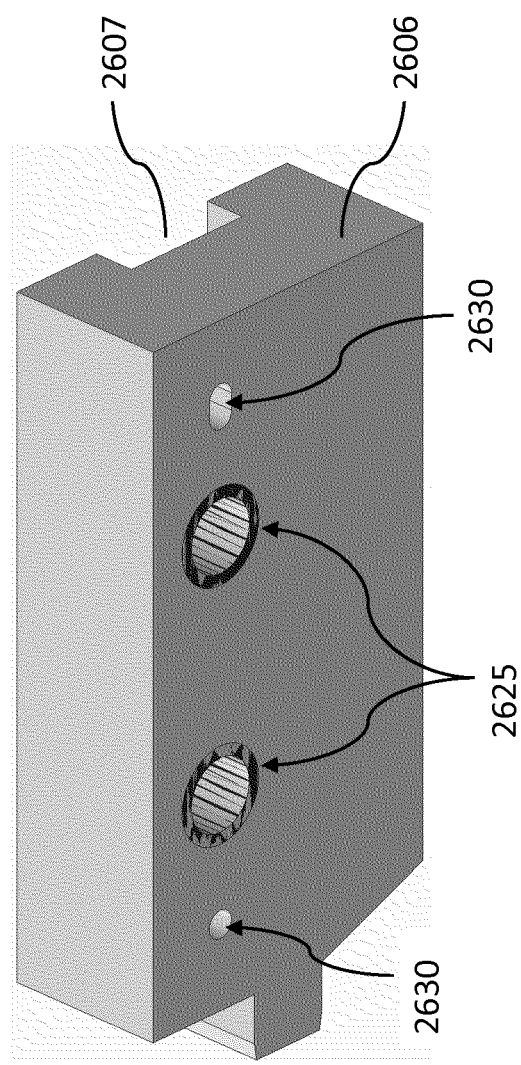

FIGS. 26A and 26B are three-dimensional views of an element holder base in accordance with some illustrative embodiments. An illustrative base 2606 includes the first mounting holes 2624, the second mounting holes 2625, the slots 2630, an RF connector recess 2607, and a magneto-optical defect recess 2608. The base 2606, the first mounting holes 2624, the second mounting holes 2625, the slots 2630 may correspond to the base 2406, the first mounting holes 2424, the second mounting holes 2425, and the slots 2430, respectively, of FIG. 24. In alternative embodiments, additional, fewer, and/or different elements may be used.

In some illustrative embodiments, the base 2406, 2606 is made of a conductive material. For example, the base 2406, 2606 may be made of brass, steel, stainless steel, aluminum, etc.

The base 2406, 2606 can include an RF connector recess 2607 that can be configured to accept at least a portion of the RF signal connector 2415. Similarly, the magneto-optical defect recess 2608 can be configured to accept the magneto-optical defect center material 2420. For example, the NV diamond material 620 can be mounted to the magneto-optical defect recess 2608.

In some illustrative embodiments, the length L (e.g., from the edge of the base 2606 with the RF connector recess 2607 to the edge with the magneto-optical defect recess 2608, as shown by the dashed line) of the base 2406 is 0.877 inches long. In alternative embodiments, the length L can be less than or greater than 0.877 inches. In some illustrative embodiments, the width W is 0.4 inches. In alternative embodiments, the width W is less than or greater than 0.4 inches. In some illustrative embodiments, the height H is 0.195 inches. In alternative embodiments, the height H is less than or greater than 0.195 inches.

Vivaldi RF Antenna Array

Figure 27:
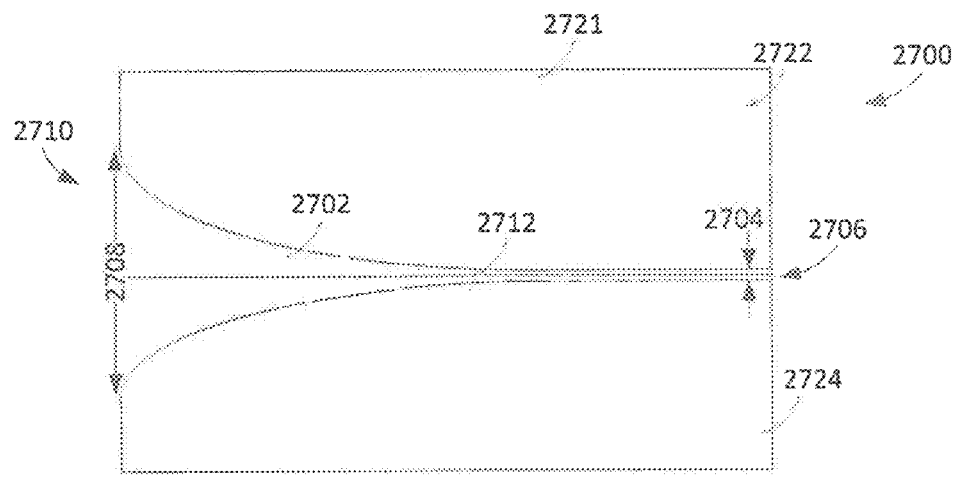
FIG. 27 is a schematic illustrating some implementations of a Vivaldi antenna.

A magneto-optical defect center sensor can utilize a Vivaldi antenna array for increasing uniformity of an RF magnetic signal at a specified location of the magneto-optical defect center material. FIG. 27 depicts an implementation of a Vivaldi or tapered slot antenna element 2700. In the implementation shown, a conductive layer 2721 is positioned on a substrate for the Vivaldi antenna element 2700. A slot 2702 is formed in the conductive layer 2721 that widens from a minimum distance 2704 at a first end 2706 of the slot 2702 to a maximum distance 2708 at a second end 2710. The opening of the slot 2702 is symmetrical in the implementation shown about an axis 2712 along the length of the slot 2702 and each side 2722, 2724 of the conductive layer 2721 widens outwardly as the slot 2702 approaches the second end 2710.

The Vivaldi antenna element 2700 can be constructed from a pair of symmetrical conductive layers 2721 on opposing sides of a thin substrate layer. The conductive layers 2721 are preferably substantially identical with the slot 2702 formed in each conductive layer 2721 pair being parallel. The Vivaldi antenna element 2700 is fed by a transmission line (not shown) at the first end 2706 and radiates from the second end 2710. The size, shape, configuration, and/or positioning of the transmission line of the Vivaldi antenna element 2700 may be modified for different bandwidths for the Vivaldi antenna element 2700.

Figure 28:
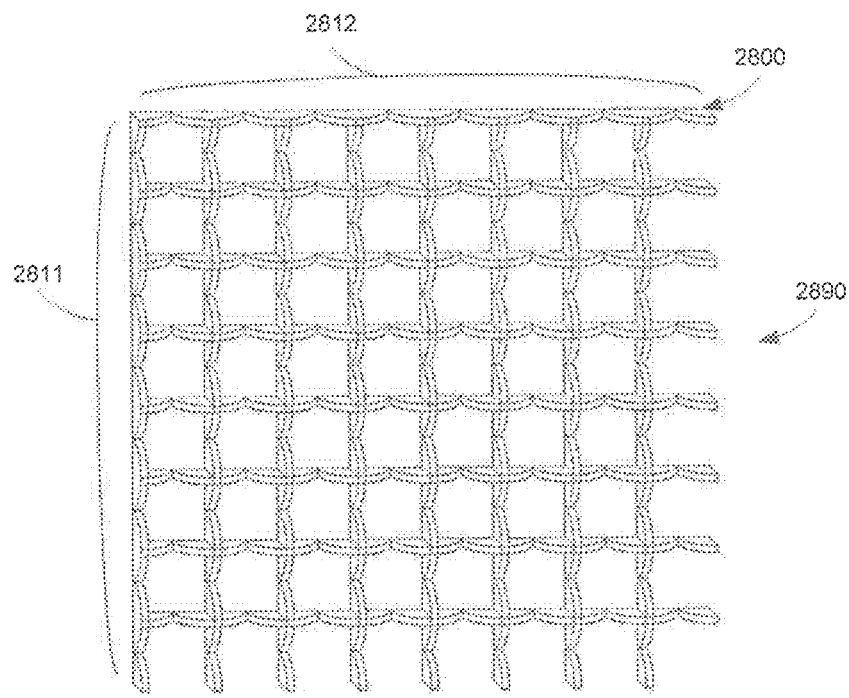
FIG. 28 is a schematic illustrating some implementations of an array of Vivaldi antennae.

As shown in FIG. 28, a plurality of Vivaldi antenna elements 2800 may be arranged in an array 2890. The array 2890 may include Vivaldi antenna elements 2800 in a two-dimensional configuration with Vivaldi antenna elements 2800 arranged horizontally 2812 and vertically 2811 in a plane of the array 2890. In some implementations, the Vivaldi antenna elements 2800 may be uniform in size and configuration. In other implementations, the Vivaldi antenna elements 2800 may have different sizes and/or configurations based on a position of the corresponding Vivaldi antenna element 2700 in the array 2890 and/or based on a target far-field uniformity for a magneto-optical defect center element positioned relative to the array 2890. In some implementations, the array 2890 of Vivaldi antenna elements 2800 is configured to be oversampled to operate over a frequency band centered at 2.87 GHz. Each individual Vivaldi antenna element 2700 may be designed to operate from approximately 2 GHz to 40 GHz. The array 2890 may include 64 to 196 individual Vivaldi antenna elements 2800.

Figure 29:
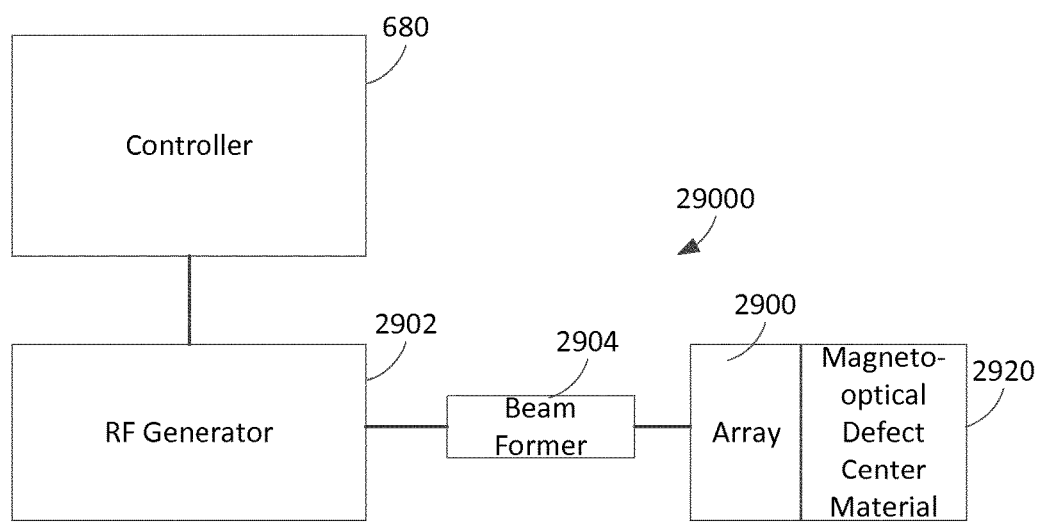
FIG. 29 is a block diagram of some RF systems for the magneto-defect center sensor.

FIG. 29 depicts an RF system 29000 for use in a magneto-optical defect center sensor, such as the system 700 of FIG. 7A. A magneto-optical defect center sensor may use an RF excitation method that has substantial uniformity over a portion of the magneto-optical defect center material 2920 (e.g., a NV diamond material) such as the magneto-optical defect center material 720 that is illuminated by the optical excitation system 710, such as the optical light source 710A and 710B of FIG. 7A. A spatially oversampled Vivaldi antenna array 2990, such as the array 2890 of FIG. 28, can be implemented to achieve a high uniformity in a compact size through the use of small Vivaldi antenna elements 2900 to permit the magneto-optical defect center material 2920 to effectively be in the far field of the array, thereby decreasing the distance needed between the magneto-optical defect center material 2920 and the array 2990.

As shown in FIG. 29, the RF system includes an RF generator 2902, a beam former system 2904, and the Vivaldi antenna element array 2990. The RF generator 2902 is configured to generate an RF signal for generating an RF magnetic field for the magneto-optical defect center sensor based on an output from the controller such as the controller 680 of FIGS. 6A-6C. Each Vivaldi antenna element 2900 of the array 2990 can be designed to work from 2 gigahertz (GHz) to 40 GHz. In some implementations, each Vivaldi antenna element 2900 of the array 2890 can be designed to work at other frequencies, such as 50 GHz. The Vivaldi antenna elements 2900 are positioned on an array lattice or other substructure correlating to 40 GHz. In some implementations, the array lattice may be a small size, such as 0.1 inches by 0.1 inches. Each Vivaldi antenna element 2900 of the array 2990 is electrically coupled to the beam former system 2904. The combination of the Vivaldi antenna elements 2900 permits the array 2990 to operate at lower frequencies than each Vivaldi antenna element 2900 making up the array 2990.

The beam former system 2904 is configured to spatially oversample the Vivaldi antenna elements 2900 of the array 2990 such that the array 2990 of Vivaldi antenna elements 2900 effectively operates like a single element at 2 GHz. The beam former system 2904 may include a circuit of several Wilkinson power splitters. In some implementations, the beam former system 2904 may be configured to spatially oversample the Vivaldi antenna elements 2900 of the array 2990 such that the array 2990 of Vivaldi antenna elements 2900 perform like a single element at other frequencies, such as 2.8-2.9 GHz. A single 2 GHz antenna would typically require an increased distance for the magneto-optical defect center material 2920 to be located in the far field. If the magneto-optical defect center material 2920 is moved into the near field, decreased uniformity occurs. However, since the array 2890 is composed of much smaller Vivaldi antenna elements 2900, the far field of each element 2900 is much closer than a single 2 GHz antenna. Thus, the magneto-optical defect center material 2920 is able to be positioned much closer to still be in the far field of the array 2990. Due to oversampling provided by the beam former system 2904 of the array 2990 of very small Vivaldi antenna elements 2900 the magneto-optical defect center material 2920 is able to be positioned in the far field of the array 2990 and achieve a high uniformity.

Because of the high uniformity for the RF magnetic field provided by the array 2990, the magneto-optical defect center material 2920 can be at multiple different orientations, thereby providing additional adaptability for designing the magneto-optical defect center sensor. That is, the magneto-optical defect center material 2920 may be mounted to a light pipe for collected red wavelength light emitted from the magneto-optical defect center material 2920 when excited by a green wavelength optical excitation source, and the array 2990 can be maneuvered to a number of different positions to accommodate any preferred configurations for the positioning of the light pipe and/or optical excitation source. By providing the array 2990 of Vivaldi antenna elements 2900, the magneto-optical defect center sensor can have a more customized and smaller configuration compared to other magneto-optical defect center sensors.

In addition, in some implementations, the array 2890, 2990 may be able to control the directionality of the generated RF magnetic field. That is, because of the several Vivaldi antenna elements 2800, 2900 making up the array 2890, 2990, the directionality of the resulting RF magnetic field can be modified based on which of the Vivaldi antenna elements 2800, 2900 are active and/or the magnitude of the transmission from each of the Vivaldi antenna elements 2800, 2900. In some implementations, one or more phase shifters may be positioned between a corresponding output of a beam former of the beam former system 2904 for a Vivaldi antenna element 2900. The one or more phase shifters may be selectively activated or deactivated to provide constructive or destructive interference so as to "steer" each RF magnetic field generated from each Vivaldi antenna element 2700, 2800, 2900 in a desired direction. Thus, in some implementations it may be possible to "steer" the generated RF magnetic field to one or more lattices of the magneto-optical defect center material 2920.

Some embodiments provide methods and systems for magneto-optical defect center sensors that utilize a Vivaldi antenna array for increasing uniformity of an RF magnetic signal at a specified location of the magneto-defect center element, such as a diamond having a nitrogen vacancy.

Some implementations relate to a magnetic field sensor assembly that may include an optical excitation source, a radio frequency (RF) generator, a beam former in electrical communication with the RF generator, an array of Vivaldi antenna elements in electrical communication with the beam former, and a magneto-optical defect center material positioned in a far field of the array of Vivaldi antenna elements. The array of Vivaldi antenna elements may generate a RF magnetic field that is uniform over the magneto-optical defect center material and the optical excitation source may transmit optical light at a first wavelength to the magneto-optical defect center material to detect a magnetic field based on a measurement of optical light at a second wavelength that is different from the first wavelength.

In some implementations, the array of Vivaldi antenna elements may be configured to operate in a range from 2 gigahertz (GHz) to 50 GHz. The array of Vivaldi antenna elements may include a plurality of Vivaldi antenna elements and an array lattice. The beam former may be configured to operate the array of Vivaldi antenna elements at 2 GHz or 2.8-2.9 GHz. The beam former may be configured to spatially oversample the array of Vivaldi antenna elements. The array of Vivaldi antenna elements may be adjacent the magneto-optical defect center material. The magneto-optical defect center material may be a diamond having nitrogen vacancies.

Some implementations relate to a magnetic field sensor assembly that may include a radio frequency (RF) generator, a beam former in electrical communication with the RF generator, an array of antenna elements in electrical communication with the beam former, and a magneto-optical defect center material positioned in a far field of the array of antenna elements. The array of antenna elements may generate a RF magnetic field that is uniform over the magneto-optical defect center material.

In some implementations, the array of antenna elements may be configured to operate in a range from 2 gigahertz (GHz) to 50 GHz. The array of antenna elements may include a plurality of Vivaldi antenna elements and an array lattice. The beam former may be configured to operate the array of antenna elements at 2 GHz or 2.8-2.9 GHz. The beam former may be configured to spatially oversample the array of antenna elements. The array of antenna elements may be adjacent the magneto-optical defect center material. The magneto-optical defect center material may be a diamond having nitrogen vacancies.

Other implementations relate to a magnetic field sensor assembly that may include a radio frequency (RF) generator, an array of antenna elements in electrical communication with the RF generator, and a magneto-optical defect center material positioned in a far field of the array of antenna elements. The array of antenna elements may generate a RF magnetic field that is uniform over the magneto-optical defect center material.

In some implementations, the array of antenna elements may be configured to operate in a range from 2 gigahertz (GHz) to 50 GHz. The magnetic field sensor assembly may include a beam former configured to operate the array of antenna elements at 2.8-2.9 GHz. The array of antenna elements may include a plurality of Vivaldi antenna elements and an array lattice.

Magnetic Field Generator

Figure 30:
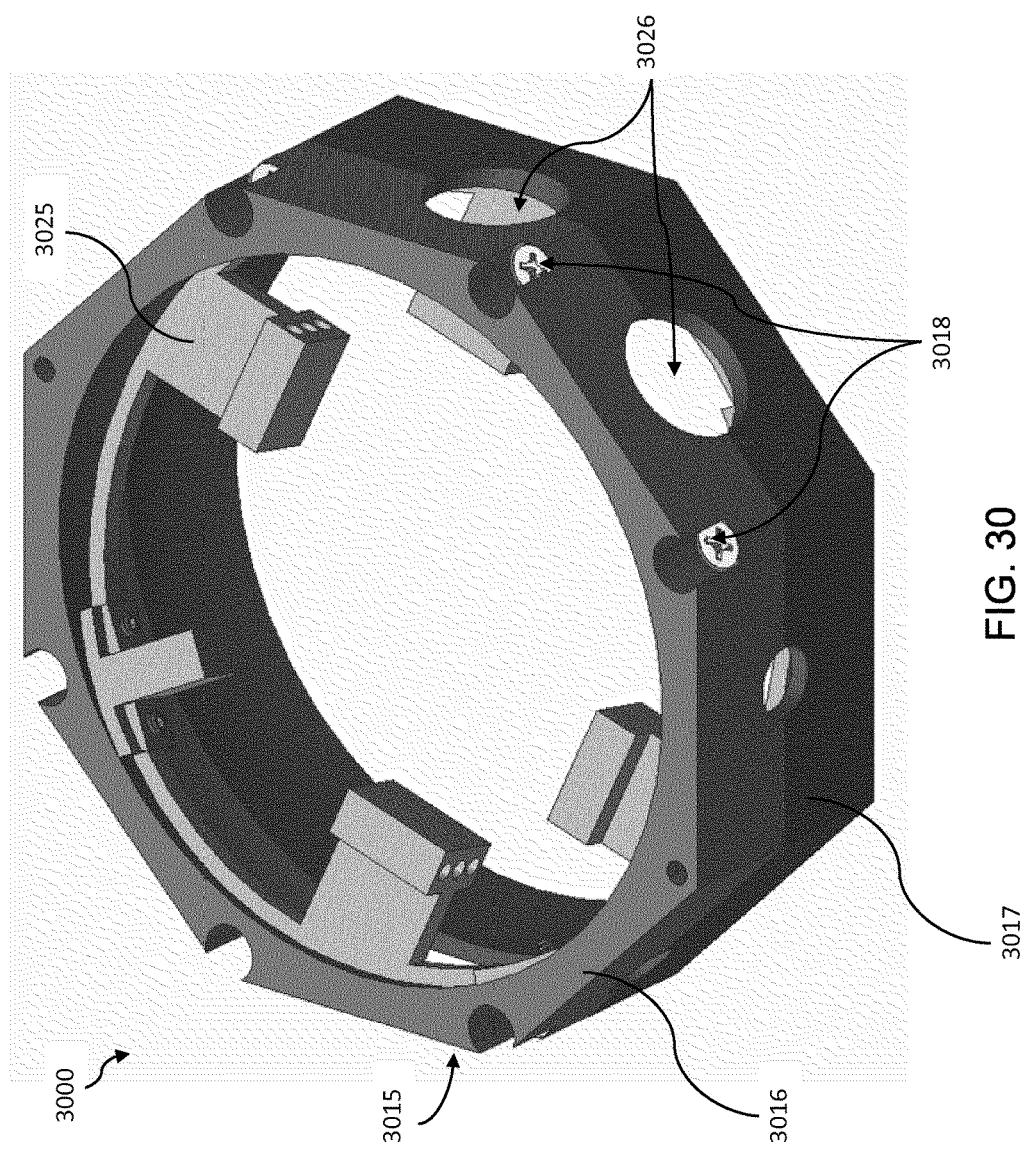
FIG. 30 is illustrates a magnet mount assembly in accordance with some illustrative embodiments.

In the embodiment illustrated in FIG. 30, permanent magnets are mounted to the bias magnet ring 3025, which is secured within the magnet ring mount 3015. The bias magnet ring 3025 and the magnet ring mount 3015 may correspond to the bias magnet ring 725 and the magnet ring mount 715 of FIG. 7A. The magnet ring mount 3015 is mounted or fixed within the housing (e.g., the housing 705 of FIG. 7A) such that the magnet ring mount 3015 does not move within the housing. Similarly, the plurality of optical light sources (e.g., the optical light sources 710A and 710B of FIG. 7A) are mounted within the housing such that the plurality of optical light sources do not move within the housing.

As shown in FIG. 7A, the magneto-optical defect center material 720 is mounted within the magnet ring mount 715 (e.g., the magnet ring mount 3015), but the plurality of optical light sources 710 are mounted outside of the magnet ring mount 715. The plurality of optical light sources 710 transmit light to the magneto-optical defect center material 720 which excites the defect centers, and light emitted from the defect centers is detected by the optical detector 740. In some embodiments shown in FIGS. 3A and 3B, the plurality of optical light sources (e.g., the optical excitation source 310) transmit the light such that the magnet ring mount 3015 and the bias magnet ring 3025 do not interfere with the transmission of the light from the plurality of optical light sources to the NV diamond material.

The magnetic field generator 670 (see FIGS. 6A-6C) may generate magnetic fields with orthogonal polarizations, for example. In this regard, the magnetic field generator 670 may include two or more magnetic field generators, such as two or more Helmholtz coils. The two or more magnetic field generators 670 may be configured to provide a magnetic field having a predetermined direction, each of which provide a relatively uniform magnetic field at the magneto-optical defect center material. The predetermined directions may be orthogonal to one another. In addition, the two or more magnetic field generators of the magnetic field generator 670 may be disposed at the same position, or may be separated from each other. In the case that the two or more magnetic field generators 670 are separated from each other, the two or more magnetic field generators 670 may be arranged in an array, such as a one-dimensional or two-dimensional array, for example.

The system 700 (see FIG. 7A) may be arranged to include one or more optical detection systems, where each of the optical detection systems includes the optical detector 740, optical excitation source 710, and magneto-optical defect center material 720. Furthermore, the magnetic field generator 670 may have a relatively high power as compared to the optical detection systems. In this way, the optical detection systems may be deployed in an environment that requires a relatively lower power for the optical detection systems, while the magnetic field generator 670 may be deployed in an environment that has a relatively high power available for the magnetic field generator so as to apply a relatively strong magnetic field.

FIG. 30 is an illustration of a magnet mount assembly in accordance with some illustrative embodiments. An illustrative magnet mount assembly 3000 includes the magnet ring mount 3015 and the bias magnet ring 3025. In alternative embodiments, additional, fewer, and/or different elements may be used.

As shown in FIG. 30, the magnet ring mount 3015 includes a first portion 3016 and a second portion 3017 held together with fasteners 3018. The bias magnet ring 3025 can be fixed within the magnet ring mount 3015. The bias magnet ring 3025 can hold magnets such that a uniform or substantially uniform magnetic field is applied to a central portion of the magnet mount assembly 3000. For example, the uniform magnetic field can be applied to the magneto-optical defect center material 720.

The magnet mount assembly 3000 includes through-holes 3026. The through-holes 3026 can be sufficiently large to allow light from the plurality of optical light sources 710 to pass into a center portion of the magnet mount assembly 3000 (e.g., to apply light to the magneto-optical defect center material 720.). As noted above, the system may include any suitable number of optical light sources 710. Similarly, the magnet mount assembly 3000 may include any suitable number of through-holes 3026. In some illustrative embodiments, the magnet mount assembly 3000 incudes the same number of through-holes 3026 as a number of optical light sources 710 in the system. In alternative embodiments, the magnet mount assembly 3000 includes a different number of through-holes 3026 than a number of optical light sources 710 in the system. For example, two or more optical light sources 710 may pass light through the same through-hole 3026. In another example, one or more through-holes 3026 may not have light passing therethrough.

The magnet mount assembly 3000 as shown in FIG. 30 includes six fasteners 3018. The fasteners 3018 can be used to secure the first portion 3016 to the second portion 3017. In some illustrative embodiments, the fasteners 3018 can be used to secure the magnet mount assembly 3000 to the housing of the system (e.g., the housing 705 of FIG. 7A). The fasteners 3018 can be any suitable device for securing the first portion 3016 to the second portion 3017. In the embodiment shown in FIG. 30, the fasteners 3018 are screws. Other examples of fasteners 3018 may include bolts, studs, nuts, clips, etc. In alternative embodiments, any suitable means of securing the first portion 3016 and the second portion 3017 to one another, such as glue, welds, epoxy, etc. Although FIG. 30 shows six fasteners 3018 being used, any other suitable number can be used. For example, the magnet mount assembly 3000 may have one, two, three, five, ten, etc. fasteners 3018.

As shown in FIG. 30, the inside surface of the magnet ring mount 3015 is circular or semi-spherical and the outside surface is an octagonal prism. In such an embodiment, a center of the circular shape or semi-spherical shape of the inside surface is on a central axis of the octagonal prism of the outside surface. Any other suitable shapes may be used. For example, the inside surface of the magnet ring mount 3015 may be elliptical. In another example, the outside surface of the magnet ring mount 3015 may have more or fewer sides than eight.

In some illustrative embodiments, the inner diameter (e.g., the inner spherical diameter) of the magnet ring mount 3015 is 2.75 inches. In such an embodiment, the tolerance may be +0.002 inches and −0.000 inches. In alternative embodiments, the inner diameter of the magnet ring mount 3015 is greater than or less than 2.75 inches, and any suitable tolerance may be used.

As shown in FIG. 30, the bias magnet ring 3025 can include an outside ring that is circular. In some illustrative embodiments, the outside circumference of the bias magnet ring 3025 is the same or slightly less than the inside diameter of the magnet ring mount 3015. In such an embodiment, when not secured, the bias magnet ring 3025 can move freely within the magnet ring mount 3015. As discussed in greater detail below, the bias magnet ring 3025 can be secured in place inside of the magnet ring mount 3015 using, for example, set screws.

The magnet ring mount 3015 and the bias magnet ring 3025 may be made of any suitable material. In some illustrative embodiments, the magnet ring mount 3015 and the bias magnet ring 3025 are non-ferrous and/or non-magnetic. For example, the magnet ring mount 3015 and the bias magnet ring 3025 may be made of plastic (e.g., Black Noryl® PPO™, polystyrene, polyphenylene ether, etc.), titanium (e.g., Grade 5, Ti 6Al-4V, etc.), aluminum (e.g., 6061-T6 per ASTM B209, may have a chemical conversion coating per military standard MIL-DTL-5541, etc.), etc. The fasteners 3018, the set screws, and any other component of the system may be made of the same or similar materials.

Figure 31:
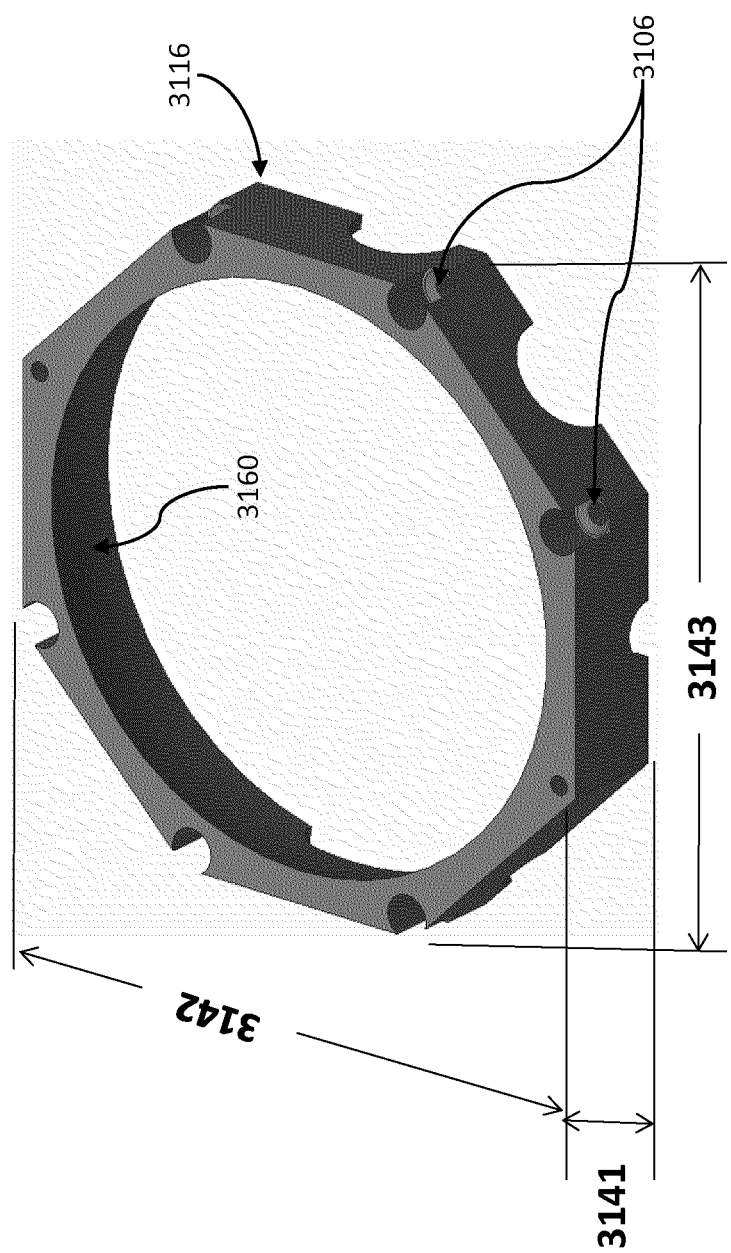
FIG. 31 is illustrates parts of a disassembled magnet ring mount in accordance with some illustrative embodiments.
Figure 32:
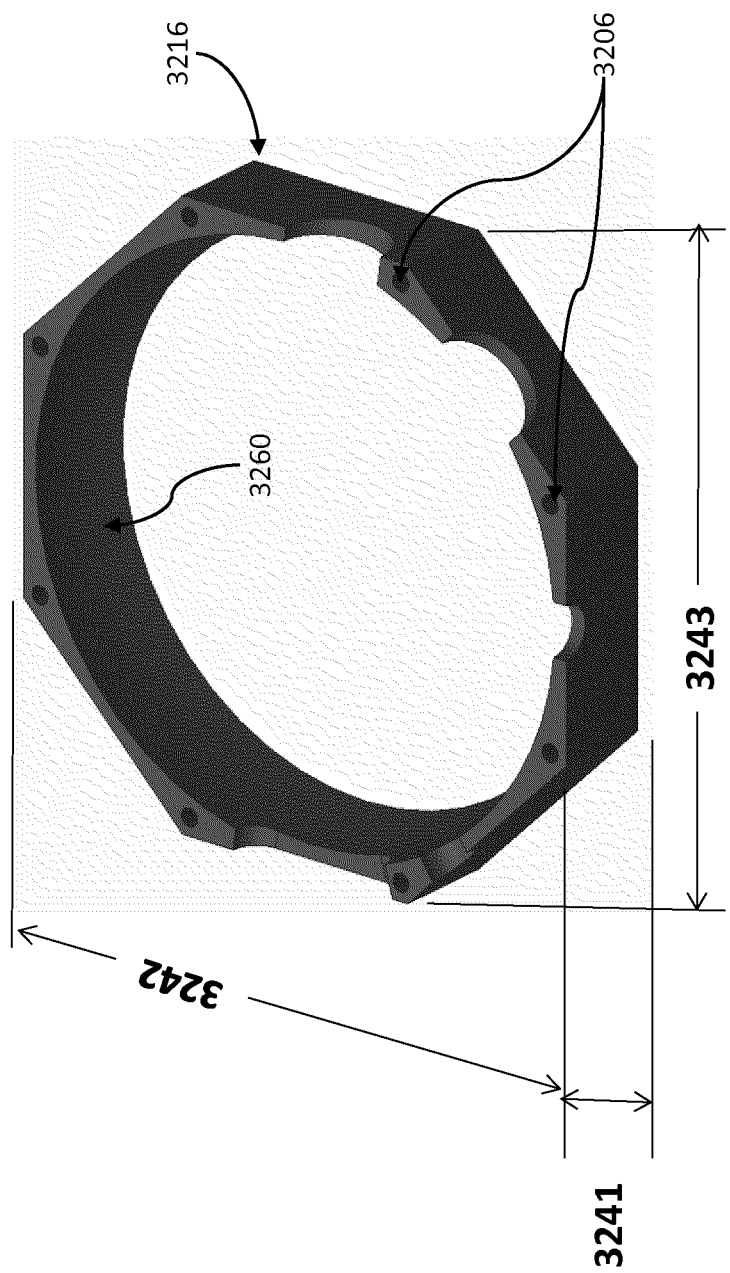
FIG. 32 illustrates parts of a disassembled magnet ring mount in accordance with some illustrative embodiments.

FIGS. 31 and 32 are illustrations of parts of a disassembled magnet ring mount in accordance with some illustrative embodiments. FIG. 31 is an illustration of the first portion 3116 of the magnet ring mount 3015, and FIG. 32 is an illustration of the second portion 3216 of a magnet ring mount 3115 (e.g., the magnet ring mount 3015 of FIG. 30). The first portion 3116 includes fastener holes 3106, and the second portion 3216 includes fastener holes 3206. In some illustrative embodiments, the fastener holes 3106 align with corresponding fastener holes 3206 to accept the fasteners 3018. The first portion 3016 includes a hole larger than the fastener holes 3106 above the fastener holes 3106 to accept a head of the fasteners 3018 (e.g., the head of a screw). For example, the fastener holes 3106 and the fastener holes 3206 may be 0.1 inches in diameter and may be suitable to accept fasteners 3018 that are #2-56 screws. In some illustrative embodiments, the fasteners 3018 screw into threaded holes in the housing or a surface secured to the housing (e.g., a circuit board). In alternative embodiments, any other suitable securing mechanism or arrangement may be used.

The first portion 3016 of the magnet ring mount 3015 includes a height 3241, a length 3242, and a width 3243. In some illustrative embodiments, the length 3242 can be as wide as the length 3242 is long. In some illustrative embodiments, the height 3241 is 0.475 inches, and the length 3242 and the length 3242 are 2.875 inches each. In alternative embodiments, any other suitable dimensions may be used.

The second portion 3017 of the magnet ring mount 3015 includes a height 3141, a length 3142, and a width 3143. In some illustrative embodiments, the width 3143 can be as wide as the length 3142 is long. In the embodiments shown in FIGS. 31 and 32, the height 3241 is the same as the height 3141, the length 3242 is the same as the length 3142, and the length 3242 is the same as the width 3143. In some such embodiments, the height 3141 is 0.475 inches, and the width 3143 and the length 3142 are 2.875 inches each. In such an embodiment, the inside surface 3160 and the inside surface 3260 are matching but opposite portions of a sphere. That is, the circle at which the inside surface 3160 and the inside surface 3260 meet is a circumference of a sphere, and the inside surface 3160 and the inside surface 3260 are along the sphere. In alternative embodiments, any other suitable dimensions may be used.

Figure 33:
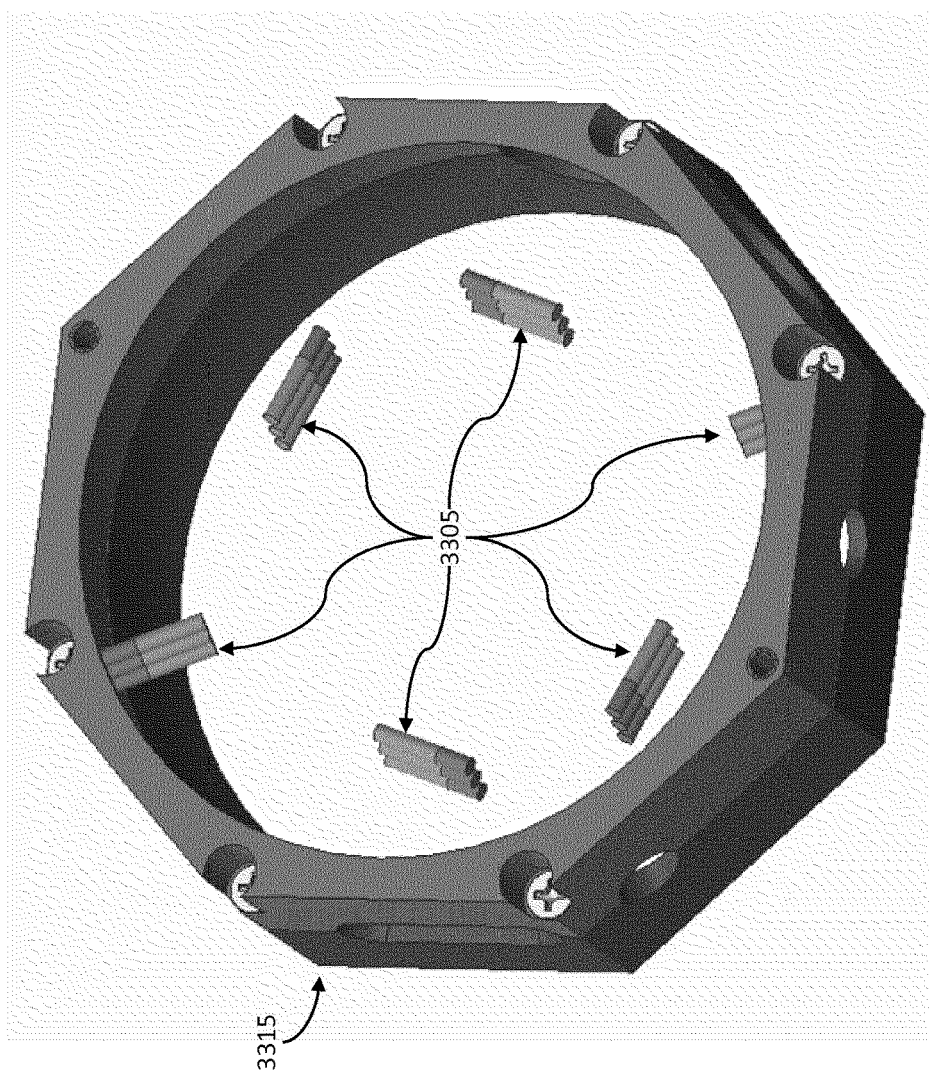
FIG. 33 illustrates a magnet ring mount showing locations of magnets in accordance with some illustrative embodiments.

FIG. 33 is an illustration of a magnet ring mount showing locations of magnets in accordance with some illustrative embodiments. FIG. 33 includes a magnet ring mount 3315 (e.g., the magnet ring mount 3015 of FIG. 30) and magnets 3305. In FIG. 33, six sets of three magnets 3305 are shown. Each magnet 3305 in a set is arranged in the same direction (e.g., the poles of each magnet 3305 are pointed in the same direction). In alternative embodiments, additional, fewer, and/or different elements may be used. For example, in alternative embodiments, each set of magnets 3305 may include greater than or fewer than three magnets 3305. Similarly, the total number of magnets 3305 may be greater than or fewer than eighteen.

FIG. 33 shows an illustrative arrangement of the magnets 3305 within the magnet ring mount 3315 without the bias magnet ring. Although the bias magnet ring is not shown, the bias magnet ring may hold the magnets 3305 in the same position relative to one another. But, the bias magnet ring may move within the magnet ring mount 3315 while maintaining the magnets 3305 in the same position relative to one another. Accordingly, the magnets 3305 may be rotated around the center portion of the bias magnet ring and/or the magnet ring mount 3315 (e.g., around the magneto-optical defect center material). For reference, a detailed discussion of diamond axes crystal alignment and magnet orientation is provided in U.S. patent application Ser. No. 15/003,718 (now U.S. Pat. No. 9,541,610) and U.S. patent application Ser. No. 15/003,704, both filed on Jan. 21, 2016, and both of which are incorporated herein by reference in their entireties.

Figure 34:
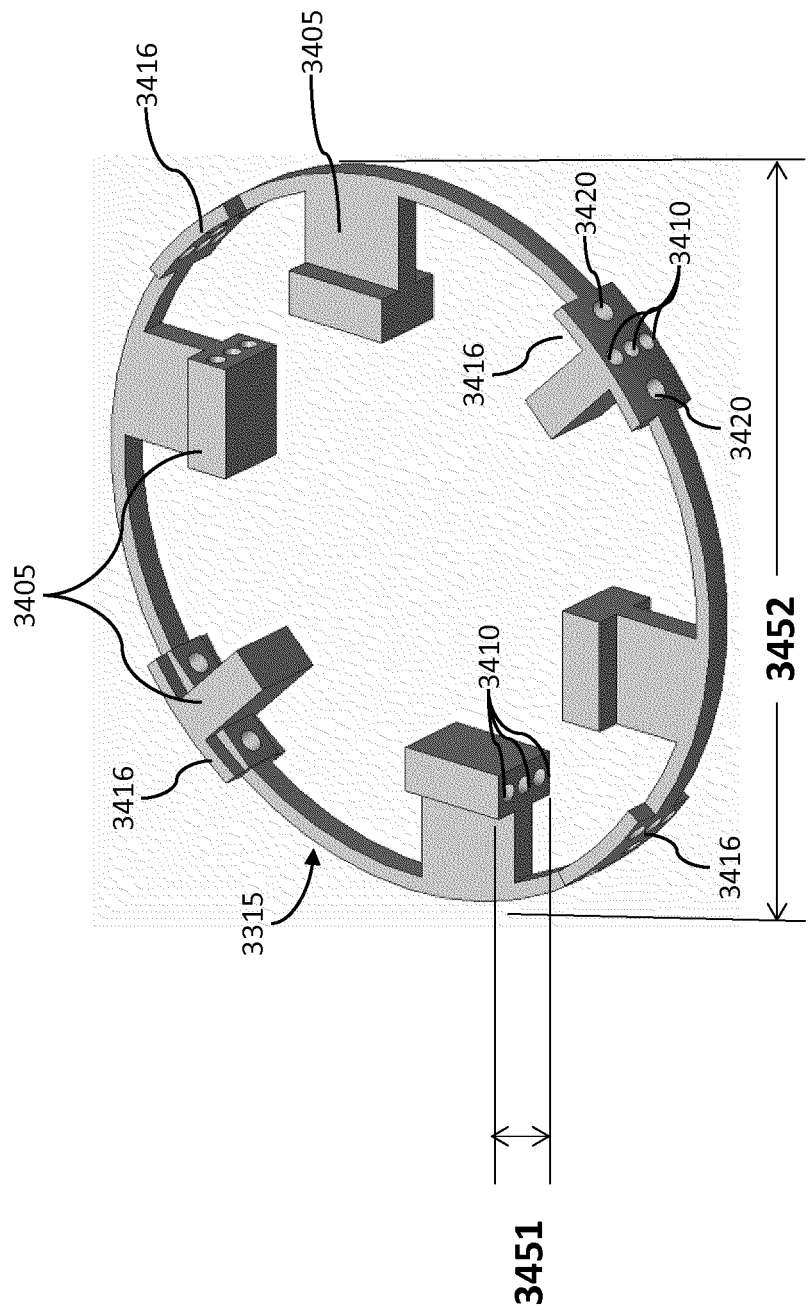
FIG. 34 illustrates a bias magnet ring mount in accordance with some illustrative embodiments.

FIGS. 34 and 35 are illustrations of a bias magnet ring mount in accordance with some illustrative embodiments. The bias magnet ring mount 3415 includes magnet holders 3405 with magnet holes 3410 and securing tabs 3416 with set screw holes 3420. In alternative embodiments, additional, fewer, and/or different elements may be used.

As shown in FIGS. 34 and 35, the bias magnet ring mount 3415 has an outer ring, and the magnet holders 3405 and the securing tabs 3416 are fixed to the outer ring. In some illustrative embodiments, the outside diameter 3452 of the outer ring and the bias magnet ring mount 3415 is 2.745 inches. The height 3451 of the magnet holders 3405 can be 0.290 inches. In some illustrative embodiments, the outside surface of the outer ring is spherically shaped to fit within and slide along the inner surface 3411 and the inner surface 3411.

As noted above, the magnet holders have magnet holes. The magnet holes 3310 may hold the magnets 3305 in the orientation to one another shown in FIG. 33. The securing tabs 3416 may each include one or more set screw holes 3420. The set screw holes 3420 may be configured to receive a set screw. For example, the set screw holes 3420 may be threaded. In some illustrative embodiments, set screws may be threaded into the set screw holes 3420 and be pressed against the inner surface 3411 and/or the inner surface 3411 to secure the bias magnet ring mount 3415 within the magnet ring mount 3415. In some illustrative embodiments, the set screws 3420 may be #2-56 screws. In alternative embodiments, any other suitable set screws may be used.

In the embodiment shown in FIG. 35, two of the securing tabs 3515 each include one set screw hole 3520 and six through-holes 3505. Each of the six through-holes 3505 can be used to drill or otherwise form the magnet holes 3510. For example, each of the through-holes 505 may be aligned along a same central axis as a corresponding magnet hole 3510. For example, the inside diameter of the magnet holes 3510 can be 0.070 inches. The inside diameter of the through-holes 3505 can be the same or larger than the inside diameter of the magnet holes 3510. Following the example, the inside diameter of the through-holes 3505 may be 0.070 inches (or larger). In alternative embodiments, any other suitable inside diameters may be used.

Thus, the magnet mount assembly 3000 can be used to adjust the magnetic bias applied to the magneto-optical defect center material 720 by moving the magnets 3305 about the magneto-optical defect center material 720. Similarly, once a desired position is selected, the bias magnet ring mount 3015 may be secured within the magnet ring mount 3015.

As noted above with respect to FIGS. 4 and 5, each of the dips (e.g., Lorentzians) in the graphs may correspond to one or more axes of the defect centers within the NV diamond material 620. The bias magnetic field applied to the magneto-optical defect center material 720 may adjust the order and orientation of the Lorentzian dips in the graphs. Accordingly, there are forty-eight unique orientations of the Lorentzians such that each Lorentzian is distinguishable from the others (e.g., as in the graph of FIG. 5). Thus, there are forty-eight unique positions of the magnets 3305 around the magneto-optical defect center material 720 corresponding to each of the forty-eight orientations of the Lorentzians.

In some illustrative embodiments, the magnet ring mount 3015 is movable within the bias magnet ring 3025 and the housing such that twelve of the forty-eight positions of the magnets 3305 are accessible. That is, the magnet ring mount 3015 cannot be positioned into all of the forty-eight positions because the magnet ring mount 3015 would interfere with the housing, which may span across the top and bottom of the magnet ring mount 3015. In some instances, only a portion of the twelve positions may position the bias magnet ring 3025 within the magnet ring mount 3015 such that the bias magnet ring 3025 does not interfere with the light that passes through the through-holes 3026. In some illustrative embodiments, the bias magnet ring 3025 is positioned such that the Lorentzians are distinguishable from one another and such that the light is not interfered with as it passes through the through-hole to the magneto-optical defect center material 720.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology. In some aspects, the subject technology may be used in various markets, including for example and without limitation, advanced sensors and mobile space platforms.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases. Every combination of components described or exemplified can be used to practice the embodiments, unless otherwise stated. Some embodiments can be modified to incorporate any number of variations, alterations, substitutions or equivalent arrangements not heretofore described, but which are commensurate with the spirit and scope of the embodiments. Additionally, while various embodiments of the disclosure have been described, it is to be understood that aspects of the disclosure may include only some of the described embodiments. Accordingly, the disclosure is not to be seen as limited by the foregoing description.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A system for magnetic detection, comprising:
    a housing comprising:
        a top plate;
        a bottom plate;
        at least one side plate; and
        a main plate provided between the side plate and the bottom plate;
    a magneto-optical defect center material comprising at least one magneto-optical defect center that emits an optical signal when excited by an excitation light,
    a radio frequency (RF) exciter system configured to provide RF excitation to the magneto-optical defect center material;
    an optical excitation system configured to direct the excitation light to the magneto-optical defect center material; and
    an optical detector configured to receive the optical signal emitted by the magneto-optical defect center material based on the excitation light and the RF excitation,
    wherein the top plate, the bottom plate, the at least one side plate and a portion of the main plate form an enclosure that contains the magneto-optical defect center material, the RF exciter system, the optical excitation system, and the optical detector, and
    wherein the magneto-optical defect center material, the RF exciter system, the optical excitation system, and the optical detector are mounted to the main plate and capable of being unattached and remounted to the main plate to change at least one of a location or an angle of incidence of the excitation light on the magneto-optical defect center material.

2. The system of claim 1, wherein the main plate includes a plurality of holes positioned to allow the magneto-optical defect center material, the RF exciter system, the optical excitation system, and the optical detector to be mounted to the main plate in a selected location from a plurality of locations on the main plate.

3. The system of claim 2, wherein a location of the magneto-optical defect center material, the RF exciter system, the optical excitation system, or the optical detector is changeable independent of one another.

4. The system of claim 1, wherein
    the top plate is made from Noryl;
    the bottom plate is made from stainless steel, aluminum or copper;
    the at least one side plate is made from Noryl, and
    the main plate is made from Noryl.

5. The system of claim 1, wherein the housing further comprises one or more separation plates configured to isolate at least one of the magneto-optical defect center material, the RF exciter system, the optical excitation system, and the optical detector within the housing.

6. The system of claim 1, further comprising a gasket configured to hermetically seal the top plate, the bottom plate, the at least one side plate, and the main plate together.

7. The system of claim 1, further comprising a hydrogen absorber positioned within the housing, the hydrogen absorber configured to absorb hydrogen released by materials used in the system for magnetic detection.

8. The system of claim 1, further comprising a nitrogen cooling system configured to cool or otherwise reduce thermal loading on components of the system for magnetic detection.

9. The system of claim 1, wherein at least one of the top plate or the bottom plate include cooling fins configured to thermally dissipate heat transferred to the at least one of the top plate or the bottom plate.

10. The system of claim 9, further comprising a nitrogen cooling system configured to cool or otherwise reduce thermal loading on components of the system for magnetic detection,
    wherein the nitrogen cooling system is in thermal communication with the at least one of the top plate or the bottom plate including the cooling fins such that heat removed by the nitrogen cooling system is convectively dissipated to atmosphere via the cooling fins.

11. The system of claim 1, wherein the magneto-optical defect center material comprises a nitrogen vacancy (NV) diamond material comprising at least one NV center.

12. The system of claim 1, wherein the magneto-optical defect center material comprises a nitrogen vacancy (NV) diamond material comprising a plurality of NV centers.

13. The system of claim 1, further comprising a controller programmed to:
receive an indication of a frequency of the excitation light;
receive an indication of a frequency of the optical signal emitted by the magneto-optical defect center material; and
determine a magnitude of an external magnetic field based at least in part on a comparison between the frequency of the excitation light and the frequency of the optical signal emitted by the magneto-optical defect center material.

14. The system of claim 13, wherein the controller is further programmed to determine a direction of the external magnetic field based at least in part on a comparison between the frequency of the excitation light and the frequency of the optical signal emitted by the magneto-optical defect center material.

15. The system of claim 1, further comprising at least one thermal electric cooler mounted to a bottom surface of the main plate, the at least one thermal electric cooler configured to remove heat from the main plate to maintain a predetermined temperature of the main plate.

16. The system of claim 1, further comprising a red collection system comprising a photo diode, a light pipe, and at least one filter,
wherein the red collection system is configured to filter the optical signal emitted by the magneto-optical defect center material and measure a red light emitted by the magneto-optical defect center material.

17. The system of claim 1, further comprising a green collection system comprising a photo diode, a light pipe, and at least one filter,
wherein the green collection system is configured to filter the optical signal emitted by the magneto-optical defect center material and measure a green light emitted by the magneto-optical defect center material.

18. The system of claim 1, further comprising a beam trap configured to capture any portion of the excitation light that is not absorbed by the magneto-optical defect center material.

19. The system of claim 18, wherein the beam trap is configured to capture a green light portion of the excitation light that is not absorbed by the magneto-optical defect center material.

20. The system of claim 1, further comprising:
a red collection system comprising a red photo diode, a red light pipe, and at least one red filter, wherein the red collection system is configured to filter the optical signal emitted by the magneto-optical defect center material and measure a red light emitted by the magneto-optical defect center material; and
a green collection system comprising a green photo diode, a green light pipe, and at least one green filter, wherein the green collection system is configured to filter the optical signal emitted by the magneto-optical defect center material and measure a green light emitted by the magneto-optical defect center material.

21. The system of claim 20, further comprising a beam trap configured to capture any portion of the excitation light that is not absorbed by the magneto-optical defect center material.

22. The system of claim 21, wherein the beam trap is configured to capture a green light portion of the excitation light that is not absorbed by the magneto-optical defect center material.

23. The system of claim 1, wherein the optical excitation system comprises an optical excitation assembly configured to be attached to a base structure, the optical excitation assembly comprising:
an optical excitation source;
a slot configured to adjust the optical excitation source in a respective linear direction relative to the base structure;
a lens; and
a drive screw mechanism configured to adjust a position of the lens relative to the optical excitation source,
wherein a defect center in the magneto-optical defect center material is in a fixed position relative to the base structure.

24. The system of claim 23, wherein the optical excitation assembly further comprises a plurality of drive screw mechanisms configured to adjust a position of the lens relative to the optical excitation source, each of the plurality of drive screw mechanisms configured to adjust in a direction orthogonal to the other drive screw mechanisms.

25. The system of claim 24, wherein the optical excitation assembly further comprises a shim configured to adjust the optical excitation assembly in a linear direction relative to the base structure.

26. The system of claim 23, wherein light from the optical excitation source is directed through the lens into the magneto-optical defect center material with the defect center.

27. The system of claim 26, further comprising a half-wave plate assembly comprising:
a half-wave plate,
a mounting disk adhered to the half-wave plate, and
a mounting base configured such that the mounting disk is rotatable relative to the mounting base around an axis of the half-wave plate.

28. The system of claim 27, wherein the lens is configured to direct light from the optical excitation source through the half-wave plate before the light is directed to the magneto-optical defect center material with the defect center.

29. The system of claim 27, further comprising a pin adhered to the mounting disk, wherein the mounting base comprises a mounting slot configured to receive the pin, wherein the pin is slideable along the mounting slot and the mounting disk is rotatable relative to the mounting base around the axis of the half-wave plate, the axis perpendicular to a length of the mounting slot.

30. The system of claim 27, wherein the magneto-optical defect center material with the defect center comprises a nitrogen vacancy (NV) diamond material comprising a plurality of NV centers.

31. The system of claim 23, further comprising a screw lock inserted through the slot and configured to prevent relative motion of the optical excitation assembly to the base structure when tightened.

32. The system of claim 1, wherein the optical excitation system comprises an optical excitation assembly for attachment to a base structure comprising:
a slot configured to adjust the assembly in a respective linear direction relative to the base structure;
an optical excitation source;

a plurality of lenses; and
an adjustment mechanism configured to adjust a position of the plurality of lenses relative to the optical excitation source.

33. The system of claim 32, wherein light from the optical excitation source is directed through the plurality of lenses into the magneto-optical defect center material with defect centers.

34. The system of claim 33, wherein the optical excitation assembly is configured to direct light from the optical excitation source through a half-wave plate before the light is directed to the magneto-optical defect center material.

35. The system of claim 32, further comprising a mounting disk adhered to a half-wave plate, wherein the mounting disk is configured to rotate relative to a mounting base around an axis of the half-wave plate.

36. The system of claim 35, further comprising a pin adhered to the mounting disk, wherein the mounting base comprises a mounting slot configured to receive the pin, wherein the pin is slideable along the slot and the mounting disk is rotatable relative to the mounting base around the axis of the half-wave plate, the axis perpendicular to a length of the slot.

37. The system of claim 33, wherein the magneto-optical defect center material with defect centers comprises a nitrogen vacancy (NV) diamond material comprising a plurality of NV centers.

38. The system of claim 35, wherein the magneto-optical defect center material with defect centers comprises a nitrogen vacancy (NV) diamond material comprising a plurality of NV centers and wherein the optical excitation source is one of a laser diode or a light emitting diode.

39. They system of claim 33, further comprising a screw lock inserted through the slot and configured to prevent relative motion of the optical excitation assembly to the base structure when tightened.

40. The system of claim 35, further comprising:
a screw lock inserted through the slot and configured to prevent relative motion of the optical excitation assembly to the base structure when tightened; and
a second screw lock attached to the mounting disk, wherein the second screw lock is configured to prevent rotation of the mounting disk relative to the mounting base when tightened.

41. The system of claim 33, wherein at least one of the plurality of lenses is configured to direct light from the optical excitation source through a half-wave plate before the light is directed to the magneto-optical defect center material.

42. The system of claim 1, wherein the optical excitation system comprises an optical excitation assembly comprising:
a base structure;
an optical excitation means for providing optical excitation through a plurality of lenses; and
an adjustment means for adjusting the location of the provided optical excitation where it reaches the magneto-optical defect center material.

43. The system of claim 1,
wherein the optical excitation system includes an optical excitation source emitting green light; and
wherein the system further comprises a half-wave plate, through which at least some of the green light passes, rotating a polarization of such green light to thereby provide an orientation to the light waves emitted from the half-wave plate, the half-wave plate capable of being orientated relative to the defect centers in a plurality of orientations,
wherein the orientation of the light waves coincides with an orientation of the defect centers, thereby imparting substantially increased energy transfer to the defect center with coincident orientation while imparting substantially decreased energy transfer to the defect centers that are not coincident.

44. The system of claim 1, further comprising
a waveplate assembly comprising:
a waveplate,
a mounting disk adhered to the waveplate, and
a mounting base configured such that the mounting disk is rotatable relative to the mounting base around an axis of the waveplate,
wherein the optical excitation system includes an optical excitation source.

45. The system of claim 44, wherein the system is configured to direct light from the optical excitation source through the waveplate before the light is directed to the magneto-optical defect center material.

46. The system of claim 44, further comprising a pin adhered to the mounting disk, wherein the mounting base comprises a slot configured to receive the pin, wherein the pin is slideable along the slot and the mounting disk is rotatable relative to the mounting base around the axis of the waveplate, the axis perpendicular to a length of the slot.

47. The system of claim 44, wherein the magneto-optical defect center material with defect centers comprises a nitrogen vacancy (NV) diamond material comprising a plurality of NV centers.

48. The system of claim 44, wherein the optical excitation source is one of a laser diode or a light emitting diode.

49. The system of claim 46, wherein the magneto-optical defect center material with defect centers comprises a nitrogen vacancy (NV) diamond material comprising a plurality of NV centers and wherein the optical excitation source is a laser.

50. The system of claim 44, further comprising a screw lock attached to the mounting disk, wherein the screw lock is configured to prevent rotation of the mounting disk relative to the mounting base when tightened.

51. The system of claim 47, further comprising a screw lock attached to the mounting disk, wherein the screw lock is configured to prevent rotation of the mounting disk relative to the mounting base when tightened.

52. The system of claim 44, further comprising a controller electrically coupled to the waveplate assembly and configured to control an angle of a rotation of the waveplate relative to the mounting base.

53. The system of claim 1, wherein the optical excitation system includes an assembly comprising:
a half-wave plate;
a mounting base configured such that the half-wave plate is rotatable relative to the mounting base around an axis of the half-wave plate; and
an optical excitation source.

54. The system of claim 53, wherein the assembly is configured to direct light from the optical excitation source through the half-wave plate before the light is directed to the magneto-optical defect center material.

55. The system of claim 53, further comprising a mounting disk adhered to the half-wave plate and the mounting disk is configured to rotate relative to the mounting base around the axis of the half-wave plate.

56. The system of claim 55, further comprising a pin adhered to the mounting disk, wherein the mounting base comprises a slot configured to receive the pin, wherein the pin is slideable along the slot and the mounting disk is rotatable relative to the mounting base around the axis of the half-wave plate, the axis perpendicular to a length of the slot.

57. The system of claim 56, wherein the magneto-optical defect center material with defect centers comprises a nitrogen vacancy (NV) diamond material comprising a plurality of NV centers.

58. The system of claim 53, wherein the optical excitation source is one of a laser diode or a light emitting diode.

59. The system of claim 56, wherein the magneto-optical defect center material with defect centers comprises a nitrogen vacancy (NV) diamond material comprising a plurality of NV centers and wherein the optical excitation source is a laser.

60. The assembly of claim 55, further comprising a screw lock attached to the mounting disk, wherein the screw lock is configured to prevent rotation of the mounting disk relative to the mounting base when tightened.

61. The system of claim 53, further comprising a controller electrically coupled to the assembly and configured to control an angle of a rotation of the half-wave plate relative to the mounting base.

62. The system of claim 1, wherein the optical excitation system comprises:
an optical excitation source emitting light; and
a polarization controller, wherein the polarization controller controls the polarization orientation of the light emitted from the optical excitation source, wherein the polarization orientation coincides with an orientation of the defect centers, thereby imparting substantially increased energy transfer to the defect center with coincident orientation while imparting substantially decreased energy transfer to the defect centers that are not coincident.

63. The system of claim 62, wherein the magneto-optical defect center material with defect centers comprises a nitrogen vacancy (NV) diamond material comprising a plurality of NV centers.

64. The system of claim 62, wherein the optical excitation source is one of a laser diode or a light emitting diode.

65. The system of claim 63, wherein the optical excitation source is a laser.

66. The system of claim 1, further comprising:
a radio frequency circuit board configured to generate a radio frequency field around the magneto-optical defect center material; and
a mount base, wherein the magneto-optical defect center material and the radio frequency circuit board are mounted to the mount base, and wherein the mount base is configured to be fixed to the housing in a plurality of orientations,
wherein the optical excitation system includes a light source.

67. The system of claim 66, wherein, in each of the plurality of orientations, the excitation light enters the magneto-optical defect center material in a respective side of the magneto-optical defect center material.

68. The system of claim 66, wherein the excitation light is injected into a first side of the magneto-optical defect center material when the mount base is fixed in a first orientation in the plurality of orientations, and wherein the excitation light is injected into a second side of the magneto-optical defect center material when the mount base is fixed in a second orientation in the plurality of orientations.

69. The system of claim 68, wherein, when the mount base is fixed in the first orientation, a portion of the excitation light passes through the magneto-optical defect center material and is detected by a second light sensor, and wherein, when the mount base is fixed in the second orientation, a portion of the excitation light is not detected by the second light sensor.

70. The system of claim 66, wherein the mount base is configured to be fixed to the housing in the plurality of orientations via a plurality of sets of fixation holes.

71. The system of claim 70, wherein each of the fixation holes of the sets of fixation holes comprises a threaded hole.

72. The system of claim 71, wherein the mount base is configured to be fixed to the housing via at least one threaded shaft.

73. The system of claim 70, wherein each set of the plurality of sets of fixation holes comprises two fixation holes.

74. The system of claim 70, wherein each set of the plurality of sets of fixation holes is two fixation holes.

75. The system of claim 66, wherein the light source and a light sensor are fixed to the housing.

76. The system of claim 66, further comprising a processor programmed to determine a magnitude of an external magnetic field based in part on the radio frequency field.

77. The system of claim 76, wherein the radio frequency field has a frequency that is time-varying.

78. The system of claim 66, wherein a frequency of the excitation light is different than a frequency of the optical signal.

79. The system of claim 1, further comprising:
a radio frequency circuit board configured to generate a radio frequency field around the magneto-optical defect center material; and
a mount base, wherein the magneto-optical defect center material and the radio frequency circuit board are mounted to the mount base,
wherein the mount base is configured to be fixed to the housing in a plurality of orientations.

80. The system of claim 79, wherein, in each of the plurality of orientations, the excitation light enters the magneto-optical defect center material in a respective side of the magneto-optical defect center material.

81. The system of claim 79, wherein the excitation light is injected into a first side of the magneto-optical defect center material when the mount base is fixed in a first orientation in the plurality of orientations, and wherein the excitation light is injected into a second side of the magneto-optical defect center material when the mount base is fixed in a second orientation in the plurality of orientations.

82. The system of claim 81, wherein, when the mount base is fixed in the first orientation, a portion of the excitation light passes through the magneto-optical defect center material and is detected by a light sensor, and wherein, when the mount base is fixed in the second orientation, a portion of the excitation light is not detected by the light sensor.

83. The system of claim 79, wherein the mount base is configured to be fixed to the housing in the plurality of orientations via a plurality of sets of fixation holes.

84. The system of claim 83, wherein each of the fixation holes of the sets of fixation holes comprises a threaded hole.

85. The system of claim 84, wherein the mount base is configured to be fixed to the housing via at least one threaded shaft.

86. The system of claim 83, wherein each set of the plurality of sets of fixation holes comprises two fixation holes.

87. The system of claim 83, wherein each set of the plurality of sets of fixation holes is two fixation holes.

88. The system of claim 79, wherein a frequency of the excitation light is different than a frequency of the optical signal.

89. The system of claim 1, further comprising:
a beam former in electrical communication with the RF exciter system; and
an array of Vivaldi antenna elements in electrical communication with the beam former,
wherein the magneto-optical defect center material is positioned in a far field of the array of Vivaldi antenna elements, wherein the array of Vivaldi antenna elements generate a RF magnetic field that is uniform over the magneto-optical defect center material, and
wherein the optical excitation system transmits optical light at a first wavelength to the magneto-optical defect center material to detect a magnetic field based on a measurement of optical light at a second wavelength that is different from the first wavelength.

90. The system of claim 89, wherein the array of Vivaldi antenna elements is configured to operate in a range from 2 gigahertz (GHz) to 50 GHz.

91. The system of claim 89, wherein the array of Vivaldi antenna elements comprises a plurality of Vivaldi antenna elements and an array lattice.

92. The system of claim 89, wherein the beam former is configured to operate the array of Vivaldi antenna elements at 2 GHz.

93. The system of claim 89, wherein the beam former is configured to operate the array of Vivaldi antenna elements at 2.8-2.9 GHz.

94. The system of claim 89, wherein the beam former is configured to spatially oversample the array of Vivaldi antenna elements.

95. The system of claim 89, wherein the array of Vivaldi antenna elements is adjacent the magneto-optical defect center material.

96. The system of claim 89, wherein the magneto-optical defect center material is a diamond having nitrogen vacancies.

97. The system of claim 1, further comprising:
a beam former in electrical communication with the RF exciter system; and
an array of antenna elements in electrical communication with the beam former,
wherein the magneto-optical defect center material is positioned in a far field of the array of antenna elements, wherein the array of antenna elements generate a RF magnetic field that is uniform over the magneto-optical defect center material.

98. The system of claim 97, wherein the array of antenna elements is configured to operate in a range from 2 gigahertz (GHz) to 50 GHz.

99. The system of claim 97, wherein the array of antenna elements comprises a plurality of Vivaldi antenna elements and an array lattice.

100. The system of claim 97, wherein the beam former is configured to operate the array of antenna elements at 2 GHz.

101. The system of claim 97, wherein the beam former is configured to operate the array of antenna elements at 2.8-2.9 GHz.

102. The system of claim 97, wherein the beam former is configured to spatially oversample the array of antenna elements.

103. The system of claim 97, wherein the array of antenna elements is adjacent the magneto-optical defect center material.

104. The system of claim 97, wherein the magneto-optical defect center material is a diamond having nitrogen vacancies.

105. The system of claim 1, further comprising:
a plurality of magnets configured to provide a bias magnetic field to the magneto-optical defect center material;
a ring magnet holder comprising:
an outer ring with an outside surface, and
a plurality of holders extending from the outer ring, wherein the plurality of holders are configured to hold the plurality of magnets in a same orientation with respect to one another; and
a mount comprising an inside surface,
wherein the outside surface of the outer ring slides along the inside surface of the mount.

106. The system of claim 105, wherein the ring magnet holder further comprises a fixation member configured to secure the ring magnet holder in a location within the mount.

107. The system of claim 106, wherein the fixation member comprises a set screw.

108. The system of claim 105, wherein the mount comprises a through-hole configured to allow the excitation light to pass through the through-hole of the mount.

109. The system of claim 105, wherein the inside surface of the mount has a shape that is semi-spherical.

110. The system of claim 109, wherein an outside surface of the mount has a shape that is semi-spherical.

111. The system of claim 105, wherein the mount comprises a first portion and a second portion that are secured together with a plurality of fasteners.

112. The system of claim 111, wherein the first portion comprises half of the inside surface.

113. The system of claim 105, wherein the plurality of magnets are permanent magnets.

114. The system of claim 105, wherein the plurality of holders each comprise at least one magnet hole, wherein each of the at least one magnet hole is configured to hold one of the plurality of magnets.

115. The system of claim 114, wherein the ring magnet holder further comprises at least one mounting tab, and wherein the at least one mounting tab comprises a fixation member configured to secure the ring magnet holder in a location within the mount.

116. The system of claim 115, wherein the mounting tab further comprises at least one through-hole, wherein the at least one through-hole comprises a central axis that is coaxial to a central axis of one of the at least one magnet hole.

117. The system of claim 105, wherein the bias magnetic field is substantially uniform through the magneto-optical defect center material.

118. The system of claim 1, further comprising:
a magneto-optical material that is capable of fluorescing upon the application of certain light and that provides different fluorescence depending upon applied magnetic fields;
a biasing magnet assembly comprising:
an outer ring with an outside surface, and
a plurality of holders extending from the ring, wherein the plurality of holders are configured to hold a plurality of magnets in a same orientation with respect to one another; and a mount comprising an inside surface, wherein the outside surface of the outer ring slides along the inside surface of the mount, wherein the biasing magnet assembly is adjustable to provide a uniform magnetic field to the magneto-optical material.

119. The system of claim 118, wherein the biasing magnet assembly further comprises a fixation member configured to secure the outer ring in a location within the mount.

120. The system of claim 119, wherein the fixation member comprises a set screw.

121. The system of claim 118, wherein the mount comprises a through-hole configured to allow the excitation light to pass through the through-hole of the mount.

122. The system of claim 118, wherein the inside surface of the mount has a shape that is semi-spherical.

123. The system of claim 122, wherein an outside surface of the mount has a shape that is semi-spherical.

124. The system of claim 118, wherein the mount comprises a first portion and a second portion that are secured together with a plurality of fasteners.

125. The system of claim 124, wherein the first portion comprises half of the inside surface.

126. The system of claim 118, wherein the plurality of magnets are permanent magnets.

127. The system of claim 118, wherein the plurality of holders each comprise at least one magnet hole, wherein each of the at least one magnet hole is configured to hold one of the plurality of magnets.

128. The system of claim 127, wherein the ring magnet holder further comprises at least one mounting tab, and wherein the at least one mounting tab comprises a fixation member configured to secure the outer ring in a location within the mount.

129. The system of claim 128, wherein the mounting tab further comprises at least one through-hole, and wherein the at least one through-hole comprises a central axis that is coaxial to a central axis of one of the at least one magnet hole.

* * * * *